(12) United States Patent
Bang et al.

(10) Patent No.: US 12,283,920 B2
(45) Date of Patent: *Apr. 22, 2025

(54) SUPPLY MODULATOR AND WIRELESS COMMUNICATION APPARATUS INCLUDING THE SAME

(71) Applicant: Samsung Electronics Co., Ltd., Suwon-si (KR)

(72) Inventors: Junsuk Bang, Hwaseong-si (KR); Dongsu Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/597,190

(22) Filed: Mar. 6, 2024

(65) Prior Publication Data

US 2024/0213924 A1 Jun. 27, 2024

Related U.S. Application Data

(63) Continuation of application No. 17/313,364, filed on May 6, 2021, now Pat. No. 11,949,384.

(30) Foreign Application Priority Data

Jun. 29, 2020 (KR) .......................... 10-2020-0079516
Nov. 10, 2020 (KR) .......................... 10-2020-0149587

(51) Int. Cl.
*H03F 3/04* (2006.01)
*H03F 1/02* (2006.01)
(Continued)

(52) U.S. Cl.
CPC ........... *H03F 1/0238* (2013.01); *H03F 3/245* (2013.01); *H03F 1/0244* (2013.01); *H03F 2200/105* (2013.01); *H03F 2200/451* (2013.01)

(58) Field of Classification Search
CPC .. H03F 1/0238; H03F 3/245; H03F 2200/105; H03F 2200/451; H03F 1/3241;
(Continued)

(56) References Cited

U.S. PATENT DOCUMENTS 8,620,240 B2    12/2013 Yamanouchi et al.
8,803,605 B2    8/2014 Fowers et al.
(Continued)

OTHER PUBLICATIONS

Ex Parte Quayle Office Action, dated Aug. 31, 2023, issued in U.S. Appl. No. 17/313,364.
(Continued)

*Primary Examiner* — Khanh V Nguyen
(74) *Attorney, Agent, or Firm* — Harness, Dickey & Pierce, P.L.C.

(57) ABSTRACT

A supply modulator including a multiple output voltage regulator (MOVR) configured to output voltages in a discrete level-envelope tracking mode (DLETM) having different levels from each other respectively corresponding to reference output voltage signals, a switching regulator configured to output a switching regulator voltage, an output voltage being based on the switching regulator voltage and a selected voltage among the voltages in the DLETM and based on the switching regulator voltage in an average power tracking mode, a switching regulator controller configured to sense an output current of the MOVR to obtain a sensing value, and control the switching regulator based on the sensing value in the DLETM, a switch array comprising switches respectively corresponding to the voltages and configured to selectively connect the selected voltage to a power amplifier by performing a switching operation, and a switch controller configured to control the switching operation.

20 Claims, 27 Drawing Sheets

(51) Int. Cl.
*H03F 3/24* (2006.01)
*H03G 3/20* (2006.01)

(58) Field of Classification Search
CPC . H03F 1/0227; H03F 3/19; H03F 3/04; H03F 1/0244; H03F 1/0211; H03F 2200/504; H03F 1/0222; H03F 2200/102; G05F 1/56; H03G 3/3042; H03G 3/004; H03G 3/20
USPC .......................................... 330/127, 136.297
See application file for complete search history.

(56) References Cited

U.S. PATENT DOCUMENTS

| | | | |
|---|---|---|---|
| 8,942,652 B2 | 1/2015 | Khlat et al. | |
| 9,065,509 B1 | 6/2015 | Yan et al. | |
| 9,154,029 B2 | 10/2015 | Wang et al. | |
| 9,337,734 B2 | 5/2016 | Kuttner | |
| 9,525,384 B2 | 12/2016 | Lee et al. | |
| 9,596,110 B2 | 3/2017 | Jiang et al. | |
| 9,614,477 B1 | 4/2017 | Rozenblit et al. | |
| 9,755,672 B2 | 9/2017 | Perreault et al. | |
| 9,768,731 B2 | 9/2017 | Perreault et al. | |
| 9,813,088 B2 * | 11/2017 | Heo | H04B 1/0475 |
| 9,843,294 B2 | 12/2017 | Khlat | |
| 9,948,240 B2 | 4/2018 | Khlat et al. | |
| 10,193,500 B2 | 1/2019 | Kim et al. | |
| 10,291,181 B2 | 5/2019 | Kim et al. | |
| 10,305,429 B2 | 5/2019 | Choo et al. | |
| 10,516,368 B2 | 12/2019 | Balteanu et al. | |
| 10,644,651 B1 * | 5/2020 | Kim | H03F 3/24 |
| 11,374,538 B2 | 6/2022 | Drogi et al. | |
| 2019/0074797 A1 | 3/2019 | Briffa et al. | |

OTHER PUBLICATIONS

Notice of Allowance, dated Nov. 27, 2023, issued in U.S. Appl. No. 17/313,364.

* cited by examiner

SUPPLY MODULATOR AND WIRELESS COMMUNICATION APPARATUS INCLUDING THE SAME

CROSS-REFERENCE TO RELATED APPLICATIONS

This application is a Continuation of U.S. patent application Ser. No. 17/313,364, filed on May 6, 2021, which is based on and claims priority under 35 U.S.C. § 119 to Korean Patent Application Nos. 10-2020-0079516, filed on Jun. 29, 2020, and 10-2020-0149587, filed on Nov. 10, 2020, in the Korean Intellectual Property Office, the disclosures of each of which are incorporated by reference herein in their entireties.

BACKGROUND

The inventive concepts relate to a supply modulator with improved power efficiency and a wireless communication apparatus including the same.

In wireless communication apparatuses such as smartphones, tablets, and Internet of Things (IoT) apparatuses, Wideband Code-Division Multiple Access (WCDMA) (3G), Long Term Evolution (LTE), LTE Advanced (4G), or New Radio (NR) (5G) technology is used for high-speed communication. However, as communication technology develops, a high peak-to-average power ratio (PAPR) and a high bandwidth of a transmission/reception signal are used, and thus, the efficiency of a power amplifier is decreased. In particular, when a power supply of a power amplifier of a transmission end is connected to a battery, the decreasing efficiency of the power amplifier is noticeable. Accordingly, an average power tracking (APT) technology or an envelope tracking (ET) technology is used to improve the power efficiency of a power amplifier at a high PAPR and a high bandwidth. A chip or a component supporting the APT technology and the ET technology is referred to as a supply modulator (SM).

SUMMARY

The inventive concepts provide a supply modulator with improved power efficiency and a wireless communication apparatus including the same.

According to an aspect of the inventive concepts, there is provided a supply modulator configured to be driven in a tracking mode and provide an output voltage to a power amplifier, the tracking mode being an average power tracking mode or a discrete level-envelope tracking mode, the supply modulator including a multiple output voltage regulator configured to output a plurality of voltages in the discrete level-envelope tracking mode, the plurality of voltages having different levels from each other, and the different levels respectively corresponding to a plurality of reference output voltage signals, a switching regulator configured to output a switching regulator voltage, the output voltage being based on the switching regulator voltage and a selected voltage among the plurality of voltages in the discrete level-envelope tracking mode, the output voltage being based on the switching regulator voltage in the average power tracking mode, a switching regulator controller configured to sense an output current of the multiple output voltage regulator to obtain a sensing value, and control the switching regulator based on the sensing value in the discrete level-envelope tracking mode, a switch array comprising a plurality of switches respectively corresponding to the plurality of voltages, the switch array configured to selectively connect the selected voltage to the power amplifier by performing a switching operation, a discrete-level controller configured to generate a level control signal based on a digital envelope signal a switch controller configured to control the switching operation of the switch array based on the level control signal, and a main controller configured to generate the plurality of reference output voltage signals, determine the tracking mode from among the average power tracking mode and the discrete level-envelope tracking mode, and control at least one of the multiple output voltage regulator, the switch controller, the switching regulator controller, or the discrete-level controller based on the tracking mode.

According to an aspect of the inventive concepts, there is provided a supply modulator configured to be driven in a tracking mode and provide an output voltage to a power amplifier, the tracking mode being an average power tracking mode or a discrete level-envelope tracking mode, the supply modulator including a multiple output voltage regulator configured to output a plurality of voltages in the discrete level-envelope tracking mode, the plurality of voltages having different levels from each other, and the different levels respectively corresponding to a plurality of reference output voltage signals, a switching regulator configured to output a switching regulator voltage, the output voltage being based on the switching regulator voltage and a selected voltage among the plurality of voltages in the discrete level-envelope tracking mode, the output voltage being based on the switching regulator voltage in the average power tracking mode, a switching regulator controller configured to sense an output current of the multiple output voltage regulator to obtain a sensing value, and control the switching regulator based on the sensing value in the discrete level-envelope tracking mode, a switch array comprising a plurality of switches, the switch array configured to selectively connect the selected voltage to the power amplifier by performing a switching operation, wherein a first switch among the plurality of switches is connected to a ground voltage, and a subset of switches among the plurality of switches are connected to the multiple output voltage regulator to respectively correspond to the plurality of voltages, the subset of switches not including the first switch, a discrete-level controller configured to generate a level control signal based on a digital envelope signal, a switch controller configured to control the switching operation of the switch array based on the level control signal, a coupling capacitor having an end connected to the switch array and another end connected to the power amplifier, and a main controller configured to generate the plurality of reference output voltage signals, generate a target voltage signal of the coupling capacitor, determine the tracking mode from among the average power tracking mode and the discrete level-envelope tracking mode, and control at least one of the multiple output voltage regulator, the switch controller, the switching regulator controller, or the discrete-level controller based on the tracking mode.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
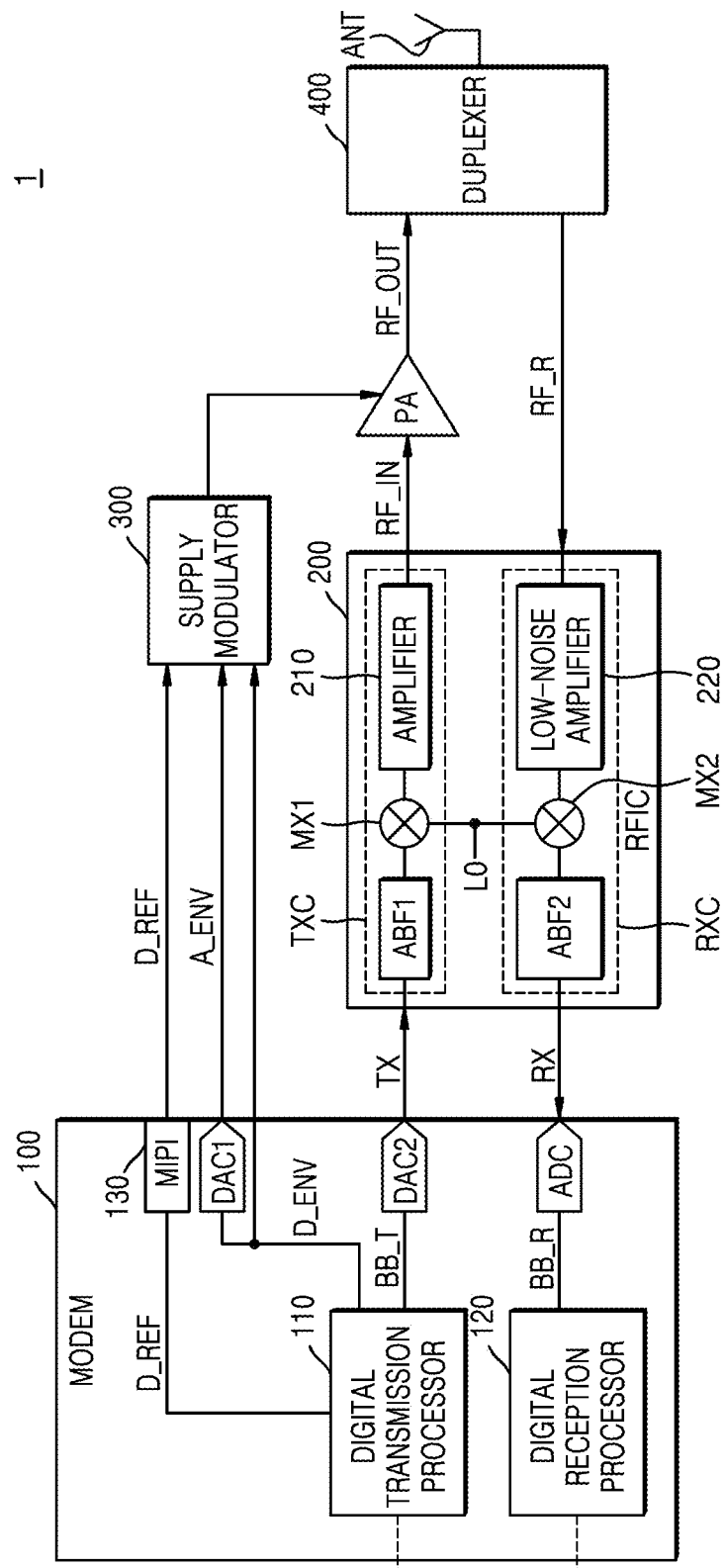
FIG. 1 is a block diagram of a wireless communication apparatus according to embodiments of the inventive concepts.

The inventive concepts will now be described more fully with reference to the accompanying drawings, in which embodiments of the inventive concepts are shown.

Merits and features of the inventive concepts, and a method of accomplishing the merits and the features will become apparent with reference to embodiments to be described below in detail together with the accompanying drawings. However, the inventive concepts are not limited to embodiments to be shown below, but may be implemented in various forms different from each other, and may be used interchangeably. In addition, embodiments are provided so that the inventive concepts will be thorough and complete, and will fully convey the scope of the inventive concepts to one of ordinary skill in the art. Also, particular components described only in some embodiments of the inventive concepts may be used in other embodiments. Like reference numerals in the drawings denote like elements.

In the case where an element is described as being "connected to" or "coupled to" another element, the element is directly connected to or coupled to the other element, or another element is interposed therebetween. On the other hand, in the case where an element is described as being "directly connected to" or "directly coupled to" another element, other element is not interposed therebetween. Like reference numerals in the drawings denote like elements. Descriptions shall be understood to include any and all combinations of one or more of listed items when the items are described by using the conjunctive term "and/or".

While such terms as "first," "second," etc., may be used to describe various elements, components, and/or sections, such elements, components, and/or sections are not limited to the above terms. The above terms are used only to distinguish one element, component, or section from another element, component, or section. A first element, a first component, or a first section may be a second element, a second component, or a second section within the inventive concepts.

The terms used in the present specification are merely used to describe particular embodiments, and are not intended to limit the inventive concepts. An expression used in the singular encompasses the expression of the plural, unless it has a clearly different meaning in the context. In the present specification, it is to be understood that the terms such as "comprising" and/or "including" are intended to indicate the existence of the components, operations, and/or elements disclosed in the specification, and are not intended to preclude the possibility that one or more other operations and/or elements may exist or may be added.

Unless otherwise defined, all terms (including technical and scientific terms) used in the present specification may be used as meanings that may be commonly understood by those of ordinary skill in the art to which this disclosure belongs. In addition, terms defined in a commonly used dictionary are not interpreted ideally or excessively unless explicitly defined specifically.

Figure 2:
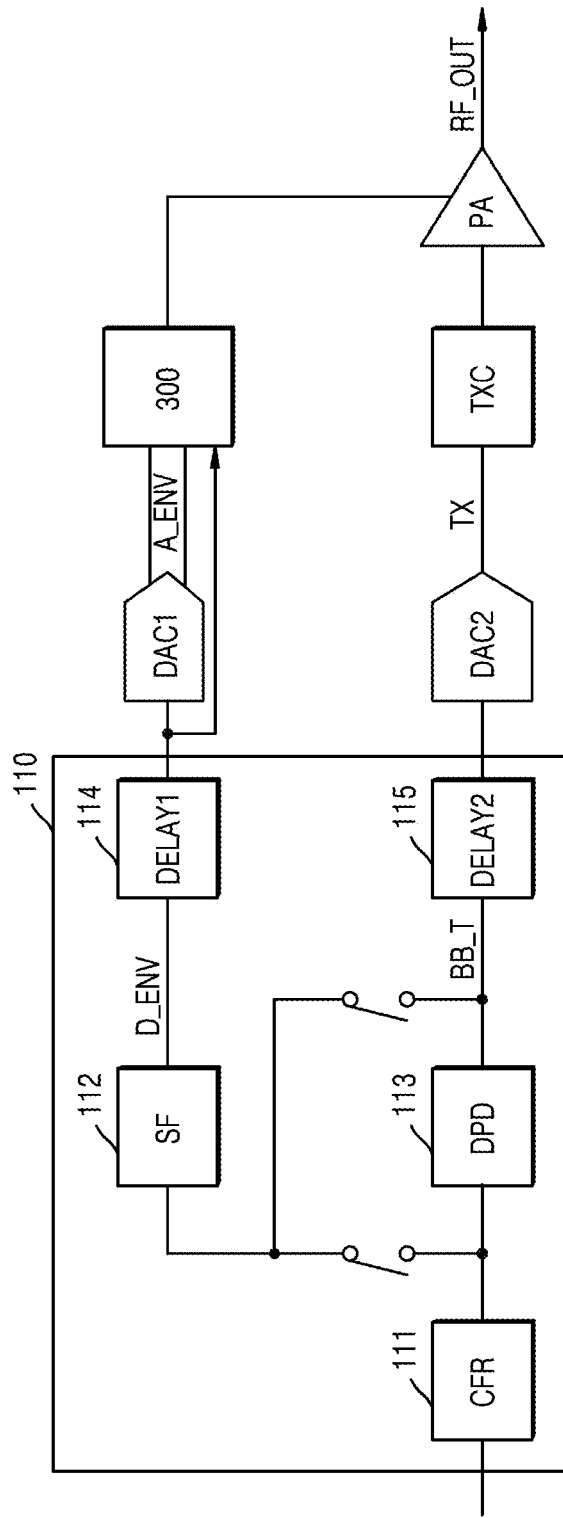
FIG. 2 is a block diagram illustrating a signal processing operation of a digital transmission processor shown in FIG. 1.

FIG. 1 is a block diagram of a wireless communication apparatus 1 according to embodiments of the inventive concepts. FIG. 2 is a block diagram illustrating a signal processing operation of a digital transmission processor 110 shown in FIG. 1.

Referring to FIG. 1, the wireless communication apparatus 1 according to embodiments of the inventive concepts may include a modem 100, a radio frequency integrated circuit (RFIC) 200, a supply modulator 300, a duplexer 400, a power amplifier PA, and/or an antenna ANT.

The modem 100 may include the digital transmission processor 110, a digital reception processor 120, a plurality of digital-to-analog converters (for example, first and second DACs, DAC1 and DAC2), an analog-to-digital converter ADC, and/or a mobile industry processor interface (MIPI) 130.

The modem 100 may process a baseband signal BB_T (e.g., including a I signal and a Q signal) including information to be transmitted through the digital transmission processor 110 according to a certain communication method. Also, the modem 100 may process a received baseband signal BB_R through the digital reception processor 120 according to a certain communication method. For example, the modem 100 may process a signal to be transmitted or a received signal according to a communication method such as orthogonal frequency division multiplexing (OFDM), orthogonal frequency division multiple access (OFDMA), wideband code multiple access (WCDMA), high speed packet access (HSPA+), or the like. In addition, the modem 100 may process the baseband signal BB_T or BB_R according to various types of communication methods (e.g., various communication methods to which a technique for modulating or demodulating the amplitude and/or the frequency of the baseband signal BB_T or BB_R is applied).

The modem 100 may extract an envelope of the baseband signal BB_T through the digital transmission processor 110 and generate a digital envelope signal D_ENV based on the extracted envelope. Herein, the extracted envelope may correspond to an amplitude component (e.g., magnitudes of the I signal and the Q signal) of the baseband signal BB_T. Also, the modem 100 may generate an average power signal D_REF based on an average power tracking table (e.g., an APT table) stored in a memory 2200 in FIG. 31.

For reference, in the APT table, information of a desired power supply voltage of the power amplifier PA according to expected output power (or transmission power) of the antenna ANT may be stored, and average power signal information corresponding to the desired power supply voltage of the power amplifier PA may be stored. Accordingly, when the expected output power of the antenna ANT is determined, the modem 100 may generate, by using the APT table, the average power signal D_REF and provide, as a reference voltage signal, the generated average power signal D_REF to the supply modulator 300.

Herein, referring to FIG. 2, a detailed signal processing operation of the digital transmission processor 110 is shown.

In detail, in addition to the above-described baseband signal processing operation, the envelope extraction operation, and the digital envelope signal generation operation, the digital transmission processor 110 may perform various operations through (e.g., including) a crest factor reduction (CFR) 111, a shaping function (SF) 112, a digital predistortion (DPD) 113, a DELAY1 114, a DELAY2 115, or the like.

The CFR 111 may reduce a peak-to average power ratio (PAPR) of a communication signal (e.g., the baseband signal BB_T). Also, to improve the efficiency and linearity of the power amplifier PA, the SF 112 may transform the digital envelope signal D_ENV, and the DPD 113 may compensate for and linearize distortion of the power amplifier PA in a digital region. In addition, the DELAY1 114 may correct a delay of the digital envelope signal D_ENV, and the DELAY2 115 may correct a delay of the baseband signal BB_T.

The digital transmission processor 110 having such a structure may output the digital envelope signal D_ENV and the baseband signal BB_T.

The digital envelope signal D_ENV is converted into an analog envelope signal A_ENV through a first digital-to-analog converter DAC1 to be provided to the supply modulator 300, or is directly provided to the supply modulator 300 without digital/analog conversion. Also, the digital envelope signal D_ENV may be provided to the supply modulator 300 through the MIPI 130. In addition, the baseband signal BB_T may be converted into a transmission signal TX through a second digital-to-analog converter DAC2 to be provided to a transmission circuit TXC.

Although not illustrated in FIG. 2, the digital transmission processor 110 may further include an internal component processing the above-described operations (e.g., baseband signal processing, envelope extraction, digital envelope signal generation, or the like). In addition, the internal components of the digital transmission processor 110 shown in FIG. 2 are only examples, but embodiments are not limited thereto.

Referring again to FIG. 1, the modem 100 may perform, by using the first and second digital-to-analog converters DAC1 and DAC2 therein, digital/analog conversion on each of the digital envelope signal D_ENV and the baseband signal BB_T to generate the analog envelope signal A_ENV and the transmission signal TX, which are analog signals. In addition, the average power signal D_REF output from the modem 100 may be a digital signal. Accordingly, the average power signal D_REF may be provided to a digital-to-analog converter included in the supply modulator 300 through the MIPI 130, and may be converted into an analog signal, e.g., a reference voltage signal, through the digital-to-analog converter included in the supply modulator 300. For reference, the first and second digital-to-analog converters DAC1 and DAC2 may operate at a relatively higher speed than the digital-to-analog converter included in the supply modulator 300.

The inventive concepts are not limited thereto, and the modem 100 may convert the average power signal D_REF into an analog signal through a digital-to-analog converter therein and output the analog signal. In this case, the modem 100 may provide an average power signal, which has been converted into an analog signal, to the supply modulator 300 as a reference voltage signal.

However, for convenience of explanation, a case where the modem 100 provides the average power signal D_REF to the digital-to-analog converter included in the supply modulator 300 through the MIPI 130 will be mainly described as an example.

For reference, the transmission signal TX and the analog envelope signal A_ENV may be differential signals each including a positive signal and a negative signal.

The modem 100 may receive a reception signal RX, which is an analog signal, from the RFIC 200. Also, the modem 100 may perform analog/digital conversion on the reception signal RX through an analog-to-digital converter ADC therein to extract the baseband signal BB_R that is a digital signal. Herein, the reception signal RX may be a differential signal including a positive signal and a negative signal.

The RFIC 200 may generate a radio frequency (RF) input signal RF_IN by performing frequency up-conversion on the transmission signal TX, or generate the reception signal RX by performing frequency down-conversion on a RF reception signal RF_R.

In detail, the RFIC 200 may include the transmission circuit TXC for frequency up-conversion, a reception circuit RXC for frequency down-conversion, and/or a local oscillator LO.

Herein, the transmission circuit TXC may include a first analog baseband filter ABF1, a first mixer MX1, and/or an amplifier 210. For example, the first analog baseband filter ABF1 may include a low-pass filter.

The first analog baseband filter ABF1 may filter the transmission signal TX received from the modem 100 and provide the same to the first mixer MX1. Also, the first mixer MX1 may perform the frequency up-conversion of converting a frequency of the transmission signal TX from a baseband into a high-frequency band through a frequency signal provided by the local oscillator LO. Through the frequency up-conversion, the transmission signal TX may be provided to the amplifier 210 as the RF input signal RF_IN, and the amplifier 210 may primarily power-amplify the RF input signal RF_IN to provide the same to the power amplifier PA.

The power amplifier PA may receive a power supply voltage (e.g., a dynamically variable output voltage) from the supply modulator 300, and may, based on the received power supply voltage, secondly amplify power of the RF input signal RF_IN to generate an RF output signal RF_OUT. Also, the power amplifier PA may provide the generated RF output signal RF_OUT to the duplexer 400.

The reception circuit RXC may include a second analog baseband filter ABF2, a second mixer MX2, and/or a low-noise amplifier 220. For example, the second analog baseband filter ABF2 may include a low-pass filter.

The low-noise filter 220 may amplify a RF reception signal RF_R received from the duplexer 400. Also, the second mixer MX2 may perform the frequency down-conversion of converting a frequency of the RF reception signal RF_R from a high-frequency baseband into a baseband through a frequency signal provided by the local oscillator LO. Through the frequency down-conversion, the RF reception signal RF_R may be provided to the second analog baseband filter ABF2 as the reception signal RX, and the second analog baseband filter ABF2 may filter the reception signal RX and provide the filtered reception signal RX to the modem 100.

For reference, the wireless communication apparatus 1 may transmit and receive signals through a plurality of frequency bands by using a carrier aggregation (CA) technology. In addition, to this end, the wireless communication apparatus 1 may also include a plurality of power amplifiers amplifying power of a plurality of RF input signals respectively corresponding to a plurality of carrier waves. However, in embodiments of the inventive concepts, for convenience of explanation, a case where one power amplifier PA is included will be described below as an example.

The supply modulator 300 may generate, based on the digital envelope signal D_ENV, the analog envelope signal A_ENV, and the average power signal D_REF, an output voltage of which the level dynamically changes, and may provide the output voltage to the power amplifier PA as a power supply voltage.

In detail, the supply modulator 300 may receive the average power signal D_REF, the digital envelope signal D_ENV, and the analog envelope signal A_ENV from the modem 100. Also, the supply modulator 300 may be, based on the received average power signal D_REF, the digital envelope signal D_ENV, and the analog envelope signal A_ENV, driven in any one tracking mode from among an average power tracking (APT) mode, a discrete level-envelope tracking (DL-ET) mode, and a continuous level-envelope tracking (CL-ET) mode and generate a dynamically variable output voltage. In addition, the supply modulator 300 may supply the generated output voltage to the power amplifier PA as a power supply voltage.

Herein, the supply modulator 300 may receive the analog envelope signal A_ENV from the modem 100 when driving in the CL-ET mode, and may receive the digital envelope signal D_ENV from the modem 100 when driving in the DL-ET mode. In addition, the supply modulator 300 may receive the average power signal D_REF from the modem 100 when updating an average power signal in an internal register (not shown) therein.

For reference, when a power supply voltage having a fixed level is applied to the power amplifier PA, the power efficiency of the power amplifier PA decreases. Accordingly, for efficient power management of the power amplifier PA, the power amplifier PA may modulate an input voltage (e.g., a power supply provided from a battery or the like, e.g., VIN of FIG. 4) based on at least one of the digital envelope signal D_ENV, the analog envelope signal A_ENV, and/or the average power signal D_REF, and may provide the modulated voltage to the power amplifier PA as a power supply voltage.

The supply modulator 300 according to embodiments of the inventive concepts may be, by considering the power conversion efficiency and performance thereof, driven in any one tracking mode from among three tracking modes (the APT mode, the CL-ET mode, and the DL-ET mode).

In particular, the supply modulator 300 according to embodiments of the inventive concepts may separately include a switching regulator supplying a current of a low-frequency component and a multiple output voltage regulator supplying a current of a high-frequency component. Accordingly, the supply modulator 300 according to embodiments of the inventive concepts may reduce the magnitude of a current flowing through a switch array when driving in the DL-ET mode, and thus, heat loss (e.g., power loss) due to a resistance component of a switch may be reduced, and a size of a switch array may also be reduced.

In addition, the supply modulator 300 according to embodiments of the inventive concepts may include a coupling capacitor between the multiple output voltage regulator and the power amplifier PA. Accordingly, in the supply modulator 300, as a maximum output voltage (as used herein, the maximum output voltage or maximum voltage level may refer to an upper limit output voltage and/or upper limit voltage level, respectively) of the multiple output voltage regulator may be lowered, power efficiency may be improved and an operational cost may be reduced. Furthermore, in the supply modulator 300 according to embodiments of the inventive concepts, as the number of output voltages of the multiple output voltage regulator is reduced through the coupling capacitor, the number of output capacitors and switches connected to the multiple output voltage regulator may also be reduced.

On the other hand, in a supply modulator in the related art, as any one of a plurality of voltages having different levels from each other generated by a multiple output voltage regulator is provided, as an output voltage (e.g., an output current) to the power amplifier PA through a switch, heat loss (e.g., power loss) occurs due to a resistance component of the switch while the output current passes through the switch.

In addition, to solve the above challenge, when the size of the switch (e.g., the size of a transistor) is increased, the gate capacitance of the switch increases also. Accordingly, power loss generated to charge and discharge a gate capacitor of the switch also increases.

In addition, the multiple output voltage regulator is used to generate and supply a plurality of voltages having different levels from each other (e.g., a voltage range to be generated and supplied is wide), voltages having high output are difficult to be generated and supplied, and a large number of output capacitors and switches are used.

However, in the case of the supply modulator 300 according to embodiments of the inventive concepts, as described above, the current of a low-frequency component (e.g., the current of a high output) is supplied through a switching regulator, and the current of a high-frequency component (e.g., the current of a low output) may be supplied through the multiple output voltage regulator. Accordingly, the magnitude of a current flowing through a switch (e.g., a current output from the multiple output voltage regulator and passing through the switch) is reduced compared to the related art, and the heat loss (e.g., power loss) due to the resistance component of the switch may also be reduced compared to the related art.

In addition, in the supply modulator 300 according to embodiments of the inventive concepts, as the heat loss (e.g., power loss) caused by the resistance component of the switch is reduced without increasing the size of the switch, the size of a switch array may be reduced compared to the related art. Furthermore, in the supply modulator 300 according to embodiments of the inventive concepts, as the heat loss (e.g., power loss) caused by the resistance component of the switch is reduced, power efficiency may also be improved.

Also, in the case of the supply modulator 300 according to embodiments of the inventive concepts, the maximum output voltage of the multiple output voltage regulator and the number of output voltages may be reduced through the coupling capacitor. Accordingly, it is easier for the supply modulator 300 according to embodiments of the inventive concepts to generate and supply a voltage of a high output compared to the related art (because a voltage range to be generated and supplied is narrower compared to the related art), and the number of output capacitors and switches may also be reduced, and thus, power efficiency may be improved and an operational cost may be reduced.

More detailed descriptions of the supply modulator 300 will be given below.

The duplexer 400 may be connected to the antenna ANT and separate a transmission frequency and a reception frequency. In detail, the duplexer 400 may separate the RF output signal RF_OUT received from the power amplifier PA for each frequency band and provide the same to a corresponding antenna ANT. In addition, the duplexer 400 may provide an external signal received from the antenna ANT to the low-noise filter 220 of the reception circuit RXC. For example, the duplexer 400 may include a front end module with integrated duplexer (FEMiD).

The antenna ANT may transmit the RF output signal RF_OUT which is frequency-separated by the duplexer 400 to the outside or may provide the RF reception signal RF_R received from the outside to the duplexer 400. For example, the antenna ANT may include an array antenna, but is not limited thereto.

For reference, the modem 100, the supply modulator 300, the RFIC 200, the power amplifier PA, and/or the duplexer 400 may be individually implemented as an integrated circuit (IC), a chip, or a module. In addition, the modem 100, the supply modulator 300, the RFIC 200, the power amplifier PA, and/or the duplexer 400 may be mounted together on a printed circuit board (PCB). However, the inventive concepts are not limited thereto, and in embodiments, at least some of the modem 100, the supply modulator 300, the RFIC 200, the power amplifier PA, and/or the duplexer 400 may be implemented as a single communication chip.

In addition, the wireless communication apparatus 1 shown in FIG. 1 may be included in a wireless communication system using a cellular network such as NR, LTE, LTE-Advance, or the like, or may be included in a wireless local area network (WLAN) system such as wireless fidelity (WiFi) or any other wireless communication systems. For reference, the structure of the wireless communication apparatus 1 shown in FIG. 1 is only an example and embodiments are not limited thereto, and may be variously configured according to a communication protocol or a communication method.

Figure 3:
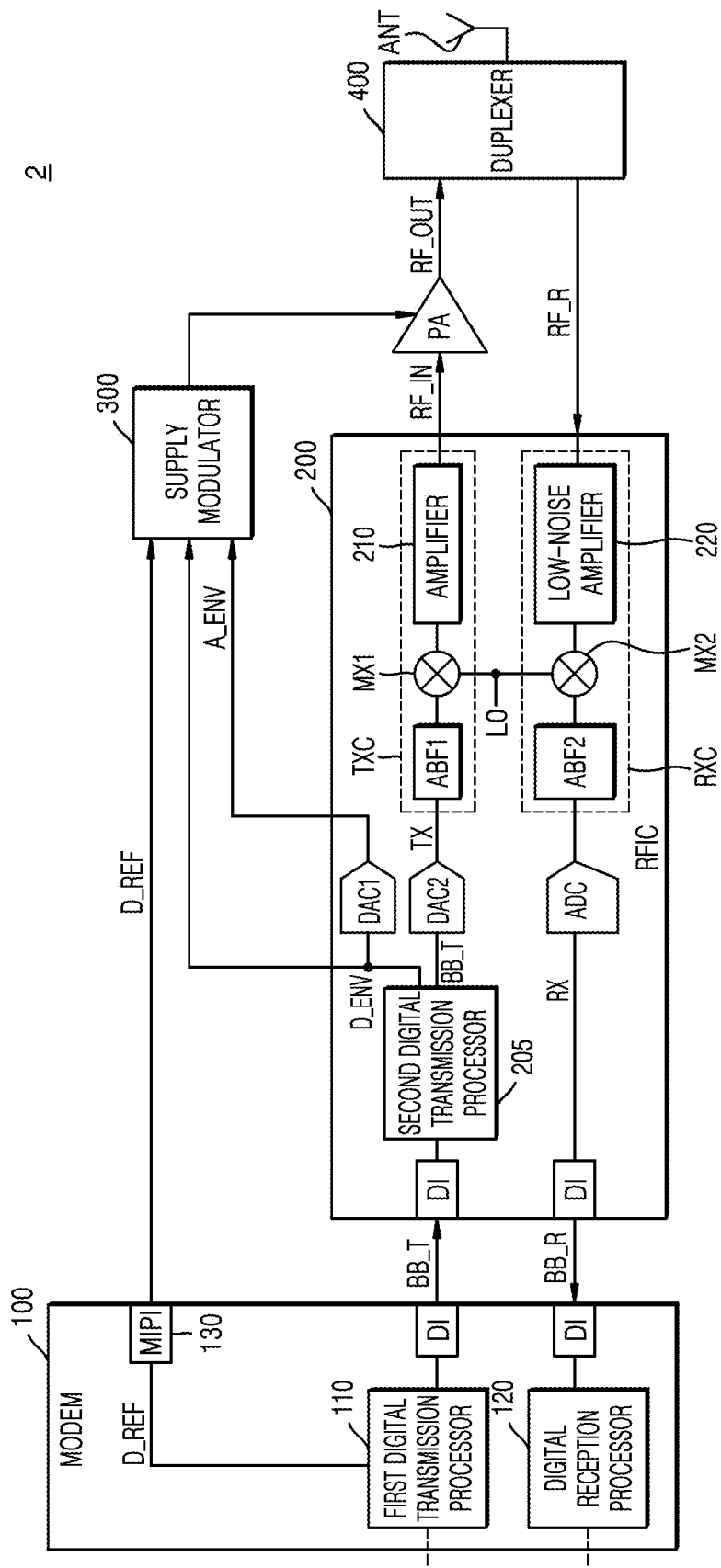
FIG. 3 is a block diagram of a wireless communication apparatus according to embodiments of the inventive concepts.

FIG. 3 is a block diagram of a wireless communication apparatus 2 according to embodiments of the inventive concepts.

The wireless communication apparatus 2 has the same structure, function, effect, or the like as, or a similar structure, function, effect, or the like to, the wireless communication apparatus 1 of FIG. 1 except for contents related to the digital envelope signal D_ENV and the analog envelope signal A_ENV, and differences thereof will be mainly described below.

Referring to FIG. 3, the wireless communication apparatus 2 according to embodiments of the inventive concepts may include the modem 100, the RFIC 200, the supply modulator 300, the duplexer 400, the power amplifier PA, and/or the antenna ANT.

The modem 100 may process, through a first digital transmission processor 110, the baseband signal BB_T according to a predetermined or alternatively, given communication method. Also, the modem 100 may provide, through a digital interface DI, the processed baseband signal BB_T to the RFIC 200. In addition, the modem 100 may extract an envelope of the baseband signal BB_T through the first digital transmission processor 110 and generate the average power signal D_REF based on the extracted envelope.

Herein, the average power signal D_REF may be provided to the supply modulator 300 as a reference voltage signal. That is, the average power signal D_REF output from the modem 100 may be a digital signal. Accordingly, the average power signal D_REF may be provided to a digital-to-analog converter included in the supply modulator 300 through the MIPI 130, and may be converted into an analog signal (e.g., a reference voltage signal) through the digital-to-analog converter included in the supply modulator 300. For reference, the first and second digital-to-analog converters DAC1 and DAC2 included in the RFIC 200 may operate at a relatively higher speed than the digital-to-analog converter included in the supply modulator 300.

The RFIC 200 may receive, through the digital interface DI, the baseband signal BB_T from the modem 100, and the baseband signal BB_T may be provided to a second digital transmission processor 205 inside the RFIC 200. The second digital transmission processor 205 may extract an envelope of the baseband signal BB_T, and generate and output the digital envelope signal D_ENV based on the extracted envelope. For reference, the second digital transmission processor 205 may output the baseband signal BB_T received through the digital interface DI.

The digital envelope signal D_ENV and the baseband signal BB_T output from the second digital transmission processor 205 may be respectively provided to the first and second digital-to-analog converters DAC1 and DAC2 inside the RFIC 200. The first and second digital-to-analog converters DAC1 and DAC2 may perform digital/analog conversion on the digital envelope signal D_ENV and the baseband signal BB_T and generate the analog envelope signal A_ENV and the transmission signal TX, which are analog signals. The digital envelope signal D_ENV output from the second digital transmission processor 205 may be directly provided to the supply modulator 300 without passing through a digital-to-analog converter.

The RFIC 200 may generate the RF input signal RF_IN by performing frequency up-conversion on the transmission signal TX through the transmission circuit TXC, and may provide the digital envelope signal D_ENV and the analog envelope signal A_ENV to the supply modulator 300.

The supply modulator 300 may generate, based on the digital envelope signal D_ENV, the analog envelope signal A_ENV, and the average power signal D_REF, a voltage of which the level dynamically changes, and may provide the voltage to the power amplifier PA as a power supply voltage.

In detail, the supply modulator 300 may receive the average power signal D_REF from the modem 100 and may receive the digital envelope signal D_ENV and the average power signal D_REF from the RFIC 200. Also, the supply modulator 300 may be driven in any one tracking mode from among three tracking modes (the APT mode, the CL-ET mode, and the DL-ET mode) based on the received average power signal D_REF, the digital envelope signal D_ENV, and the average power signal D_REF and generate a dynamically variable output voltage. In addition, the supply modulator 300 may supply the generated output voltage to the power amplifier PA as a power supply voltage.

Herein, the supply modulator 300 may receive the analog envelope signal A_ENV from the RFIC 200 when driving in the CL-ET mode, and may receive the digital envelope signal D_ENV from the RFIC 200 when driving in the DL-ET mode. In addition, the supply modulator 300 may receive the average power signal D_REF from the modem 100 when updating an average power signal in an internal register (not shown) therein. The supply modulator 300 may receive each of the average power signal D_REF, the digital envelope signal D_ENV, and the average power signal D_REF at a time other than the above-stated time. However, in embodiments of the inventive concepts, for convenience of explanation, a case where the supply modulator 300 receives each of the average power signal D_REF, the digital envelope signal D_ENV, and the average power signal D_REF at the above-stated time is described as an example.

For reference, the structure of the wireless communication apparatus 2 shown in FIG. 3 is only an example and embodiments are not limited thereto, and may be variously configured according to a communication protocol or a communication method.

As described above, each of the wireless communication apparatuses 1 and 2 according to embodiments of the inventive concepts has the above-described structures and characteristics, and hereinafter, referring to FIGS. 4 to 12, a first example of a supply modulator 300 included in the wireless communication apparatuses 1 and 2 according to embodiments of the inventive concepts will be described.

Figure 4:
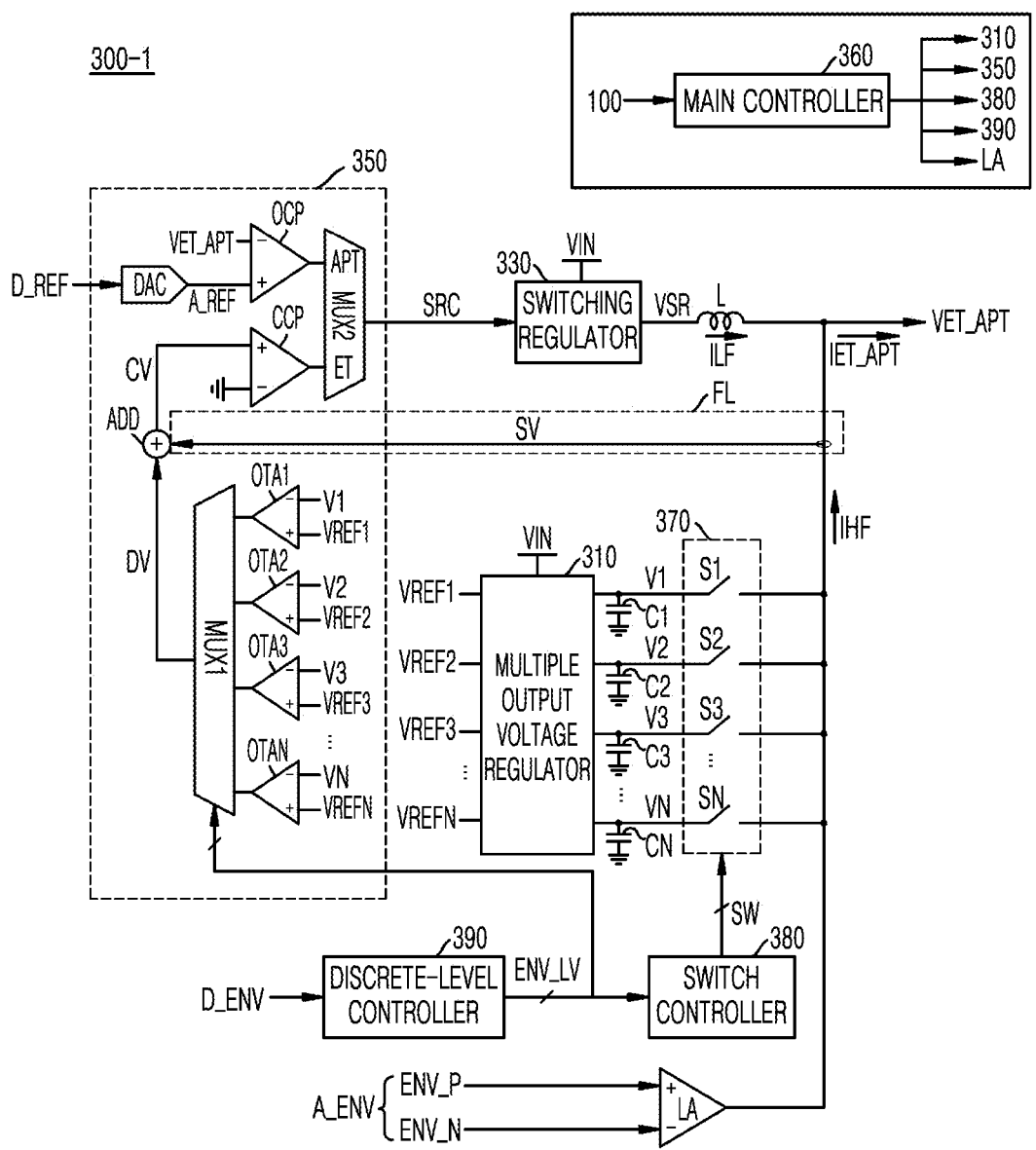
FIG. 4 is a circuit diagram illustrating a first example of a supply modulator included in a wireless communication apparatus according to embodiments of the inventive concepts.
Figure 5:
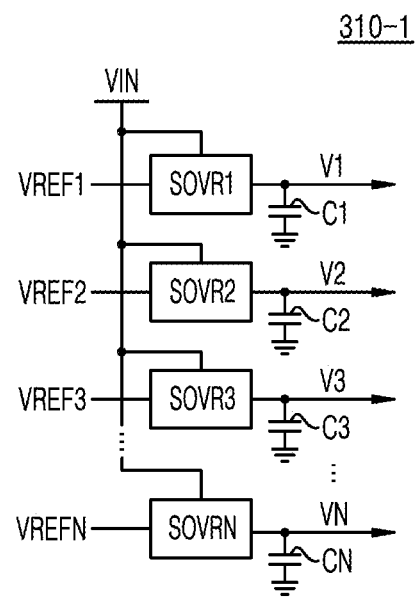
FIG. 5 is a diagram illustrating an example of a multiple output voltage regulator of FIG. 4.
Figure 6:
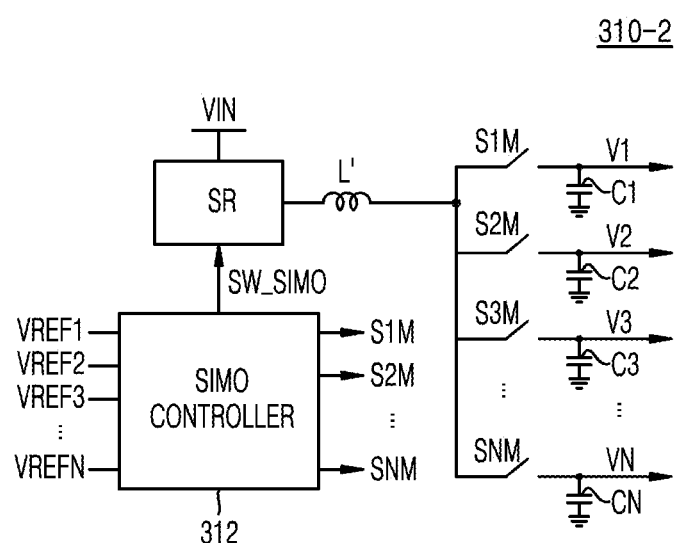
FIG. 6 is a diagram illustrating another example of the multiple output voltage regulator of FIG. 4.
Figure 7:
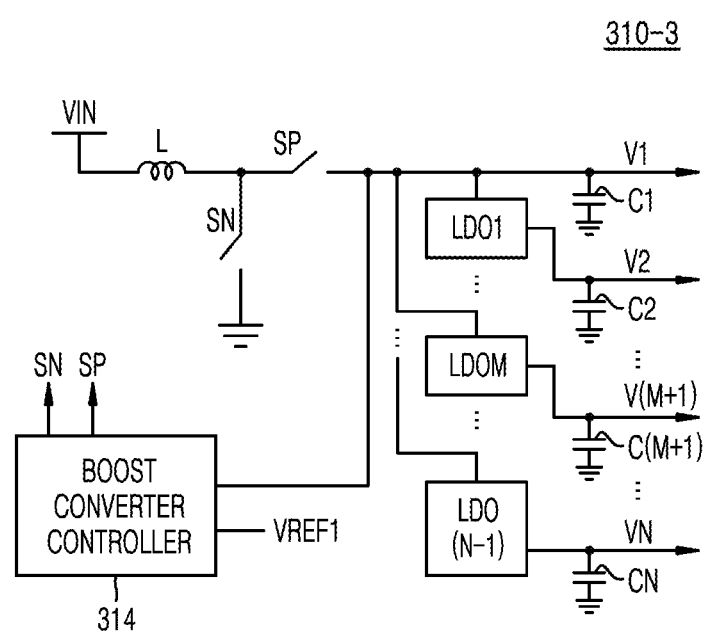
FIG. 7 is a diagram illustrating another example of the multiple output voltage regulator of FIG. 4.
Figure 8:
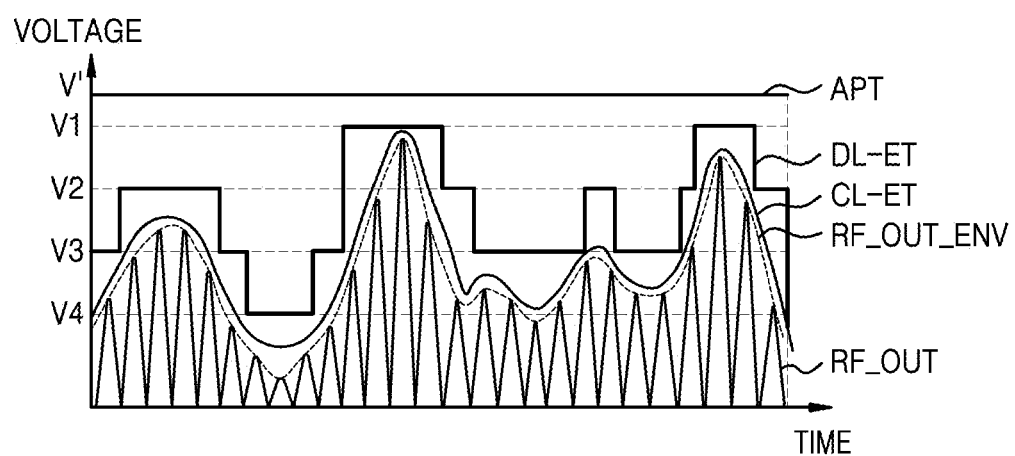
FIG. 8 is a graph illustrating waveform characteristics of output voltages according to a tracking mode.
Figure 9:
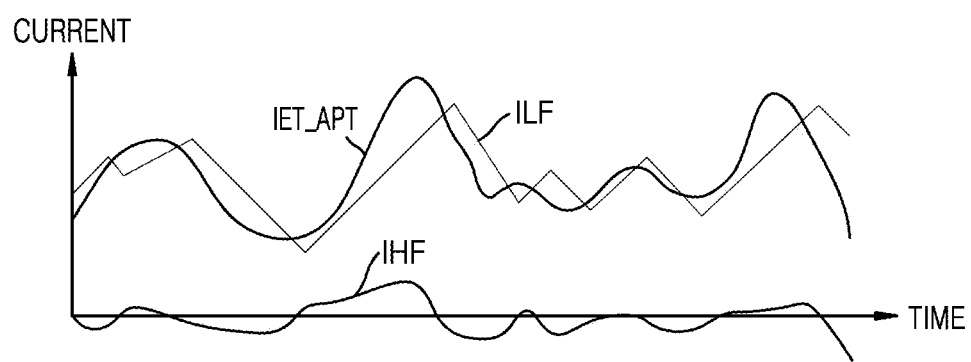
FIG. 9 is a graph illustrating an output voltage generation mechanism in an envelope tracking mode.
Figure 10:
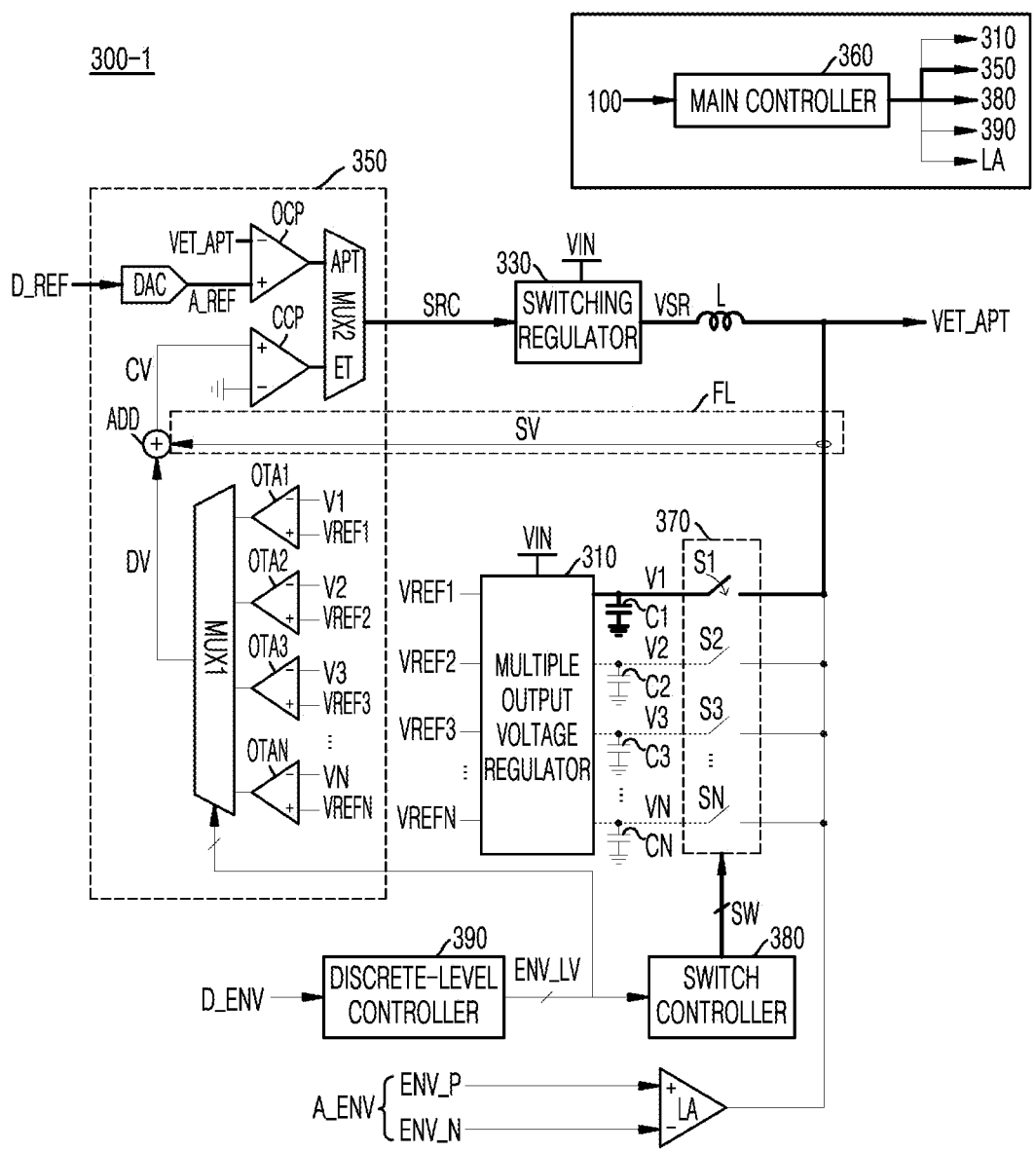
FIG. 10 is a diagram illustrating an average power tracking (APT) mode operation of the supply modulator of FIG. 4.
Figure 11:
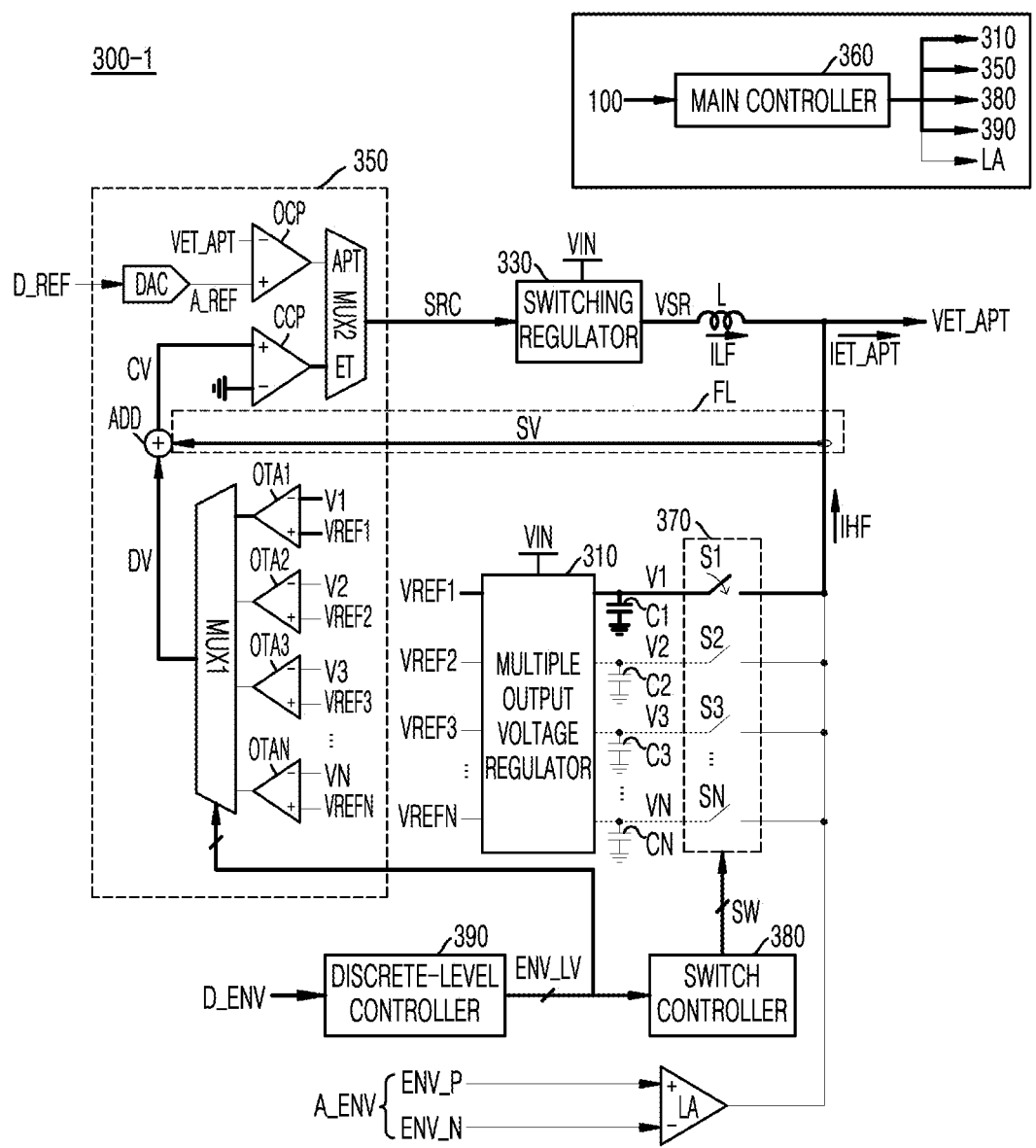
FIG. 11 is a diagram illustrating a discrete level-envelope tracking mode (DL-ET) operation of the supply modulator of FIG. 4.
Figure 12:
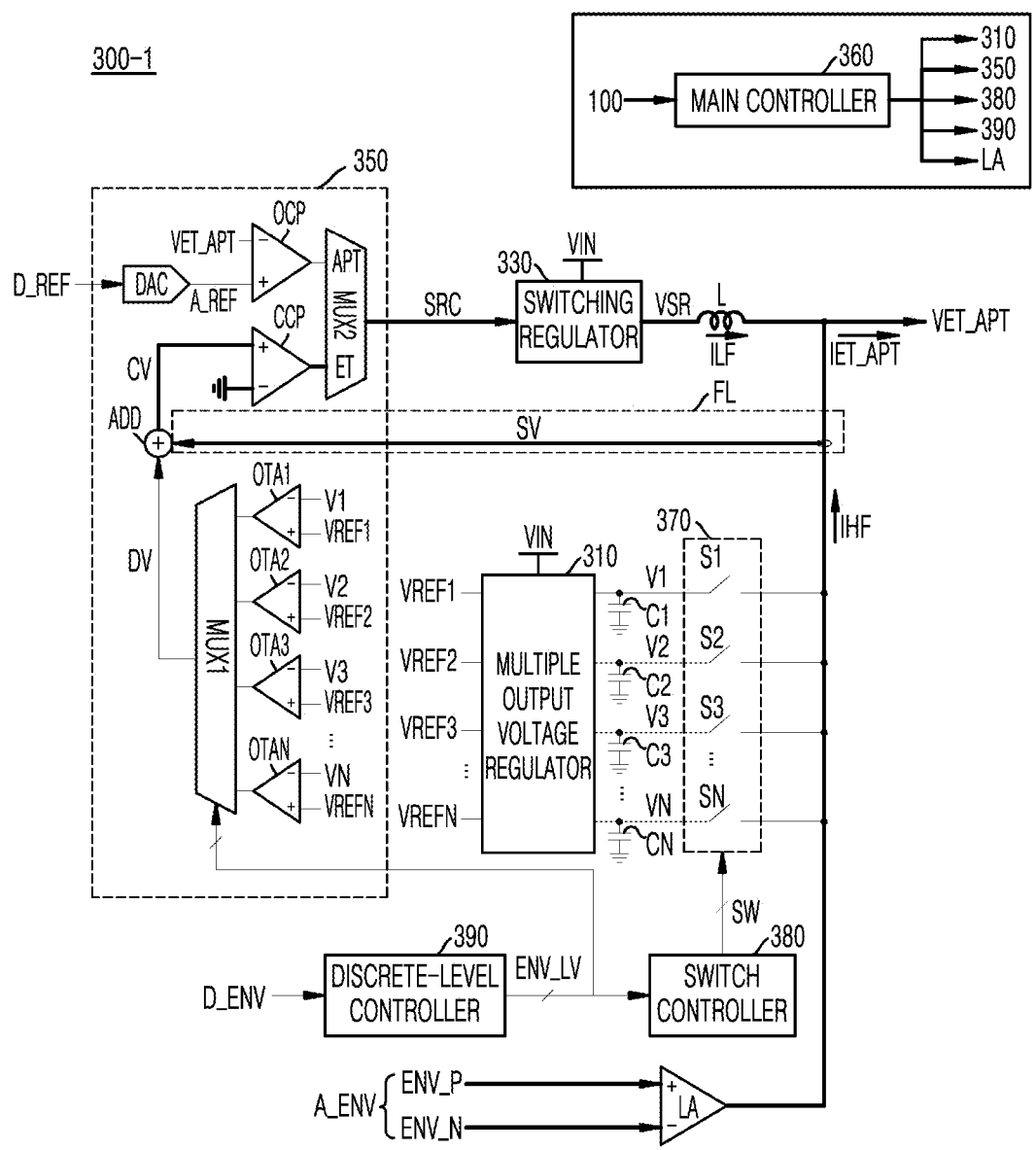
FIG. 12 is a diagram illustrating a continuous level-envelope (CL-ET) tracking mode operation of the supply modulator of FIG. 4.

FIG. 4 is a circuit diagram illustrating a first example of a supply modulator included in a wireless communication apparatus according to embodiments of the inventive concepts. FIG. 5 is a diagram illustrating an example of a multiple output voltage regulator 310 of FIG. 4. FIG. 6 is a diagram illustrating another example of a multiple output voltage regulator 310 of FIG. 4. FIG. 7 is a diagram illustrating another example of a multiple output voltage regulator 310 of FIG. 4. FIG. 8 is a graph illustrating waveform characteristics of an output voltage according to a tracking mode. FIG. 9 is a graph illustrating an output voltage generation mechanism in an envelope tracking mode. FIG. 10 is a diagram illustrating an APT mode operation of the supply modulator 300-1 of FIG. 4. FIG. 11 is a diagram illustrating a DL-ET mode operation of the supply modulator 300-1 of FIG. 4. FIG. 12 is a diagram illustrating a CL-ET mode operation of the supply modulator 300-1 of FIG. 4.

For reference, hereinafter, for convenience of explanation, it is assumed that a supply modulator 300-1 is implemented as the supply modulator 300 of the wireless communication apparatus 1 shown in FIG. 1. Also, FIG. 4 will be described below with reference to FIG. 1.

Referring to FIG. 4, the first example of the supply modulator 300 (that is, the supply modulator 300-1) according to embodiments of the inventive concepts may include the multiple output voltage regulator 310, a switching regulator 330, a linear regulator LA, a switching regulator controller 350, a main controller 360, a switch array 370, a switch controller 380, and/or a discrete-level controller 390.

For reference, each component may include a component-dedicated controller (e.g., the switching regulator controller 350) therein or outside, and each dedicated controller may be controlled by the main controller 360. In addition, there may be a controller that integrates and controls at least two components, and the corresponding controller may be controlled by the main controller 360.

However, for convenience of explanation, only the dedicated controllers of some components will be described in detail below.

To generate an output voltage VET_APT together with the switching regulator 330 in the DL-ET mode, the multiple output voltage regulator 310 may output a plurality of voltages V1 to VN (wherein N is a natural number of two or more) having different levels from each other to respectively correspond to a plurality of reference output voltage signals VREF1 to VREFN (wherein N is a natural number of two or more). In addition, the multiple output voltage regulator 310 may be controlled by the main controller 360.

That is, as the multiple output voltage regulator 310 is connected in parallel with the switching regulator 330, the multiple output voltage regulator 310 may generate the output voltage VET_APT by operating in parallel with the switching regulator 330 in the DL-ET mode. In addition, the multiple output voltage regulator 310 may generate and output the plurality of voltages V1 to VN having different levels from each other by boosting or reducing an input voltage (e.g., a power supply VIN provided from a battery or the like) based on the plurality of reference output voltage signals VREF1 to VREFN.

Herein, the plurality of reference output voltage signals VREF1 to VREFN may be received from the main controller 360. For reference, the modem 100 may calculate reference output voltage values based on output power of the power amplifier PA and provide the calculated reference output voltage values to the main controller 360. Also, the main controller 360 may generate, based on the received reference output voltage values, the plurality of reference output voltage signals VREF1 to VREFN and provide the same to at least one of the multiple output voltage regulator 310 and/or the switching regulator controller 350.

In addition, the connection between the multiple output voltage regulator 310 and the power amplifier PA may be selectively opened and closed by the switch array 370. That is, through the switching operation of the switch array 370, at least one voltage from among the plurality of voltages V1 to VN (e.g., V1 to VN are generated and output in a time-division method) having different levels from each other generated and output from the multiple output voltage regulator 310 may be selected, and the selected voltage may be provided to the power amplifier PA.

Also, an output end of the multiple output voltage regulator 310 may include a plurality of capacitors C1 to CN (wherein N is a natural number of two or more) respectively corresponding to the plurality of voltages V1 to VN having different levels from each other, and connections between the plurality of capacitors C1 to CN and the power amplifier PA may be individually opened and closed by a plurality of switches S1 and SN (wherein N is a natural number of two or more). The plurality of capacitors C1 to CN may be provided outside the multiple output voltage regulator 310 instead of the inside. However, for convenience of explanation, in embodiments of the inventive concepts, a case where the plurality of capacitors C1 to CN are included in the multiple output voltage regulator 310 is described as an example.

Referring to FIGS. 5 to 7, various implementation examples of the multiple output voltage regulator 310 (e.g., multiple output voltage regulators 310-1 to 310-3) are shown.

First, referring to FIG. 5, the multiple output voltage regulator 310-1 may include, for example, a plurality of single output voltage regulators SOVR1 to SOVRN (wherein N is a natural number of two or more) respectively outputting the plurality of voltages V1 to VN having different levels from each other.

Herein, each of the plurality of single output voltage regulators SOVR1 to SOVRN may include, for example, a switching regulator such as a buck converter and a boost converter, or may include a switched-capacitor direct current (DC)-DC converter, a low dropout regulator (LDO), or the like.

Also, in the plurality of single output voltage regulators SOVR1 to SOVRN, there may individually be a controller for each single output voltage regulator, or there may be one common controller.

Then, referring to FIG. 6, the multiple output voltage regulator 310-2 may include, for example, a single-inductor multiple-output (SIMO) DC-DC converter or a SIMO buck-boost converter.

In detail, the multiple output voltage regulator 310-2 of FIG. 6 may be a structure supplying an output current of a switching regulator (SR) in the SIMO DC-DC converter or a SIMO buck-boost converter to each output end through a single inductor L' in the time-division method.

Also, a SIMO controller 312 may monitor a difference between each of the plurality of output voltages V1 to VN and each of the plurality of reference output voltage signals VREF1 to VREFN corresponding thereto, and may determine a switch from among switches S1M, S2M, . . . , SNM connected to the inductor L' and each of the plurality of output voltages V1 to VN, to be turned on based on the monitoring result. In addition, at the same time or contemporaneously, the SIMO controller 312 may determine a switching input SW_SIMO of an SR connected to one side of the inductor L' based on difference information between each of the plurality of output voltages V1 to VN and each of the plurality of reference output voltage signals VREF1 to VREFN corresponding thereto.

For reference, in embodiments of the inventive concepts, because the magnitude of an output current IHF of the multiple output voltage regulator 310 is not large (that is, most of output currents IET_APT are supplied through the switching regulator 330 (e.g., ILF)), the multiple output voltage regulator 310 is suitable for applying the SIMO DC-DC converter or the SIMO buck-boost converter supplying an output in the time-division method. Also, the SIMO DC-DC converter may operate in both of a buck mode and a buck-boost mode.

Last, referring to FIG. 7, the multiple output voltage regulator 310-3 may include, for example, a boost converter (a converter including VIN, L, SN, SP) generating a voltage (e.g., V1) having the highest level from among the plurality of voltages V1 to VN having different voltages from each other, and a plurality of LDOs LDO1 to LDO(N−1) (wherein N is a natural number of two or more) generating the remaining voltages V2 to VN from among the plurality of voltages V1 to VN having different levels from each other by using the voltage having the highest level generated by the boost converter as an input.

Also, a boost converter controller 314 may monitor a difference between the output voltage V1 (e.g., the voltage having the highest level) of the boost converter and the reference output voltage signal VREF1 corresponding thereto, and determine a switch from among switches SN and SP to be turned on based on the monitoring result.

As described above, the multiple output voltage regulator 310 may be implemented in various forms. The multiple output voltage regulator 310 may include a structure different from the above-described structures, a detailed description thereof will be omitted.

Referring back to FIG. 4, the linear regulator LA may, in the CL-ET mode, operate to generate the output voltage VET_APT based on the analog envelope signal A_ENV received from the outside. In addition, the linear regulator LA may be controlled by the main controller 360.

In detail, the linear regulator LA may receive the analog envelope signal A_ENV from the modem 100 and may amplify and output the analog envelope signal A_ENV. Accordingly, the linear regulator LA may operate, in the CL-ET mode, in parallel with the switching regulator 330 to generate the output voltage VET_APT.

Also, although not illustrated in FIG. 4, the linear regulator LA may receive an input voltage (e.g., a power supply provided from a battery or the like) as a power supply voltage or may receive a power supply voltage from a separate voltage regulator. In addition, the linear regulator LA may also receive any one voltage from among the plurality of voltages V1 to VN having different levels from each other output from the multiple output voltage regulator 310 as a power supply voltage.

In addition, the linear regulator LA may be connected in parallel with the switching regulator 330, and for example, may be implemented as a linear amplifier. In addition, as shown in FIG. 4, the linear regulator LA may be implemented as a differential amplifier, and may receive a positive signal ENV_P and a negative signal ENV_N of the analog envelope signal A_ENV respectively through a positive terminal + and a negative terminal −.

Also, although not illustrated in FIG. 4, an output of the linear regulator LA may be fed back to the negative terminal − of the linear regulator LA through a feedback unit (not shown), and an output level of the linear regulator LA may be adjusted to a desired level. That is, the feedback unit may adjust the output level of the linear regulator LA to the desired level by making a voltage output from the linear regulator LA and a power supply voltage input to the linear regulator LA have a linear relationship.

In addition, although not illustrated in FIG. 4, noise may be removed from the analog envelope signal A_ENV input to the linear regulator LA by a noise removal unit (not shown). That is, the noise removal unit may remove the noise of the analog envelope signal A_ENV provided to the linear regulator LA and provide the noise-removed analog envelope signal A_ENV to the linear regulator LA. For reference, the noise removal unit may include, for example, a low-pass filter or an input buffer. Herein, the low-pass filter may have a characteristic of capable of taking a specific gain value while removing an image signal of a digital-to-analog converter or high-frequency noise of a band. Also, the input buffer may have a characteristic of capable of implementing a wideband due to a wide coverage bandwidth although the noise removal performance is sufficiently less than the low-pass filter.

The switching regulator 330 may operate together with the multiple output voltage regulator 310 to generate the output voltage VET_APT in the DT-EL mode, and may operate together with the linear regulator LA to generate the output voltage VET_APT in the CL-ET mode. Also, the switching regulator 330 may operate to generate the output voltage VET_APT in the APT mode. In addition, the switching regulator 330 may be controlled by the switching regulator controller 350.

In detail, the switching regulator 330 may operate in parallel with the multiple output voltage regulator 310 in the DL-ET mode, and may operate in parallel with the linear regulator LA in the CL-ET mode. That is, in the DL-ET mode or the CL-ET mode, the switching regulator 330 may boost or reduce the output voltage VET_APT by controlling turning-on or turning-off of a switch therein based on a switching regulator control signal SRC received from the switching regulator controller 350.

Herein, in the DL-ET mode or the CL-ET mode, the switching regulator control signal SRC provided to the switching regulator 330 may be generated based on an output of a compensation comparator CCP in the switching regulator controller 350.

Also, in the DL-ET mode, a sum current IET_APT of an output current ILF of the switching regulator 330 and the output current IHF of the multiple output voltage regulator 310 may be provided to the power amplifier PA. In this case, the output current ILF of the switching regulator 330 may be controlled based on the switching regulator control signal SRC such that an average of the output currents IHF of the multiple output voltage regulator 310 is approximately zero.

For reference, the output current ILF of the switching regulator 330 may include a current of a low-frequency component (e.g., a frequency less than 1 MHz), and the output current IHF of the multiple output voltage regulator 310 may include a current of a high-frequency component (e.g., a frequency greater than 1 MHz).

On the other hand, in the CL-ET mode, the sum current IET_APT of the output current ILF of the switching regulator 330 and the output current IHF of the linear regulator LA may be provided to the power amplifier PA. In this case, the output current ILF of the switching regulator 330 may be controlled based on the switching regulator control signal SRC such that an average of the output currents IHF of the linear regulator LA is approximately zero.

For reference, the output current ILF of the switching regulator 330 may include a current of a low-frequency component (e.g., a frequency less than 1 MHz), and the output current IHF of the linear regulator LA may include a current of a high-frequency component (e.g., a frequency greater than 1 MHz).

A voltage VSR output from the switching regulator 330 may be provided, as the output voltage VET_APT, to the power amplifier PA through the inductor L.

Herein, the inductor L may be a power inductor of the switching regulator 330. Accordingly, the inductor L may be connected to an output end of the switching regulator 330 and support a continuous current waveform.

For reference, the inductor L may also not be included in the switching regulator 330. That is, the inductor L may be provided outside the switching regulator 330. However, for convenience of explanation, in embodiments of the inventive concepts, a case where the inductor L is included in the switching regulator 330 is described as an example.

In the APT mode, the switching regulator 330 may independently regulate an input voltage (e.g., the power supply VIN provided from a battery or the like) to a target level based on the switching regulator control signal SRC received from the switching regulator controller 350. Also, the switching regulator 330 may provide, as the output voltage VET_APT, the regulated voltage VSR to the power amplifier PA.

Herein, in the APT mode, the switching regulator control signal SRC provided to the switching regulator 330 may be generated based on an output of an output comparator OCP in the switching regulator controller 350.

For reference, the switching regulator 330 may include, for example, a dual-phase hybrid buck-boost converter, but is not limited thereto. That is, the switching regulator 330 may include a buck converter, a boost converter, a buck-boost converter, a cuk converter, or another DC-DC converter.

Also, unlike the above description, in the DL-ET mode, the switching regulator 330 and the linear regulator LA may operate together to generate the output voltage VET_APT, and in the CL-ET mode, the switching regulator 330 and the multiple output voltage regulator 310 may operate together to generate the output voltage VET_APT. In addition, all of the switching regulator 330, the linear regulator LA, and the multiple output voltage regulator 310 may operate together to generate the output voltage VET_APT. In addition, in each of the DL-ET mode, the CL-ET mode, and the APT mode, driving agents other than the driving agents described herein may operate.

However, for convenience of explanation, in embodiments of the inventive concepts, a case where the switching regulator 330 and the multiple output voltage regulator 310 operate together in the DL-ET mode, the switching regulator 330 and the linear regulator LA operate together in the CL-ET mode, and the switching regulator 330 operates in the APT mode is described as an example.

The switching regulator controller 350 may selectively sense one of the output current of the multiple output voltage regulator 310 and/or the output current of the linear regulator LA according to a tracking mode, and may control the switching regulator 330 based on a sensing value SV. Also, the switching regulator controller 350 may be controlled by the main controller 360.

In detail, the switching regulator controller 350 may include a feedback loop FL, a plurality of operational transconductance amplifiers (OTAs) OTA1 to OTAN (wherein N is a natural number of two or more), a first multiplexer MUX1, a second multiplexer MUX2, a summer ADD, the compensation comparator CCP, a digital-to-analog converter DAC, and/or the output comparator OCP.

The feedback loop FL may obtain (e.g., sense) an output current of the multiple output voltage regulator 310 or an output current of the linear regulator LA.

That is, in the DL-ET mode, the feedback loop FL may sense the output current IHF of the multiple output voltage regulator 310 and provide the sensing value SV to the summer ADD. On the contrary, in the CL-ET mode, the feedback loop FL may sense the output current IHF of the linear regulator LA and provide the sensing value SV to the summer ADD.

For reference, IHF may refer to the output current of the multiple output voltage regulator 310 in the DL-ET mode, and may refer to the output current of the linear regulator LA in the CL-ET mode. SV may refer to a sensing value of the output current of the multiple output voltage regulator 310 in the DL-ET mode, and may refer to a sensing value of the output current of the linear regulator LA in the CL-ET mode. Herein, the sensing value SV may be, for example, a current value or a voltage value, but is not limited thereto.

The plurality of OTAs OTA1 to OTAN may output difference values by respectively comparing a difference between the plurality of voltages V1 to VN having different levels from each other and the plurality of reference output voltage signals VREF1 to VREFN.

That is, although not illustrated in FIG. 4, the plurality of OTAs OTA1 to OTAN may receive information about the plurality of voltages V1 to VN having different levels from each other output from the multiple output voltage regulator 310 and may receive information about the plurality of reference output voltage signals VREF1 to VREFN from the main controller 360. Accordingly, the plurality of OTAs OTA1 to OTAN may respectively compare voltages having specific levels with a specific reference output voltage signals corresponding thereto and output difference values DV between the voltages having the specific levels and the specific reference output voltage signals corresponding thereto based on the comparison results.

For example, the first OTA OTA1 may compare the first voltage V1 having a first level with the first reference output voltage signal VREF1 and output a difference value between the first voltage V1 having the first level and the first reference output voltage signal VREF1 based on the comparison result.

For reference, the difference value DV output from an OTA may be a current value or a voltage value proportional to a difference between a voltage of each level and a reference output voltage signal corresponding thereto, but is not limited thereto.

The first multiplexer MUX1 may select and output one of difference values DV output from the plurality of OTAs OTA1 to OTAN based on a level control signal ENV_LV received from the discrete-level controller 390.

That is, the first multiplexer MUX1 may receive the level control signal ENV_LV from the discrete-level controller 390, and select and output one of the difference values DV output from the plurality of OTAs OTA1 to OTAN based on the level control signal ENV_LV received from the discrete-level controller 390. Also, the output difference value DV may be provided to the summer ADD. In addition, the first multiplexer MUX1 may operate as described above in the DL-ET mode under the control of the main controller 360.

According to a tracking mode, the summer ADD may sum up the difference value DV output from the first multiplexer MUX1 and the sensing value SV of the output current IHF of the multiple output voltage regulator 310 sensed by the feedback loop FL and output the summed-up value as a compensation value CV, or may output the sensing value SV of the output current IHF of the linear regulator LA sensed by the feedback loop FL as the compensation value CV.

That is, in the DL-ET mode, the summer ADD may sum up the difference value DV output from the first multiplexer MUX1 and the sensing value SV of the output current IHF of the multiple output voltage regulator 310 sensed by the feedback loop FL and output the summed-up value as the compensation value CV. On the contrary, in the CL-ET mode, the summer ADD may output the sensing value SV of the output current IHF of the linear regulator LA sensed by the feedback loop FL as the compensation value CV. Also, the compensation value CV output from the summer ADD may be provided to the compensation comparator CCP.

For reference, the form of the compensation value CV output from the summer ADD may be, for example, a current value or a voltage value, but is not limited thereto.

The compensation comparator CCP may compare the compensation value CV output from the summer ADD with a reference value.

That is, the compensation comparator CCP may receive the compensation value CV output from the summer ADD through the positive terminal + and receive the reference value through the negative terminal −. Also, the compensation comparator CCP may output a comparison result between the received compensation value CV and reference value to the second multiplexer MUX2.

In more detail, when the compensation value CV is greater than the reference value, the compensation comparator CCP may output a high level signal (e.g., '1'), and when the compensation value CV is less than the reference value, the compensation comparator CCP may output a low level signal (e.g., '0').

For reference, the negative terminal − may be grounded, and in this case, the reference value may be zero.

The digital-to-analog converter DAC may convert the average power signal D_REF received from the outside into a reference voltage signal A_REF.

That is, the digital-to-analog converter DAC may receive the average power signal D_REF from the modem 100 through the MIPI 130, and may convert the received average power signal D_REF into the reference voltage signal A_REF and output the reference voltage signal A_REF to the output comparator OCP.

The output comparator OCP may compare the reference voltage signal A_REF converted by the digital-to-analog converter DAC with the output voltage VET_APT.

That is, the output comparator OCP may receive the reference voltage signal A_REF converted by the digital-to-analog converter DAC through the positive terminal +, and may receive the output voltage VET_APT through the negative terminal −. Also, the output comparator OCP may output a comparison result between the received reference voltage signal A_REF and output voltage VET_APT to the second multiplexer MUX2.

The second multiplexer MUX2 may output one of outputs of the compensation comparator CCP and the output comparator OCP to the switching regulator 330 as the switching regulator control signal SRC.

That is, in the APT mode, the second multiplexer MUX2 may output the output of the output comparator OCP to the switching regulator 330 as the switching regulator control signal SRC, and in the ET mode (e.g., the DL-ET mode or the CL-ET mode), the second multiplexer MUX2 may output the output of the compensation comparator CCP to the switching regulator 330 as the switching regulator control signal SRC.

For reference, in the DL-ET mode, the switching regulator 330 may output the output current ILF based on the switching regulator control signal SRC received from the second multiplexer MUX2. Also, the output current ILF may charge and discharge a capacitor (e.g., C1) connected to a switch (e.g., S1) through a turned-on switch (e.g., S1) among from the plurality of switches S1 to SN.

As described above, the switching regulator controller 350 may selectively sense one of the output current of the multiple output voltage regulator 310 and/or the output current of the linear regulator LA based on the above-described structure and characteristics, and may control the switching regulator 330 based on the sensing value SV.

For reference, although not illustrated in FIG. 4, the switching regulator controller 350 may sense a factor other than the output current of the multiple output voltage regulator 310 or the linear regulator LA, and may control the switching regulator 330 based on a corresponding sensing value. That is, the feedback loop FL may sense a factor other than the output current of the multiple output voltage regulator 310 or the linear regulator LA, and may provide a sensing value to the summer ADD. When the feedback loop FL senses a different factor, a feedback loop having a path different from that shown in FIG. 4 may be configured.

For example, the switching regulator controller 350 may sense the following factors.

1) an internal current of the multiple output voltage regulator 310 (for example, a current flowing through an internal inductor (e.g., L' in FIG. 6), a current flowing through internal LDOs (e.g., LDO1 to LDO (N−1)), or a current flowing through capacitors (e.g., C1 to CN);
2) a current applied from an input voltage (e.g., a power supply provided from a battery or the like; VIN) to the multiple output voltage regulator 310; and/or
3) an internal voltage of the multiple output voltage regulator 310 (for example, a voltage of internal switches (e.g., switches S1M to SNM of FIG. 6), gate voltages of internal LDOs (e.g., LDO1 to LDO(N−1) of FIG. 7).

However, for convenience of explanation, in embodiments of the inventive concepts, a case where the switching regulator controller 350 selectively senses one of the output current of the multiple output voltage regulator 310 and/or the output current of the linear regulator LA, and controls the switching regulator 330 based on the sensing value SV is described as an example.

The switch array 370 may include a plurality of switches S1 to SN (wherein N is a natural number of two or more) respectively corresponding to the plurality of voltages V1 to VN having different levels from each other output from the multiple output voltage regulator 310. Also, switching operations of the plurality of switches S1 to SN in the switch array 370 may be controlled by a switch control signal SW provided from the switch controller 380. Accordingly, the switch array 370 may select one of the plurality of voltages V1 to VN having different levels from each other based on the switch control signal SW and provide the selected voltage to the power amplifier PA.

The discrete-level controller 390 may generate the level control signal ENV_LV including multiple pieces of envelope level information based on the digital envelope signal D_ENV received from the outside. Also, the discrete-level controller 390 may be controlled by the main controller 360.

In detail, the discrete-level controller 390 may receive the digital envelope signal D_ENV from the modem 100 and generate and output the level control signal ENV_LV including multiple pieces of envelope level information based on the digital envelope signal D_ENV received from the modem 100. Also, the level control signal ENV_LV output from the discrete-level controller 390 may be provided to the switch controller 380 and the switching regulator controller 350 (e.g., the first multiplexer MUX1).

The switch controller 380 may receive the level control signal ENV_LV from the discrete-level controller 390 and control the switching operations of the plurality of switches S1 to SN based on the level control signal ENV_LV received from the discrete-level controller 390. That is, the switch controller 380 may generate the switch control signal SW for controlling a switching operation of the switch array 370 and provide the generated switch control signal SW to the switch array 370. Also, the switch controller 380 may be controlled by the main controller 360.

In detail, in the DL-ET mode, the switch controller 380 may control the switching operation of the switch array 370 to select, from among the plurality of voltages V1 to VN having different levels from each other, a voltage to be provided to the power amplifier PA.

Also, in the APT mode, the switch controller 380 may control at least one of the plurality of switches S1 to SN to connect a capacitor corresponding to the controlled switch among from the plurality of capacitors C1 to CN to the power amplifier PA.

This is because in the APT mode, a decoupling capacitor connected to the output voltage VET_APT is used.

Accordingly, in the APT mode, the switch controller 380 may control the switch array 370 to connect at least one of the plurality of capacitors C1 to CN of the multiple output voltage regulator 310 to the power amplifier PA. Also, the capacitor connected to the power amplifier PA may be used as a decoupling capacitor.

The main controller 360 may generate the plurality of reference output voltage signals VREF1 to VREFN to provide the same to at least one of the multiple output voltage regulator 310 and/or the switching regulator controller 350. Also, the main controller 360 may determine a tracking mode and control at least one of the multiple output voltage regulator 310, the linear regulator LA, the switch controller 380, the switching regulator controller 350, and/or the discrete-level controller 390 based on the determined tracking mode.

In detail, the main controller 360 may receive a tracking mode determination signal from the modem 100 through the MIPI (130 of FIG. 1) and determine the tracking mode of the supply modulator 300-1.

Accordingly, when the tracking mode is determined as the DL-ET mode, the main controller 360 may control a parallel operation of the multiple output voltage regulator 310 and the switching regulator 330. In this case, the multiple output voltage regulator 310 and the switching regulator 330 may together generate a modulation voltage according to the DL-ET mode and provide the generated modulation voltage to the power amplifier PA as the output voltage VET_APT.

Subsequently, when the tracking mode is determined as the CL-ET mode, the main controller 360 may control a parallel operation of the linear regulator LA and the switching regulator 330. In this case, the linear regulator LA and the switching regulator 330 may together generate a modulation voltage according to the CL-ET mode and provide the generated modulation voltage to the power amplifier PA as the output voltage VET_APT.

Last, when the tracking mode is determined as the APT mode, the main controller 360 may control an output voltage generation operation of the switching regulator 330. In this case, the switching regulator 330 may generate a modulation voltage according to the APT mode and provide the generated modulation voltage to the power amplifier PA as the output voltage VET_APT.

In the APT mode, the switch controller 380 may control the switching operation of the switch array 370 to activate some of the plurality of capacitors C1 to CN as a decoupling capacitor.

The main controller 360 may receive various signals (e.g., various control signals such as an output voltage level signal or the like) other than the tracking mode determination signal from the modem 100 through the MIPI 130 and control components such as the multiple output voltage regulator 310, the linear regulator LA, the switch controller 380, the switching regulator controller 350, and the discrete-level controller 390 based on the received various signals.

For reference, in FIG. 4, the main controller 360 is shown as controlling at least one of the multiple output voltage regulator 310, the linear regulator LA, the switch controller 380, the switching regulator controller 350, and/or the discrete-level controller 390, but is not limited thereto. That is, the main controller 360 may control operations of components other than the above-stated components.

However, for convenience of explanation, in embodiments of the inventive concepts, a case where the main controller 360 controls at least one of the multiple output voltage regulator 310, the linear regulator LA, the switch controller 380, the switching regulator controller 350, and/or the discrete-level controller 390 is described as an example.

In addition to the above-stated components, the supply modulator 300-1 may further include an additional capacitor (not shown), an oscillator (not shown), a bandgap reference circuit (not shown), or the like.

In detail, the additional capacitor may be connected near an output end of the supply modulator 300-1, and may remove a parasitic capacitance and high-frequency noise that may be in a circuit of the supply modulator 300-1. In addition, the oscillator is a circuit employed when using an n-channel metal-oxide semiconductor (NMOS) structure (e.g., a gate-boosted NMOS structure) to improve the characteristics of the plurality of switches S1 to SN. Also, the bandgap reference circuit is a circuit that supplies a reference voltage or a reference current used when each component operates, and may be hardly affected by operations, voltages, temperature changes, or the like.

As described above, the supply modulator 300-1 may have the above-described structure and characteristics. In addition, based on the structure and the characteristics, the supply modulator 300-1 may be driven in any one tracking mode of the DL-ET mode, the CL-ET mode, and/or the APT mode and provide the output voltage VET_APT to the power amplifier PA.

Accordingly, referring to FIG. 8, waveform characteristics of output voltages according to a tracking mode are shown.

In detail, FIG. 8 shows an output voltage waveform APT according to the APT mode, an output voltage waveform DL-ET according to the DL-ET mode, and an output voltage waveform CL-ET according to the CL-ET mode.

Herein, the APT mode is a tracking mode in which a modulation voltage that varies based on a peak level of an envelope RF_OUT_ENV of the RF output signal RF_OUT at a certain time interval (e.g., a transmission time interval (TTI)) is applied to a power amplifier (PA of FIG. 1). Also, the CL-ET mode is a tracking mode in which a modulation voltage that follows a level of the envelope RF_OUT_ENV of the RF output signal RF_OUT is instantaneously or promptly applied to the power amplifier (PA of FIG. 1). In addition, the DL-ET mode is a tracking mode in which a modulation voltage that follows the level of the envelope RF_OUT_ENV of the RF output signal RF_OUT is applied to the power amplifier (PA of FIG. 1, wherein the modulation voltage is limited to a plurality of voltages having different levels from each other generated by the multiple output voltage regulator 310.

For reference, the envelope RF_OUT_ENV of the RF output signal RF_OUT may be generated based on an amplitude (magnitude) of the RF output signal RF_OUT.

Then, a mechanism by which the supply modulator 300-1 generates the output voltage VET_APT in the ET mode (the DL-ET mode or the CL-ET mode) is shown in FIG. 9.

Referring to FIGS. 4 and 9, in the ET mode (the DL-ET mode or the CL-ET mode), the switching regulator 330 may supply the output current ILF of a low-frequency component based on the switching regulator control signal SRC.

In detail, when the magnitude of the output current ILF of the switching regulator 330 is less than the magnitude of the sum current IET_APT to be provided to the power amplifier (PA of FIG. 1), the multiple output voltage regulator 310 and/or the linear regulator LA may supply an additional current (e.g., the output current IHF of a high-frequency component) to the power amplifier (PA of FIG. 1). For reference, when the switching regulator control signal SRC is the low level signal, the magnitude of the output current ILF of the switching regulator 330 may be less than the magnitude of the sum current IET_APT desired for the power amplifier (PA of FIG. 1).

On the contrary, when the magnitude of the output current ILF of the switching regulator 330 is greater than the magnitude of the sum current IET_APT to be provided to the power amplifier (PA of FIG. 1), the multiple output voltage regulator 310 or the linear regulator LA may absorb an excess current (e.g., the output current IHF of the high-frequency component). For reference, when the switching regulator control signal SRC is the high level signal, the magnitude of the output current ILF of the switching regulator 330 may be greater than the magnitude of the sum current IET_APT desired for the power amplifier (PA of FIG. 1).

As described above, the supply modulator 300-1 according to embodiments of the inventive concepts may generate a modulation voltage that varies according to any one tracking mode of APT mode, the DL-ET mode, and/or the CL-ET mode to provide the generated modulation voltage to the power amplifier (PA of FIG. 1) as a power supply voltage.

Further, based on the above characteristics, as a voltage difference between the RF output signal RF_OUT of the power amplifier (PA of FIG. 1) and a modulation voltage (e.g., the output voltage VET_APT to be provided to the power amplifier (PA of FIG. 1) of the supply modulator 300-1 is reduced, energy waste may be minimized or decreased, and the lifespan of a battery may be improved.

In the case of the power efficiency of the power amplifier (PA of FIG. 1), the power efficiency in the ET mode (the D-ET mode or the CL-ET mode) is greater than the power efficiency in the APT mode. On the contrary, in the case of the power efficiency of the supply modulator 300-1, the power efficiency in the APT mode is greater than the power efficiency in the ET mode (the DL-ET mode or the CL-ET mode).

For reference, the power efficiency of an entire system, for example, the efficiency of the wireless communication apparatus 1 of FIG. 1 may be proportional to the power efficiency of the supply modulator 300-1 and the power efficiency of the power amplifier (e.g., PA of FIG. 1).

For this reason, in a high power region, in which a power level (more particularly, transmission power of the antenna (ANT of FIG. 1)) of the RF output signal RF_OUT is high, and the power efficiency of the entire system may be greater in the ET mode (the DL-ET mode or the CL-ET mode) than in the APT mode. On the contrary, in a low power region, in which the power level of the RF output signal RF_OUT (more particularly, the transmission power of the antenna (ANT of FIG. 1)) is low, and the power efficiency of the entire system may be greater in the APT mode than in the ET mode (the DL-ET mode or the CL-ET mode).

Accordingly, the supply modulator 300-1 may be driven in any one tracking mode of the ET mode (the DL-ET mode or the CL-ET mode) and/or the APT mode selectively according to transmission power TX power of the antenna (ANT of FIG. 1).

For reference, the CL-ET mode is a method of tracking the envelope RF_OUT_ENV of the RF output signal (RF_OUT of FIG. 1) by using the linear regulator LA. Accordingly, the CL-ET mode has excellent power conversion efficiency in generating the output voltage VET_APT by accurately tracking the envelope RF_OUT_ENV of the RF output signal (RF_OUT of FIG. 1), but a bandwidth of the linear regulator LA may limit a bandwidth of the output voltage VET_APT.

On the contrary, the DL-ET mode is a method of tracking the envelope RF_OUT_ENV of the RF output signal (RF_OUT of FIG. 1) and limiting the output voltage VET_APT supplied to the power amplifier (PA of FIG. 1) to the plurality of voltages V1 to VN having different levels from each other that may be generated by the multiple output voltage regulator 310. Accordingly, in the DL-ET mode, a voltage difference between the output voltage VET_APT and the envelope RF_OUT_ENV of the RF output signal (RF_OUT of FIG. 1) may occur, and accordingly, the power conversion efficiency may be lower than in the CT-ET mode. However, in the DL-ET mode, the power efficiency of the supply modulator may be greater than in the CL-ET mode. In addition, in the DL-ET mode, as the linear regulator LA is not used, the bandwidth of the output voltage VET_ATP may be greater than that in the CL-ET mode.

For reference, a channel bandwidth in use or to be used in the NR (5G) may exceed a bandwidth limit of the linear regulator LA, and thus, in the NR (5G), the CL-ET mode in which the linear regulator LA is used may be difficult to be implemented. However, in the DL-ET mode, as an output of the multiple output voltage regulator 310 is provided (e.g., the output of the multiple output voltage regulator 310 does not pass through the linear regulator LA) to the power amplifier (e.g., PA of FIG. 1) through a switch (e.g., one of the S1 to SN), the above-stated bandwidth related challenge may be solved.

Accordingly, the main controller 360 may determine any one tracking mode of the DL-ET mode and the CL-ET mode in a direction in which the power efficiency of the entire system may be increased by considering the above situation.

As described above, as the supply modulator 300-1 is driven in the APT mode or the ET mode (the DL-ET mode or the CL-ET mode) based on the above-described principles and generates the output voltage VET_APT, hereinafter, referring to FIGS. 10 to 12, an operation of the supply modulator 300-1 according to a tracking mode will be described.

For reference, portions indicated by bold lines in each of FIGS. 10 to 12 may mean operation activation paths in the corresponding drawing.

First, referring to FIG. 10, an operation of the supply modulator 300-1 in the APT mode is shown.

The main controller 360 may receive an APT mode determination signal from the modem 100 and determine the APT mode of the supply modulator 300-1 based on the APT mode determination signal.

In this case, the main controller 360 may control the switching regulator controller 350 based on the determined tracking mode, and the switching regulator controller 350 may control the switching regulator 330 based on the control of the main controller 360.

Accordingly, the switching regulator 330 may generate a modulation voltage (or, regulated voltage, VSR) according to the APT mode and provide the generated modulation voltage VSR to the power amplifier (PA of FIG. 1) as the output voltage VET_APT.

In more detail, to generate the modulation voltage VSR according to the APT mode, the digital-to-analog converter DAC of the switching regulator controller 350 may receive the average power signal D_REF from the modem 100 and convert the average power signal D_REF received from the modem 100 into the reference voltage signal A_REF. The digital-to-analog converter DAC may provide the converted reference voltage signal A_REF to the output comparator OCP, and the output comparator OCP may compare the output voltage VET_APT with the reference voltage signal A_REF. Also, the output comparator OCP may output the comparison result to the second multiplexer MUX2, and the second multiplexer MUX2 may output an output of the output comparator OCP to the switching regulator 330 as the switching regulator control signal SRC. The switching regulator 330 may generate the modulation voltage VSR according to the APT mode based on the switching regulator control signal SRC received from the second multiplexer MUX2 and supply the generated modulation voltage VSR to the power amplifier (PA of FIG. 1) as the output voltage VET_APT.

For reference, in embodiments of the inventive concepts, a method (e.g., a hysteretic (bang-bang) control method) of controlling the output voltage VET_APT by using the output comparator OCP in the APT mode is shown, but is not limited thereto. That is, in embodiments of the inventive concepts, a method (e.g., a voltage mode control method) of controlling the output voltage VET_APT by using a compensator instead of a comparator in the APT mode may be used. However, for convenience of explanation, in embodiments of the inventive concepts, a case where the method of controlling the output voltage VET_APT based on the output comparator OCP in the APT mode is used is described as an example.

Further, the main controller 360 may control the switch controller 380 based on the determined tracking mode, and the switch controller 380 may control the switch array 370 based on the control of the main controller 360.

In more detail, the switch controller 380 may control the switching operations of some of the plurality of switches S1 to SN based on the control of the main controller 360. Accordingly, the switch array 370 may turn on a switch corresponding to a capacitor to be used as a decoupling capacitor from among the plurality of capacitors C1 to CN of the multiple output voltage regulator 310. Also, a selected capacitor may be connected to the power amplifier PA through the turned-on switch and used as a decoupling capacitor in the APT mode.

For reference, although not illustrated in FIG. 10, a separate capacitor (not shown) may be further included at the output end of the supply modulator 300-1. In this case, the capacitor connected to the output end of the supply modulator 300-1 may be used as a decoupling capacitor in the APT mode.

In addition, although not illustrated in FIG. 10, the multiple output voltage regulator 310 may also generate a modulation voltage according to the APT mode based on the control of the main controller 360.

However, for convenience of explanation, in embodiments of the inventive concepts, a case where some of the plurality of capacitors C1 to CN of the multiple output voltage regulator 310 are used as a decoupling capacitor and the switching regulator 330 generates and outputs the output voltage VET_APT is described as an example.

Then, referring to FIG. 11, an operation of the supply modulator 300-1 in the DL-ET mode is shown.

The main controller 360 may receive a DL-ET mode determination signal from the modem 100 and determine the DL-ET mode of the supply modulator 300-1 based on the DL-ET mode determination signal.

In this case, the main controller 360 may control the multiple output voltage regulator 310, the switching regulator controller 350, the switch controller 380, and the discrete-level controller 390 based on the determined tracking mode. Also, the switching regulator controller 350 may control the switching regulator 330, and the switch controller 380 may control the switch array 370. Accordingly, the switching regulator 330 and the multiple output voltage regulator 310 may together generate a modulation voltage according to the DL-ET mode and provide the generated modulation voltage to the power amplifier (PA of FIG. 1) as the output voltage VET_APT.

In more detail, the multiple output voltage regulator 310 may receive the plurality of reference output voltage signals VREF1 to VREFN from the main controller 360, and generate and output the plurality of voltages V1 to VN having different levels from each other by boosting or reducing an input voltage (e.g., the power supply VIN provided from a battery or the like) based on the plurality of reference output voltage signals VREF1 to VREFN received from the main controller 360.

The discrete-level controller 390 may receive the digital envelope signal D_ENV from the modem 100 and generate the level control signal ENV_LV including multiple pieces of envelope level information based on the digital envelope signal D_ENV received. In addition, the discrete-level controller 390 may provide the generated level control signal ENV_LV to the switch controller 380 and the first multiplexer MUX1.

The switch controller 380 may receive the level control signal ENV_LV from the discrete-level controller 390 and control the switching operations of the plurality of switches S1 to SN based on the level control signal ENV_LV received from the discrete-level controller 390. That is, the switch controller 380 may control the switching operation of the switch array 370 to select, from among the plurality of voltages V1 to VN having different levels from each other, a voltage to be provided to the power amplifier PA.

Accordingly, a switch (e.g., S1) selected from among the plurality of switches S1 to SN by the switch control signal SW may be turned on, and a voltage (e.g., V1) having a specific level corresponding to the switch may be provided to the power amplifier (PA of FIG. 1) through the turned-on switch (e.g., S1).

For reference, the output current IHF of the multiple output voltage regulator 310 provided to the power amplifier (PA of FIG. 1) through the turned-on switch may be sensed by the feedback loop FL of the switching regulator controller 350, and the sensing value SV may be provided to the summer ADD.

The plurality of OTAs OTA1 to OTAN of the switching regulator controller 350 may receive information about the plurality of voltages V1 to VN having different levels from each other output from the multiple output voltage regulator 310 and may receive information about the plurality of reference output voltage signals VREF1 to VREFN from the main controller 360. Also, the plurality of OTAs OTA1 to OTAN may respectively compare voltages (e.g., V1) having specific levels with specific reference output voltages signal (e.g., VREF1) corresponding thereto and output difference values between the voltages having the specific levels and the specific reference output voltage signals corresponding thereto based on the comparison result.

The first multiplexer MUX1 may receive the level control signal ENV_LV from the discrete-level controller 390 and select and output one of the difference values DV output from the plurality of OTAs OTA1 to OTAN based on the level control signal ENV_LV received from the discrete-level controller 390. In addition, the first multiplexer MUX1 may provide the selected difference value DV to the summer ADD.

The summer ADD may sum up the difference value DV output from the first multiplexer MUX1 and the sensing value SV of the output current IHF of the multiple output voltage regulator 310 sensed by the feedback loop FL and output the summed-up value as the compensation value CV. In addition, the compensation value CV output from the summer ADD may be provided to the compensation comparator CCP.

The compensation comparator CCP may receive the compensation value CV output from the summer ADD through the positive terminal + and receive the reference value through the negative terminal −. In addition, the compensation comparator CCP may output a comparison result between the received compensation value CV and the reference value to the second multiplexer MUX2.

In the DL-ET mode, the second multiplexer MUX2 may output an output of the compensation comparator CCP to the switching regulator 330 as the switching regulator control signal SRC.

The switching regulator 330 may generate the modulation voltage VSR according to the DL-ET mode based on the switching regulator control signal SRC received from the second multiplexer MUX2 and supply the generated modulation voltage VSR to the power amplifier (PA of FIG. 1).

For reference, the output current ILF of the switching regulator 330 output based on the switching regulator control signal SRC may be combined with the output current IHF of the multiple output voltage regulator 310 stated above to be provided to the power amplifier (PA of FIG. 1) as the output current IET_APT forming the output voltage VET_APT.

Last, referring to FIG. 12, an operation of the supply modulator 300-1 in the CL-ET mode is shown.

The main controller 360 may receive a CL-ET mode determination signal from the modem 100 and determine the CL-ET mode of the supply modulator 300-1 based on the CL-ET mode determination signal.

In this case, the main controller 360 may control the linear regulator LA and the switching regulator controller 350 based on the determined tracking mode. Also, the switching regulator controller 350 may control the switching regulator 330. Accordingly, the switching regulator 330 and the linear regulator LA may together generate a modulation voltage according to the CL-ET mode and provide the generated modulation voltage to the power amplifier PA of FIG. 1) as the output voltage VET_APT.

In more detail, the linear regulator LA may receive the analog envelope signal A_ENV from the modem 100 and output the analog envelope signal A_ENV received from the modem 100 to output the output current IHF. Also, the output current IHF output from the linear regulator LA may be provided to the power amplifier (PA of FIG. 1).

For reference, the output current IHF of the linear regulator LA may be sensed by the feedback loop FL of the switching regulator controller 350, and the sensing value SV may be provided to the summer ADD.

The summer ADD in the switching regulator controller 350 may output, as the compensation value CV, the sensing value SV of the output current IHF of the linear regulator LA sensed by the feedback loop FL. In addition, the compensation value CV output from the summer ADD may be provided to the compensation comparator CCP.

The compensation comparator CCP may receive the compensation value CV output from the summer ADD through the positive terminal + and receive the reference value through the negative terminal −. In addition, the compensation comparator CCP may output a comparison result between the received compensation value CV and the reference value to the second multiplexer MUX2.

In the CL-ET mode, the second multiplexer MUX2 may output an output of the compensation comparator CCP to the switching regulator 330 as the switching regulator control signal SRC.

The switching regulator 330 may generate the modulation voltage VSR according to the CL-ET mode based on the switching regulator control signal SRC received from the second multiplexer MUX2 and supply the generated modulation voltage VSR to the power amplifier (PA of FIG. 1).

For reference, the output current ILF of the switching regulator 330 output based on the switching regulator control signal SRC may be combined with the output current IHF of the linear regulator LA described above to be provided to the power amplifier (PA of FIG. 1) as the output current IET_APT forming the output voltage VET_APT.

As described above, as the supply modulator 300-1 operates according to the APT mode, the DL-ET mode, or the CL-ET mode based on the above-described principles, and hereinafter, referring to FIGS. 13 to 15, a second example of a supply modulator according to embodiments of the inventive concepts will be described.

Figure 13:
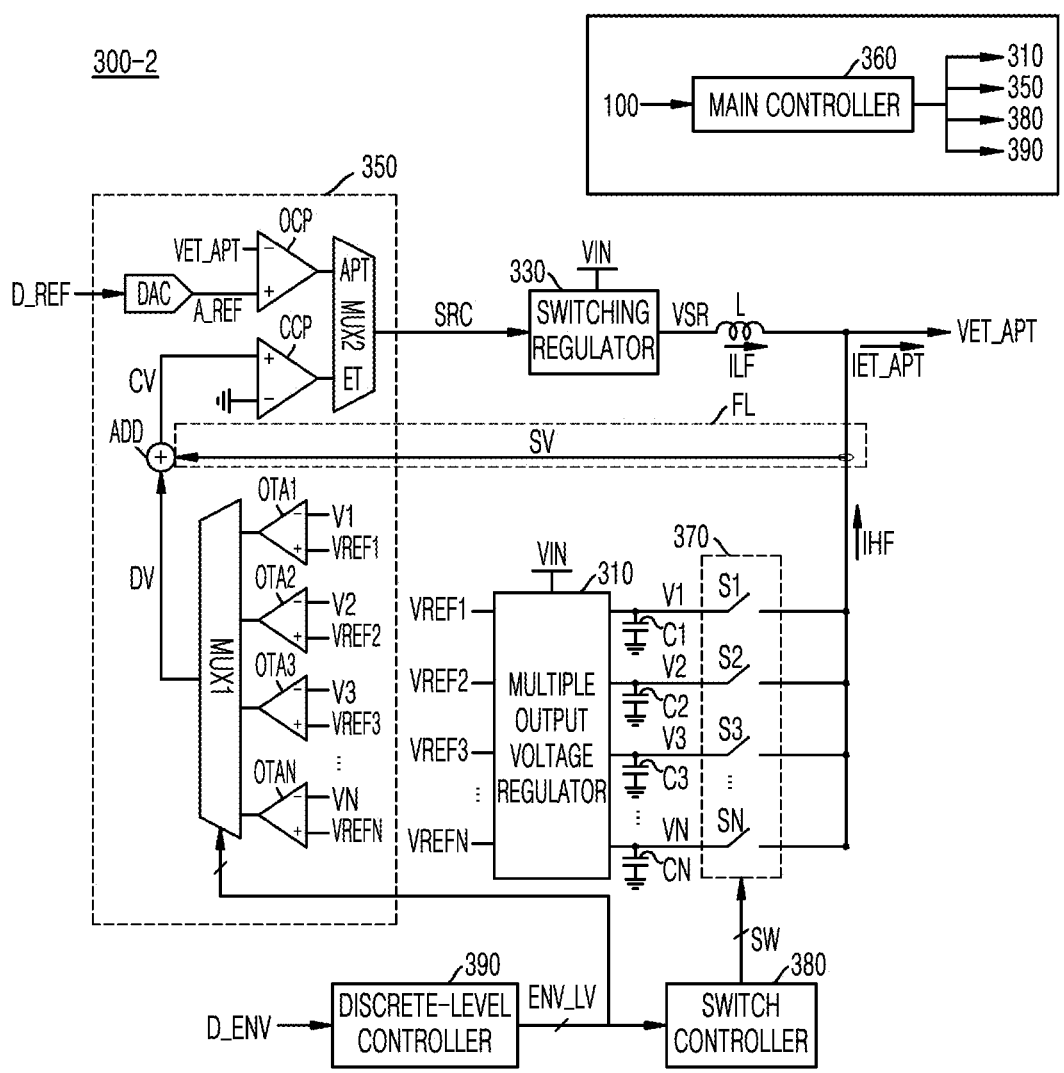
FIG. 13 is a circuit diagram illustrating a second example of a supply modulator included in a wireless communication apparatus according to embodiments of the inventive concepts.

FIG. 13 is a circuit diagram illustrating a second example of a supply modulator 300-2 included in a wireless communication apparatus according to embodiments of the inventive concepts. FIG. 14 is a diagram illustrating an APT mode operation of the supply modulator 300-2 of FIG. 13. FIG. 15 is a diagram illustrating a DL_ET mode operation of the supply modulator 300-2 of FIG. 13.

Hereinafter, for convenience of explanation, it is assumed that the supply modulator 300-2 is implemented as the supply modulator 300 of the wireless communication apparatus 1 shown in FIG. 1. Also, FIG. 13 will be described with reference to FIG. 1. In addition, as the supply modulator 300-2 and the supply modulator 300-1 of FIG. 4 are the same or similar except for some structures and mechanisms, differences thereof will be mainly described below.

Referring to FIG. 13, the second example of the supply modulator 300 (that is, the supply modulator 300-2) according to embodiments of the inventive concepts may include the multiple output voltage regulator 310, the switching regulator 330, the switching regulator controller 350, the main controller 360, the switch array 370, the switch controller 380, and/or the discrete-level controller 390.

In detail, unlike the supply modulator 300-1 of FIG. 4, the supply modulator 300-2 of FIG. 13 may not include the linear regulator LA.

Accordingly, the supply modulator 300-2 may operate in the DL-ET mode or the APT mode, but may not operate in the CL-ET mode.

First, the switching regulator 330 may operate together with the multiple output voltage regulator 310 to generate the output voltage VET_APT in the DL-ET mode, and may operate to generate the output voltage VET_APT in the APT mode.

Also, in the DL-ET mode, the switching regulator controller 350 may sense the output current IHF of the multiple output voltage regulator 310 and control the switching regulator 330 based on the sensing value SV.

In detail, in the DL-ET mode, the feedback loop FL of the switching regulator controller 350 may sense the output current IHF of the multiple output voltage regulator 310 and provide the sensing value SV to the summer ADD.

In addition, in the APT mode, the second multiplexer MUX2 of the switching regulator controller 350 may output an output of the output comparator OCP to the switching regulator 330 as the switching regulator control signal SRC, and in the DL-ET mode, the second multiplexer MUX2 of the switching regulator controller 350 may output an output of the compensation comparator CCP to the switching regulator 330 as the switching regulator control signal SRC.

The main controller 360 may generate the plurality of reference output voltage signals VREF1 to VREFN and provide the same to at least one of the multiple output voltage regulator 310 and/or the switching regulator controller 350. Also, the main controller 360 may determine a tracking mode and control at least one of the multiple output voltage regulator 310, the switch controller 380, the switching regulator controller 350, and/or the discrete-level controller 390 according to the determined tracking mode.

The main controller 360 may receive various signals (e.g., various control signals such as an output voltage level signal or the like) other than the tracking mode determination signal from the modem 100 through the MIPI (130 of FIG. 1) and control components such as the multiple output voltage regulator 310, the switch controller 380, the switching regulator controller 350, and the discrete-level controller 390 based on the received various signals.

For reference, in FIG. 13, the main controller 360 is shown as controlling at least one of the multiple output voltage regulator 310, the switch controller 380, the switching regulator controller 350, and/or the discrete-level controller 390, but is not limited thereto. That is, the main controller 360 may control operations of components other than the above-stated components.

However, for convenience of explanation, in embodiments of the inventive concepts, a case where the main controller 360 controls at least one of the multiple output voltage regulator 310, the switch controller 380, the switching regulator controller 350, and/or the discrete-level controller 390 is described as an example.

As described above, as the supply modulator 300-2 has the above-described structures and characteristics, the circuit area and the manufacturing cost thereof may be reduced compared to the supply modulator 300-1 of FIG. 4. In addition, based on the structures and the characteristics, the supply modulator 300-2 may be driven in any one tracking mode of the DL-ET mode or the APT mode, and provide the output voltage VET_APT to the power amplifier PA.

Figure 14:
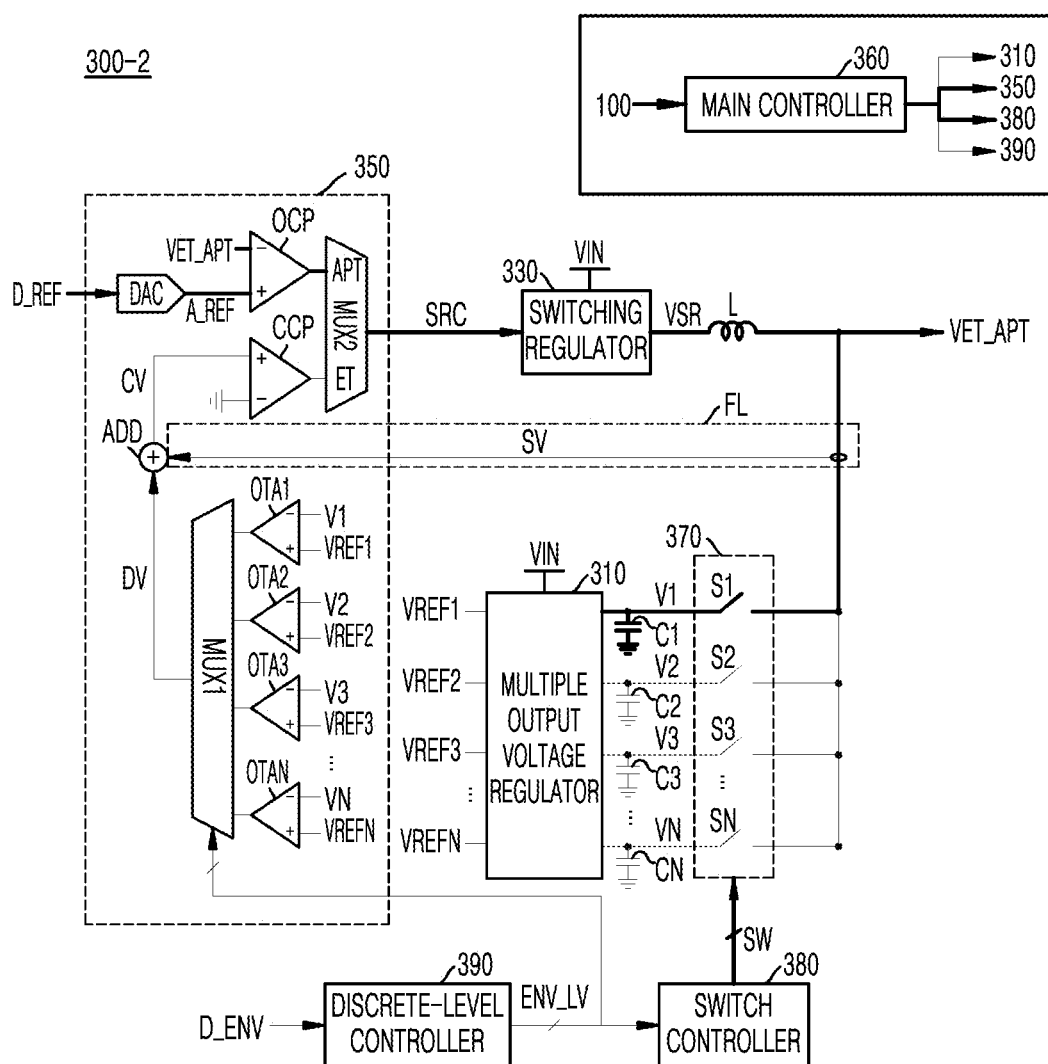
FIG. 14 is a diagram illustrating an APT mode operation of the supply modulator of FIG. 13.
Figure 15:
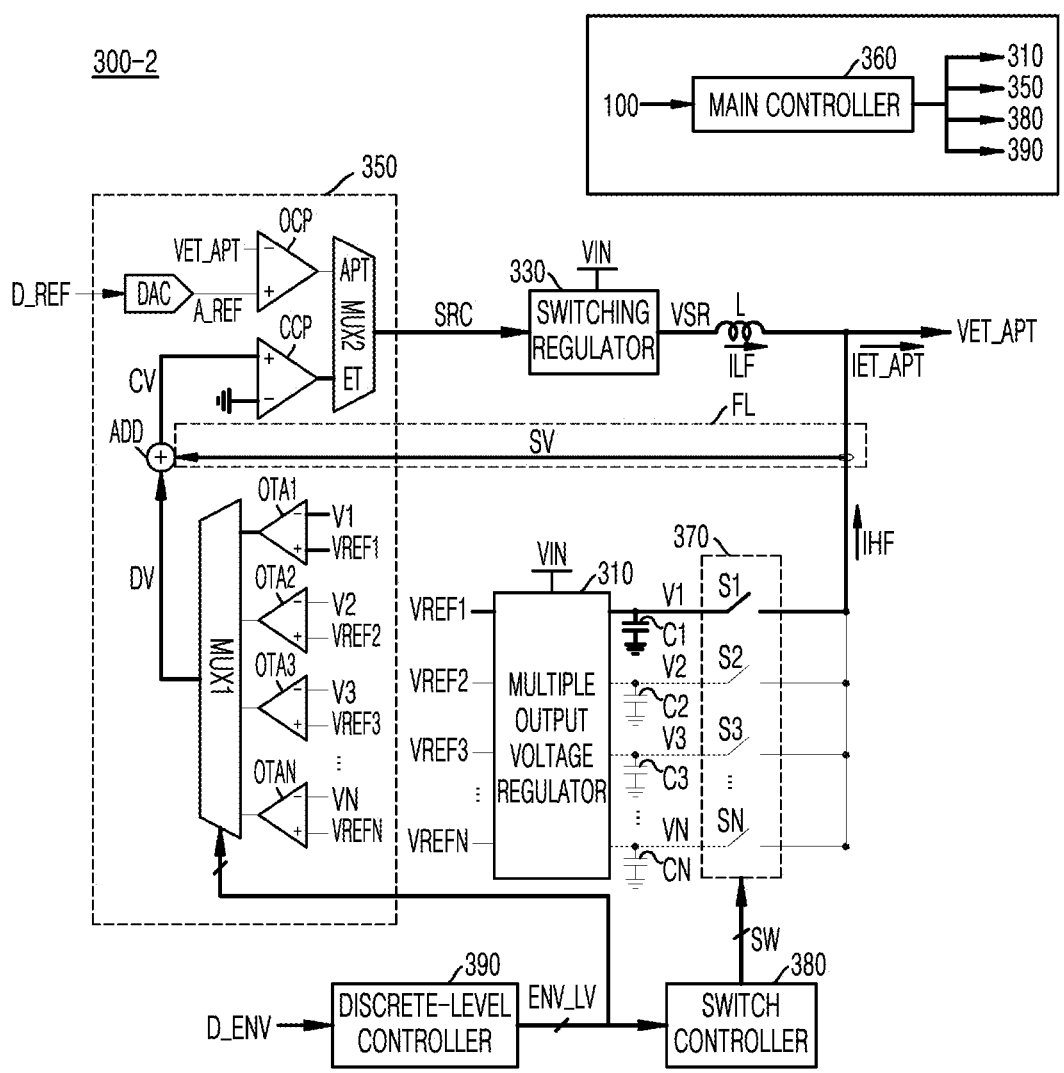
FIG. 15 is a diagram illustrating a DL-ET mode operation of the supply modulator of FIG. 13.

For reference, FIGS. 14 and 15 illustrate operation activation paths according to the APT mode and the DL-ET mode of the supply modulator 300-2 of FIG. 13, respectively.

However, as an operation of the supply modulator 300-2 in the APT mode of FIG. 14 is the same as, or similar to, the operation described in FIG. 10, and an operation of the supply modulator 300-2 in the DL-ET mode of FIG. 15 is the same as, or similar to, the operation described in FIG. 11, detailed descriptions thereof will be omitted.

As described above, as the supply modulator 300-2 operates according to the APT mode or the DL-ET mode based on the above-described principles, and hereinafter, referring to FIG. 16, a third example of a supply modulator according to embodiments of the inventive concepts will be described.

Figure 16:
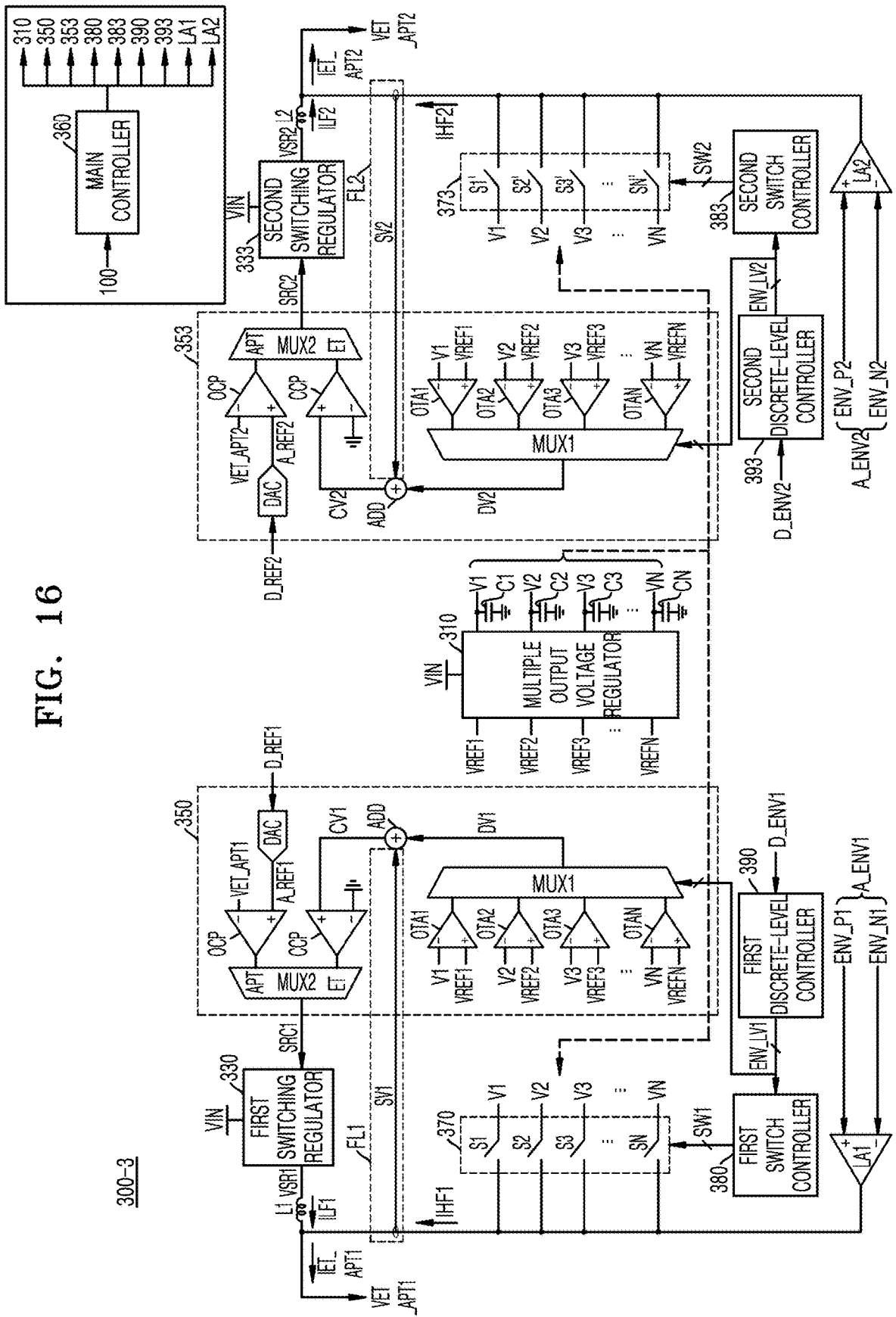
FIG. 16 is a circuit diagram illustrating a third example of a supply modulator included in a wireless communication apparatus according to embodiments of the inventive concepts.

FIG. 16 is a circuit diagram illustrating a third example of a supply modulator 300-3 included in a wireless communication apparatus according to embodiments of the inventive concepts.

For reference, hereinafter, for convenience of explanation, it is assumed that the supply modulator 300-3 is implemented as the supply modulator 300 of the wireless communication apparatus 1 shown in FIG. 1. In addition, as the supply modulator 300-3 and the supply modulator 300-1 of FIG. 4 are the same or similar except for some structures and mechanisms, differences thereof will be mainly described below.

Referring to FIG. 16, the third example of the supply modulator 300 (that is, the supply modulator 300-3) according to embodiments of the inventive concepts may include the multiple output voltage regulator 310, first and second switching regulators 330 and 333, first and second linear regulators LA1 and LA2, first and second switching regulator controllers 350 and 353, the main controller 360, first and second switch arrays 370 and 373, first and second switch controllers 380 and 383, first and second discrete-level controllers 390 and 393. According to embodiments, the first and second switching regulator controllers 350 and 353 may each be the same as or similar to the switching regulator controller 350 discussed in association with FIG. 4.

In detail, the supply modulator 300-3 of FIG. 16 may respectively supply first and second output voltages VET_APT1 and VET_APT2 to a plurality of power amplifiers (when there are power amplifiers PA of FIG. 1; e.g., first and second power amplifiers).

Accordingly, in the case of the supply modulator 300-3 of FIG. 16, compared to the supply modulator 300-1 of FIG. 1, the number of each of the switching regulators, linear regulators, switching regulator controllers, switch arrays, switch controllers, and discrete-level controllers may be greater than one.

In addition, as the supply modulator 300-3 of FIG. 16 receives more signals than the supply modulator 300-1 of FIG. 4, the supply modulator 300-3 may receive first and second average power signal D_REF1 and D_REF2, first and second analog envelope signals A_ENV1 and A_ENV2, and first and second digital envelope signals D_ENV1 and D_ENV2 from the modem (100 of FIG. 1).

Also, in the supply modulator 300-3 of FIG. 16, as the plurality of capacitors C1 to CN of the multiple output voltage regulator 310 are connected to both sides of the first and second power amplifiers, the plurality of capacitors C1 to CN of the multiple output voltage regulator 310 may be shared for generation operations of each of the first and second output voltages VET_APT1 and VET_APT2. Accordingly, the main controller 360 may commonly generate the plurality of reference output voltage signals VREF1 to VREFN for each of the first and second output voltages VET_APT1 and VET_APT2 and provide the same to the multiple output voltage regulator 310 and the first and second switching regulator controllers 350 and 353.

As described above, in embodiments of the inventive concepts, even in a case of generating a plurality of power supply voltages for power amplifiers, as the number of output capacitors occupying a large proportion of the circuit area is the same as, or similar to, a case of generating a power supply voltage for a single power amplifier, an increase in circuit area may be minimized or reduced.

For convenience of explanation, it is assumed that the first linear regulator LA1, the first switching regulator 330, the first switching regulator controller 350, the first switch array 370, the first discrete-level controller 390, and the first switch controller 380 forms a first modulation circuit, and the second linear regulator LA2, the second switching regulator 333, the second switching regulator controller 353, the second switch array 373, the second discrete-level controller 393, and the second switch controller 383 forms a second modulation circuit, and a brief description of each component of the supply modulator 300-3 is as follows.

The first modulation circuit may include the first linear regulator LA1 and the first switching regulator 330, wherein the first linear regulator LA1 operates to generate the first output voltage VET_APT1 based on the first analog envelope signal A_ENV1 received from the modem (100 of FIG. 1) in the CL-ET mode, and the first switching regulator 330 operates together with the multiple output voltage regulator 310 to generate the first output voltage VET_APT1 in the DL-ET mode, operates together with the first linear regulator LA1 to generate the first output voltage VET_APT1 in the CL-ET mode, and operates to generate the first output voltage VET_APT1 in the APT mode. In addition, the first modulation circuit may include the first switching regulator controller 350 selectively sensing any one output current IHF1 of an output current of the multiple output voltage regulator 310 and an output current of the first linear regulator LA1 and controlling the first switching regulator 330 based on a sensing value SV1. Also, the first modulation circuit may include the first switch array 370 including the plurality of switches S1 to SN respectively corresponding to the plurality of voltages V1 to VN having different levels from each other output from the multiple output voltage regulator 310 and selecting and providing one of the plurality of voltages V1 to VN having different levels from each other to the first power amplifier. In addition, the first modulation circuit may include the first discrete-level controller 390 generating a first level control signal ENV_LV1 including multiple pieces of envelope level information based on the first digital envelope signal D_ENV1 provided from the modem (100 of FIG. 1), and the first switch controller 380 receiving the first level control signal ENV_LV1 from the first discrete-level controller 390 and controlling the switching operations of the plurality of switches S1 to SN based on the first level control signal ENV_LV1 received from the first discrete-level controller 390.

The second modulation circuit may include the second linear regulator LA2 and the second switching regulator 333, wherein the second linear regulator LA2 operates to generate the second output voltage VET_APT2 based on the second analog envelope signal A_ENV2 received from the modem (100 of FIG. 1) in the CL-ET mode, and the second switching regulator 333 operates together with the multiple output voltage regulator 310 to generate the second output voltage VET_APT2 in the DL-ET mode, operates together with the second linear regulator LA2 to generate the second output voltage VET_APT2 in the CL-ET mode, and operates to generate the second output voltage VET_APT2 in the APT mode. In addition, the second modulation circuit may include the second switching regulator controller 353 selectively sensing any one output current IHF2 of an output current of the multiple output voltage regulator 310 and an output current of the second linear regulator LA2 and controlling the second switching regulator 333 based on a sensing value SV2. Also, the second modulation circuit may include the second switch array 373 including a plurality of switches S1' to SN' respectively corresponding to the plurality of voltages V1 to VN having different levels from each other output from the multiple output voltage regulator 310 and selecting and providing one of the plurality of voltages V1 to VN having different levels from each other to the second power amplifier. In addition, the second modulation circuit may include the second discrete-level controller 393 generating a second level control signal ENV_LV2 including multiple pieces of envelope level information based on the second digital envelope signal D_ENV2 provided from the modem 100, and the second switch controller 383 receiving the second level control signal ENV_LV2 from the second discrete-level controller 393 and controlling switching operations of the plurality of switches S1' to SN' based on the second level control signal ENV_LV2 received from the second discrete-level controller 393.

The multiple output voltage regulator 310 may output the plurality of voltages V1 to VN having different levels from each other to respectively correspond the plurality of reference output voltage signals VREF1 to VREFN so as to generate the first or second output voltage VET_APT1 or VET_APT2 in the DL-ET mode. That is, the multiple output voltage regulator 310 may operate in parallel with a switching regulator operating in the DL-ET mode from among the first and second switching regulators 330 and 333.

The main controller 360 may generate the plurality of reference output voltage signals VREF1 to VREFN and provide the same to at least one of the multiple output voltage regulator 310 and/or the first and second switching regulator controllers 350 and 353. Also, the main controller 360 may determine a tracking mode for each of the first and second power amplifiers. That is, the main controller 360 may determine a different tracking mode for each of the first and second power amplifiers, or may determine the same tracking mode or similar tracking modes for each of the first and second power amplifiers. In addition, the main controller 360 may control at least one of the first and second linear regulators LA1 and LA2, the first and second switch controllers 380 and 383, the first and second switching regulator controllers 350 and 353, the first and second discrete-level controllers 390 and 393, and/or the multiple output voltage regulator 310 based on the determined tracking mode.

Each component may include a component-dedicated controller (e.g., the first and second switching regulator controller 350 and 353) therein or outside, and each dedicated controller may be controlled by the main controller 360. In addition, there may be a controller that integrates and controls at least two components, and the corresponding controller may be controlled by the main controller 360.

As described above, based on the above-described structures and characteristics, the supply modulator 300-3 may be driven in at least one tracking mode of the DL-ET mode, the CL-ET mode, and/or the APT mode to respectively provide the first and second output voltages VET_APT1 and VET_APT2 to the first and second power amplifiers on the same principles as that, or similar principles to those, of the supply modulator 300-1 of FIG. 4.

Fore reference, the supply modulator 300-3 is shown as including components that are bilaterally symmetrical with respect to the multiple output voltage regulator 310. However, the supply modulator 300-3 of FIG. 16 may include components that are bilaterally asymmetrical with respect to the multiple output voltage regulator 310. For example, each of a linear regulator, a switching regulator, a switching regulator controller, a switch array, a switch controller, and a discrete-level controller, or the like may be provided by two on the left side of the drawing, but as shown on the right side of the drawing, each of a linear regulator, a switching regulator, a switching regulator controller, a switch array, a switch controller, and a discrete-level controller, or the like may be provided by one. However, for convenience of explanation, a case where the supply modulator 300-3 includes components that are bilaterally symmetrical with respect to the multiple output voltage regulator 310 will be described as an example.

Figure 17:
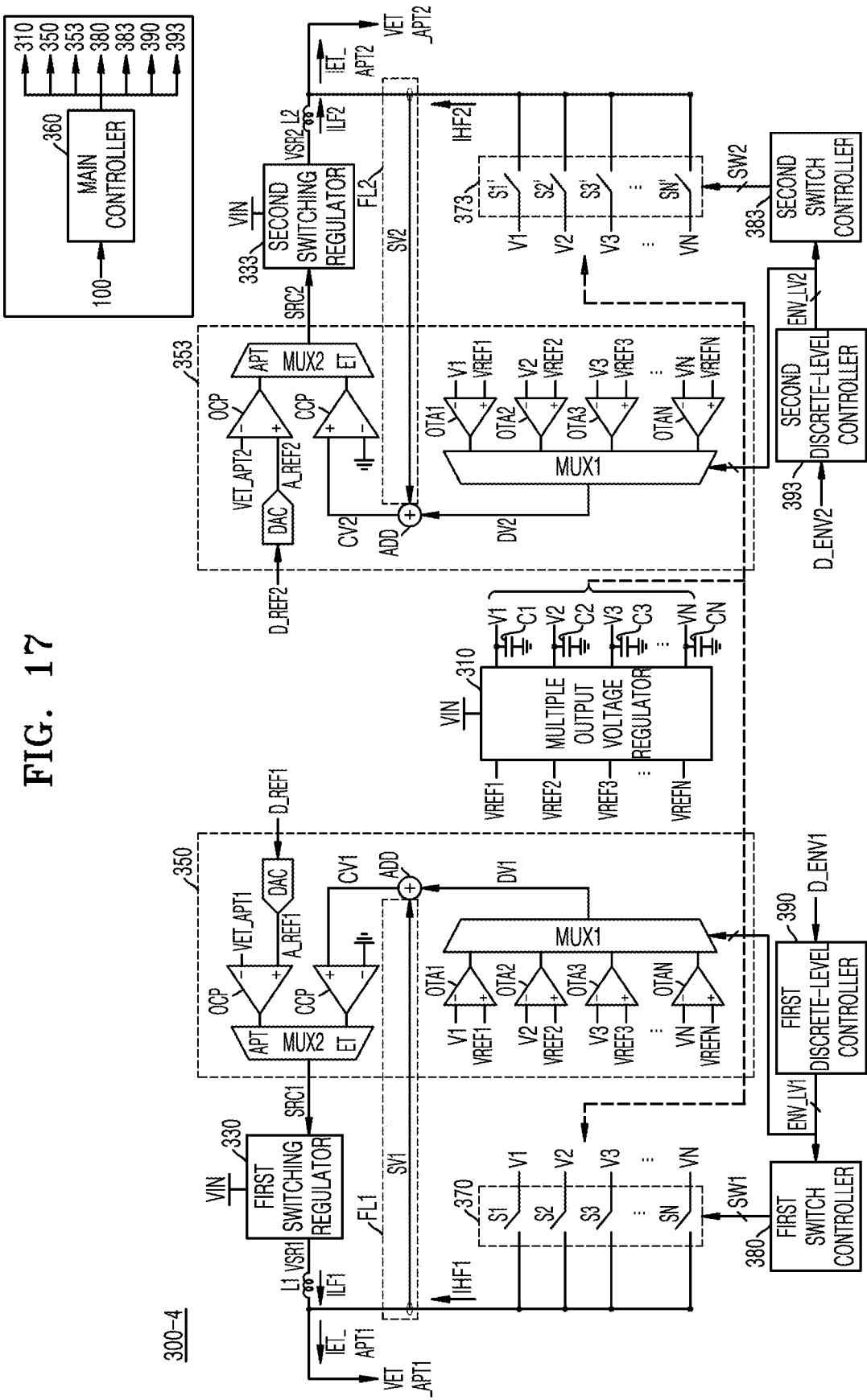
FIG. 17 is a circuit diagram illustrating a fourth example of a supply modulator included in a wireless communication apparatus according to embodiments of the inventive concepts.

FIG. 17 is a circuit diagram illustrating a fourth example of a supply modulator 300-4 included in a wireless communication apparatus according to embodiments of the inventive concepts.

For reference, hereinafter, for convenience of explanation, it is assumed that the supply modulator 300-4 is implemented as the supply modulator 300 of the wireless communication apparatus 1 shown in FIG. 1. In addition, as the supply modulator 300-4 and the supply modulator 300-2 of FIG. 13 are the same or similar except for some structures and mechanisms, differences thereof will be mainly described below.

Referring to FIG. 17, the fourth example of the supply modulator 300 (that is, the supply modulator 300-4) according to embodiments of the inventive concepts may include the multiple output voltage regulator 310, the first and second switching regulators 330 and 333, the first and second switching regulator controllers 350 and 353, the main controller 360, the first and second switch arrays 370 and 373, the first and second switch controllers 380 and 383, and/or the first and second discrete-level controllers 390 and 393.

In detail, the supply modulator 300-4 of FIG. 17 may respectively supply the first and second output voltages VET_APT1 and VET_APT2 to a plurality of power amplifiers (when there are power amplifiers PA of FIG. 1; e.g., first and second power amplifiers).

Accordingly, in the case of the supply modulator 300-4 of FIG. 14, compared to the supply modulator 300-2 of FIG. 13, the number of each of the switching regulators, switching regulator controllers, switch arrays, switch controllers, and discrete-level controllers may be greater than one.

In addition, as the supply modulator 300-4 of FIG. 17 receives more signals than the supply modulator 300-2 of FIG. 13, the supply modulator 300-4 may receive the first and second average power signal D_REF1 and D_REF2, the first and second analog envelope signals A_ENV1 and A_ENV2, and the first and second digital envelope signals D_ENV1 and D_ENV2 from the modem (100 of FIG. 1).

Also, in the supply modulator 300-4 of FIG. 17, as the plurality of capacitors C1 to CN of the multiple output voltage regulator 310 are connected to both sides of the first and second power amplifiers, the plurality of capacitors C1 to CN of the multiple output voltage regulator 310 may be shared for generation operations of each of the first and second output voltages VET_APT1 and VET_APT2. Accordingly, the main controller 360 may commonly generate the plurality of reference output voltage signals VREF1 to VREFN for each of the first and second output voltages VET_APT1 and VET_APT2 and provide the same to the multiple output voltage regulator 310 and the first and second switching regulator controllers 350 and 353.

As described above, in embodiments of the inventive concepts, even in a case of generating a plurality of power supply voltages for power amplifiers, as the number of output capacitors occupying a large proportion of the circuit area is the same as or similar to a case of generating a power supply voltage for a single power amplifier, an increase in circuit area may be minimized or reduced.

For convenience of explanation, it is assumed that the first switching regulator 330, the first switching regulator controller 350, the first switch array 370, the first discrete-level controller 390, the first switch controller 380 form a first modulation circuit, and the second switching regulator 333, the second switching regulator controller 353, the second switch array 373, the second discrete-level controller 393, and the second switch controller 383 form a second modulation circuit, and a brief description of each component of the supply modulator 300-4 is as follows.

The first modulation circuit may include the first switching regulator 330 operating together with the multiple output voltage regulator 310 to generate the first output voltage VET_APT1 in the DL-ET mode and operating to generate the first output voltage VET_APT1 in the APT mode. In addition, the first modulation circuit may include first switching regulator controller 350 and the first switch array 370, wherein the first switching regulator controller 350 senses an output current of the multiple output voltage regulator 310 and controls the first switching regulator 330 based on the sensing value SV1, and the first switch array 370 includes the plurality of switches S1 to SN respectively corresponding to the plurality of voltages V1 to VN having different levels from each other output from the multiple output voltage regulator 310 and selects and provides one of the plurality of voltages V1 to VN having different levels from each other to the first power amplifier. In addition, the first modulation circuit may include the first discrete-level controller 390 generating the first level control signal ENV_LV1 including multiple pieces of envelope level information based on the first digital envelope signal D_ENV1 provided from the modem (100 of FIG. 1), and the first switch controller 380 receiving the first level control signal ENV_LV1 from the first discrete-level controller 390 and controlling the switching operations of the plurality of switches S1 to SN based on the first level control signal ENV_LV1 received from the first discrete-level controller 390.

The second modulation circuit may include the second switching regulator 333 operating together with the multiple output voltage regulator 310 to generate the second output voltage VET_APT2 in the DL-ET mode and operating to generate the second output voltage VET_APT2 in the APT mode. In addition, the second modulation circuit may include second switching regulator controller 353 and the second switch array 373, wherein the second switching regulator controller 353 senses an output current of the multiple output voltage regulator 310 and controls the second switching regulator 333 based on the sensing value SV2, and the second switch array 373 includes the plurality of switches S1' to SN' respectively corresponding to the plurality of voltages V1 to VN having different levels from each other output from the multiple output voltage regulator 310 and selects and provides one of the plurality of voltages V1 to VN having different levels from each other to the second power amplifier. In addition, the second modulation circuit may include the second discrete-level controller 393 generating the second level control signal ENV_LV2 including multiple pieces of envelope level information based on the second digital envelope signal D_ENV2 provided from the modem (100 of FIG. 1), and the second switch controller 383 receiving the second level control signal ENV_LV2 from the second discrete-level controller 393 and controlling switching operations of the plurality of switches S1' to SN' based on the second level control signal ENV_LV2 received from the second discrete-level controller 393.

The multiple output voltage regulator 310 may output the plurality of voltages V1 to VN having different levels from each other to respectively correspond the plurality of reference output voltage signals VREF1 to VREFN so as to generate the first or second output voltage VET_APT1 or VET_APT2 in the DL-ET mode. That is, the multiple output voltage regulator 310 may operate in parallel with a switching regulator operating in the DL-ET mode from among the first and second switching regulators 330 and 333.

The main controller 360 may generate the plurality of reference output voltage signals VREF1 to VREFN and provide the same to at least one of the multiple output voltage regulator 310 and/or the first and second switching regulator controllers 350 and 353. Also, the main controller 360 may determine a tracking mode for each of the first and second power amplifiers. That is, the main controller 360 may determine different tracking modes for each of the first and second power amplifiers, or may determine the same tracking mode or similar tracking modes for each of the first and second power amplifiers. In addition, the main controller 360 may control at least one of the first and second switch controllers 380 and 383, the first and second switching regulator controllers 350 and 353, the first and second discrete-level controllers 390 and 393, and/or the multiple output voltage regulator 310 based on the determined tracking mode.

Each component may include a component-dedicated controller (e.g., the first and second switching regulator controller 350 and 353) therein or outside, and each dedicated controller may be controlled by the main controller 360. In addition, there may be a controller that integrates and controls at least two components, and the corresponding controller may be controlled by the main controller 360.

As described above, based on the above-described structures and characteristics, the supply modulator 300-4 may be driven in at least one tracking mode of the DL-ET mode and/or the APT mode to respectively provide the first and second output voltages VET_APT1 and VET_APT2 to the first and second power amplifiers on the same principles as that, or similar principles to those, of the supply modulator 300-2 of FIG. 13.

For reference, the supply modulator 300-4 is shown as including components that are bilaterally symmetrical with respect to the multiple output voltage regulator 310. However, the supply modulator 300-4 of FIG. 17 may include components that are bilaterally asymmetrical with respect to the multiple output voltage regulator 310. For example, a linear regulator may not be provided on the left side of the drawing as shown, but a linear regulator may be additionally provided on the right side of the drawing. However, for convenience of explanation, a case where the supply modulator 300-4 includes components that are bilaterally symmetrical with respect to the multiple output voltage regulator 310 will be described as an example.

As described above, as the supply modulator 300-4 is driven in at least one tracking mode of the DL-ET mode, the CL-ET mode, and/or the APT mode based on the above-described principles, hereinafter, referring to FIG. 18, a fifth example of a supply modulator according to embodiments of the inventive concepts will be described.

Figure 18:
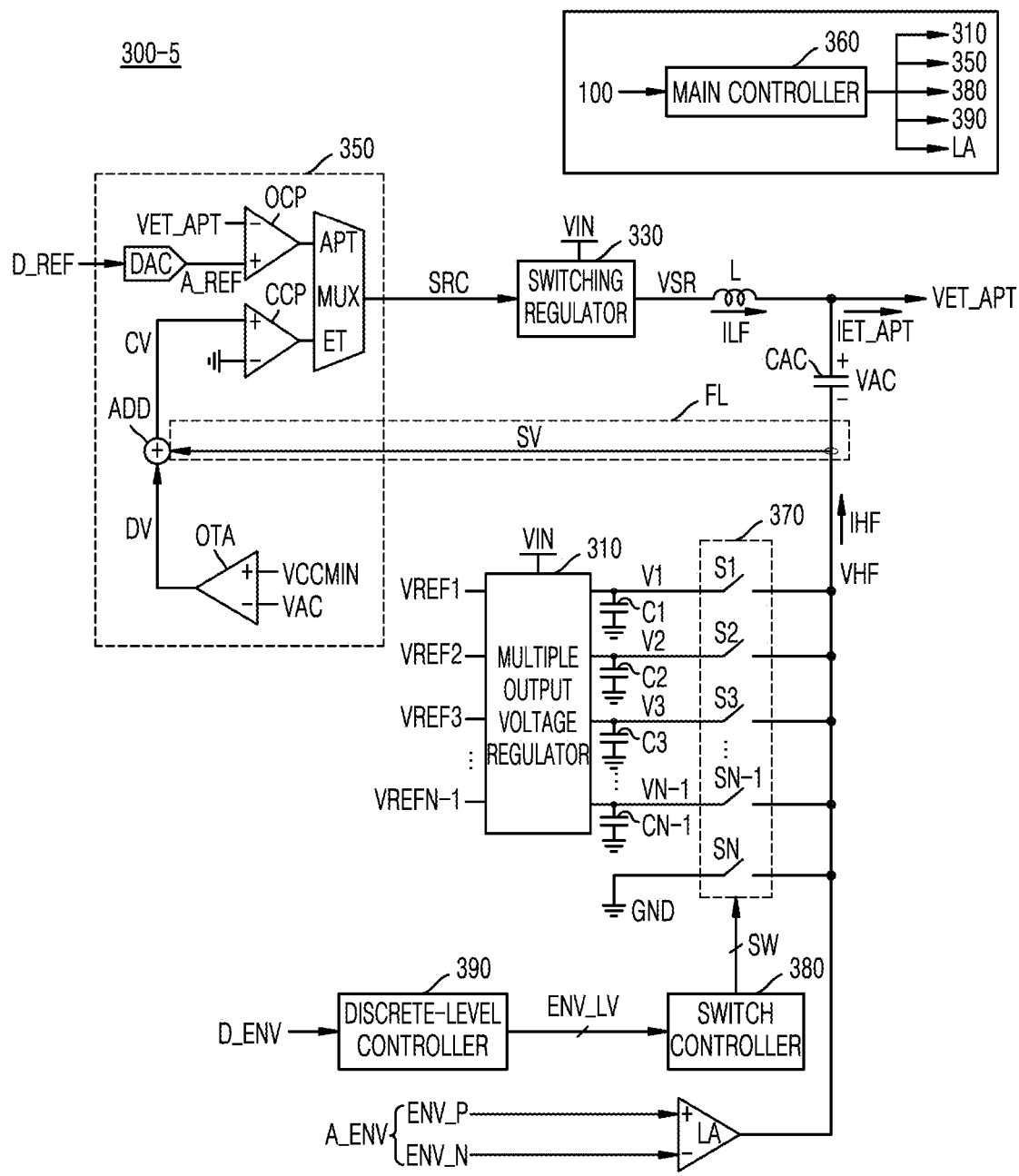
FIG. 18 is a circuit diagram illustrating a fifth example of a supply modulator included in a wireless communication apparatus according to embodiments of the inventive concepts.
Figure 19:
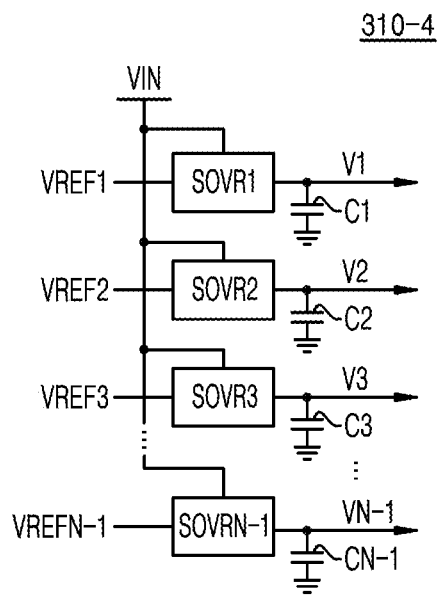
FIG. 19 is a diagram illustrating an example of a multiple output voltage regulator of FIG. 18.
Figure 20:
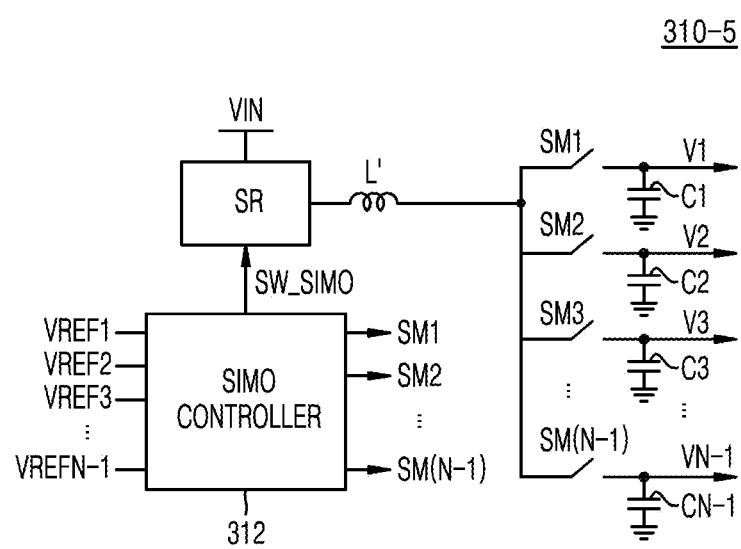
FIG. 20 is a diagram illustrating another example of the multiple output voltage regulator of FIG. 18.
Figure 21:
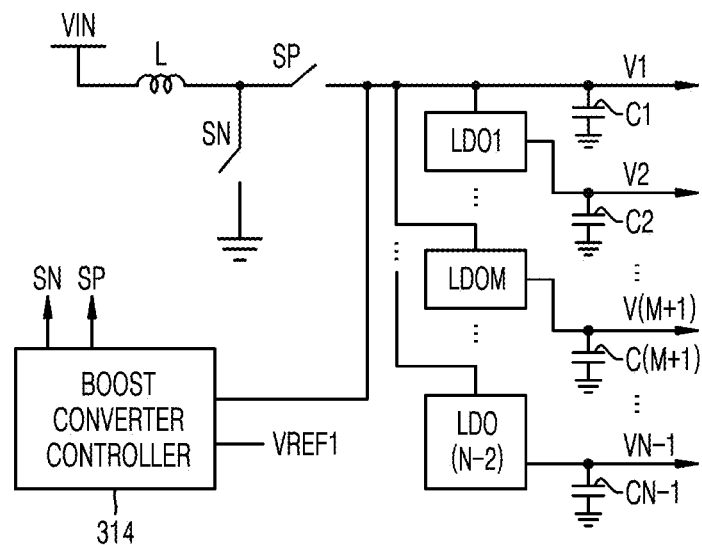
FIG. 21 is a diagram illustrating another example of the multiple output voltage regulator of FIG. 18.
Figure 22:
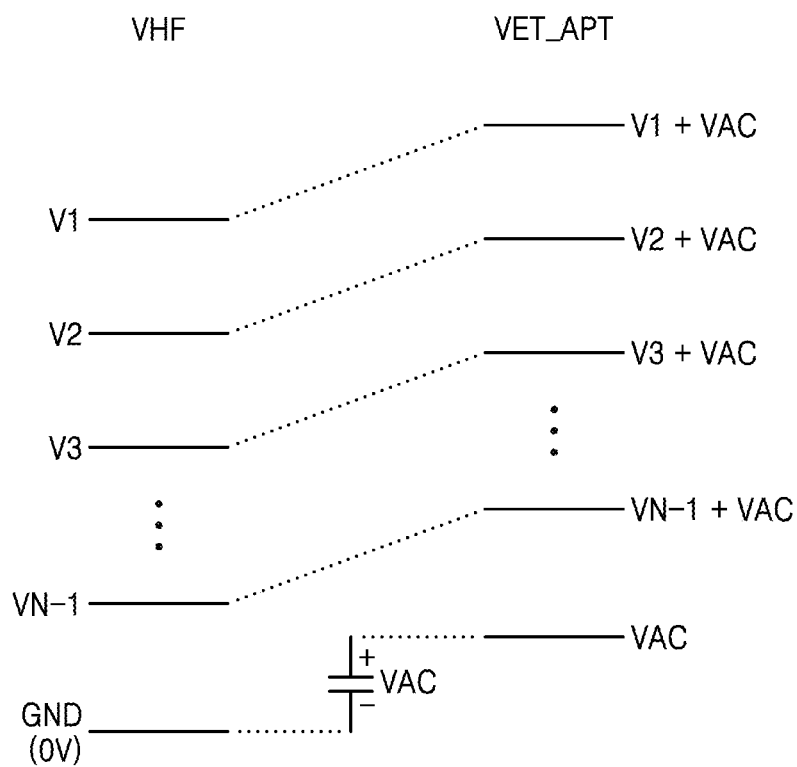
FIG. 22 is a diagram illustrating a mechanism of boosting output voltages of a multiple output voltage regulator by a coupling capacitor.
Figure 23:
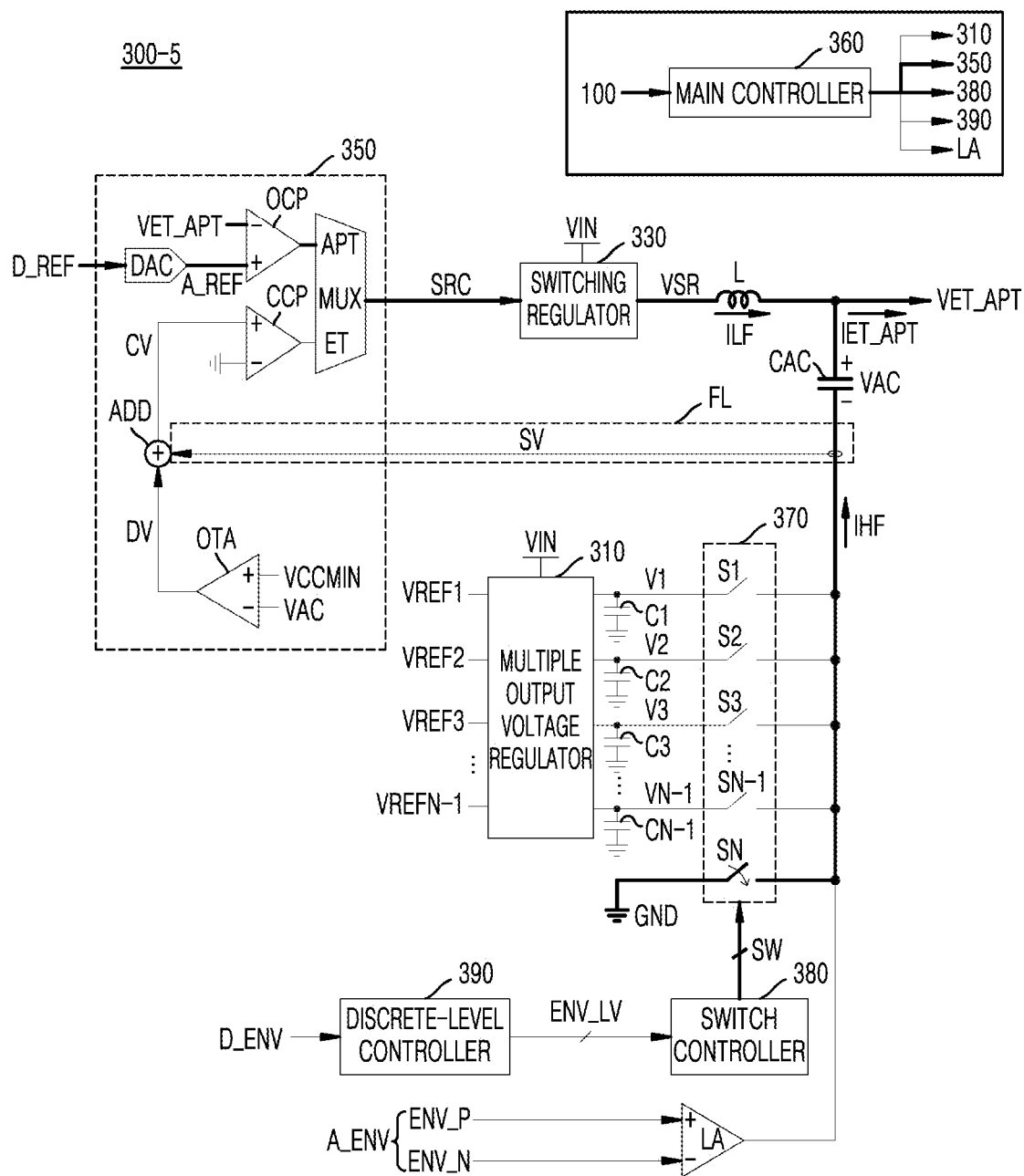
FIG. 23 is a diagram illustrating an APT mode operation of the supply modulator of FIG. 18.
Figure 24:
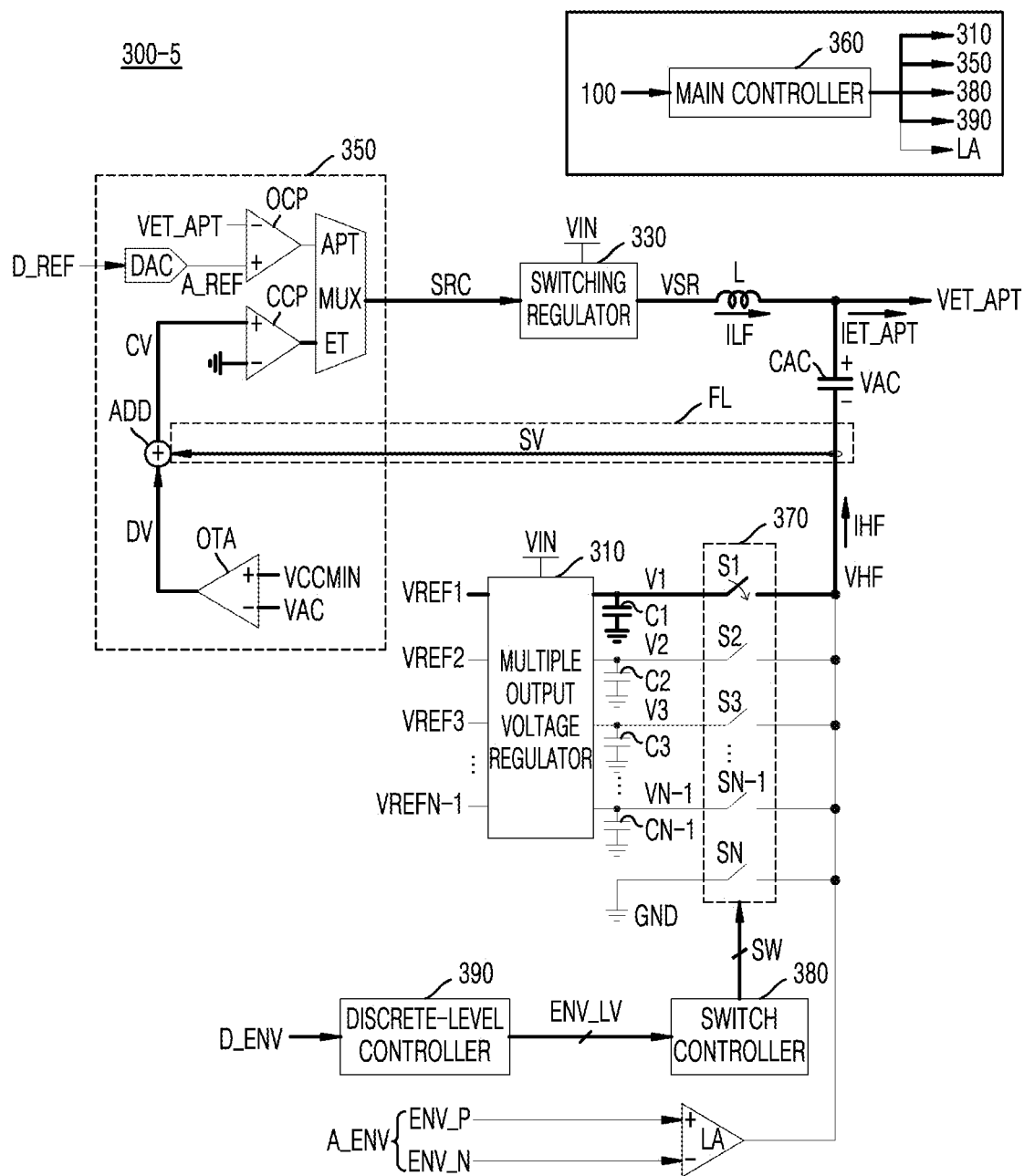
FIG. 24 is a diagram illustrating a DL-ET mode operation of the supply modulator of FIG. 18.
Figure 25:
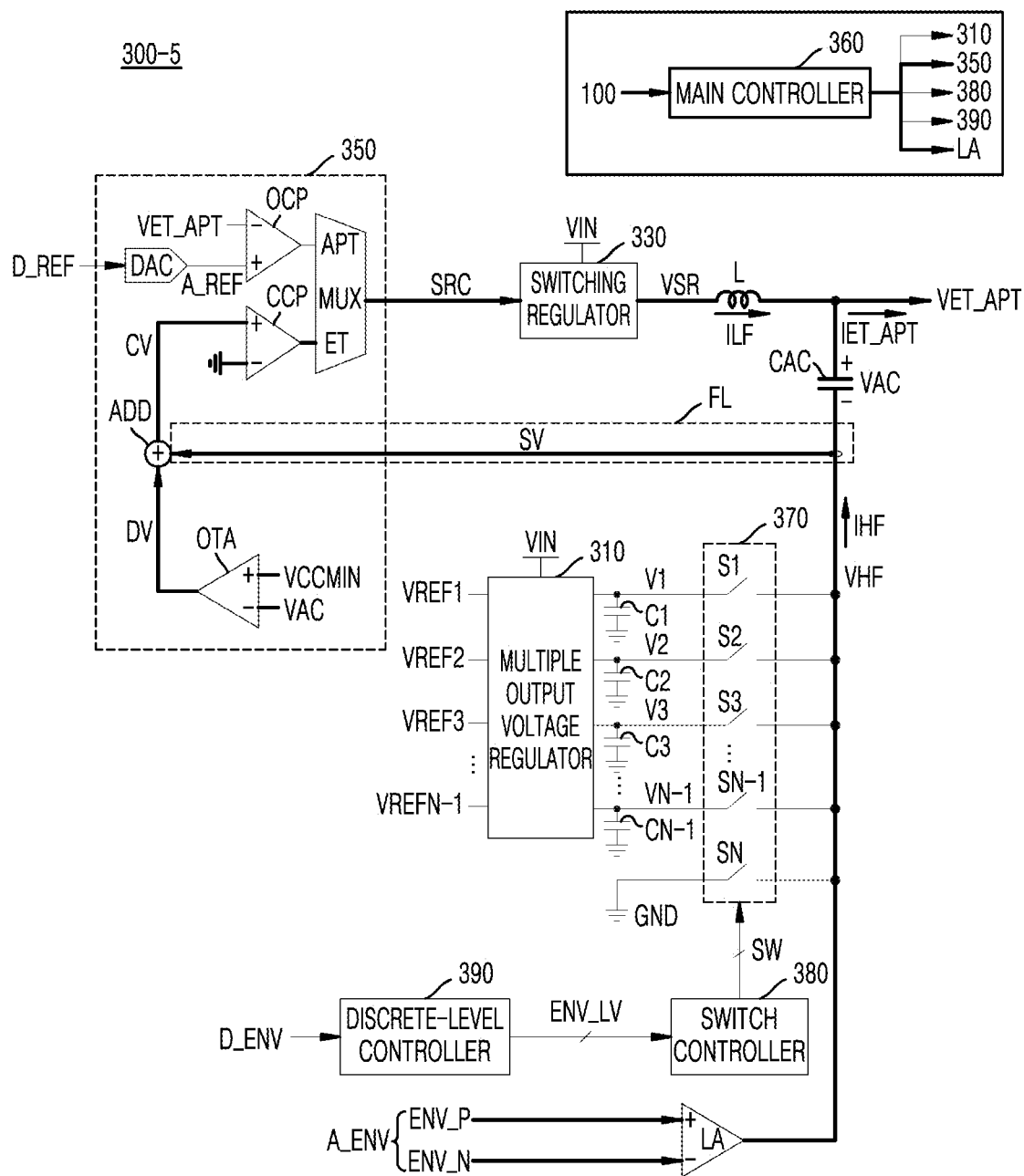
FIG. 25 is a diagram illustrating a CL-ET mode operation of the supply modulator of FIG. 18.

FIG. 18 is a circuit diagram illustrating a fifth example of a supply modulator 300-5 included in a wireless communication apparatus according to embodiments of the inventive concepts. FIG. 19 is a diagram illustrating an example of the multiple output voltage regulator 310 of FIG. 18. FIG. 20 is a diagram illustrating another example of the multiple output voltage regulator 310 of FIG. 18. FIG. 21 is a diagram illustrating another example of the multiple output voltage regulator 310 of FIG. 18. FIG. 22 is a diagram illustrating a mechanism of increasing an output voltage of a multiple output voltage regulator by a coupling capacitor. FIG. 23 is a diagram illustrating an APT mode operation of the supply modulator 300-5 of FIG. 18. FIG. 24 is a diagram illustrating a DL-ET mode operation of the supply modulator 300-5 of FIG. 18. FIG. 25 is a diagram illustrating a CL-ET mode operation of the supply modulator 300-5 of FIG. 18.

For reference, hereinafter, for convenience of explanation, it is assumed that the supply modulator 300-5 is implemented as the supply modulator 300 of the wireless communication apparatus 1 shown in FIG. 1. Also, FIG. 18 will be described with reference to FIG. 1.

Referring to FIG. 18, the fifth example of the supply modulator 300 (that is, the supply modulator 300-5) according to embodiments of the inventive concepts may include the multiple output voltage regulator 310, the switching regulator 330, the linear regulator LA, the switching regulator controller 350, the main controller 360, the switch array 370, the switch controller 380, the discrete-level controller 390, and/or a coupling capacitor CAC.

For reference, each component may include a component-dedicated controller (e.g., the switching regulator controller 350) therein or outside, and each dedicated controller may be controlled by the main controller 360. In addition, there may be a controller that integrates and controls at least two components, and the corresponding controller may be controlled by the main controller 360.

However, for convenience of explanation, only the dedicated controllers of some components will be described in detail below.

To generate the output voltage VET_APT together with the switching regulator 330 in the DL-ET mode, the multiple output voltage regulator 310 may output a plurality of voltages V1 to VN−1 (wherein N is a natural number of two or more) having different levels from each other to respectively correspond a plurality of reference output voltage signals VREF1 to VREFN−1 (wherein N is a natural number of two or more). In addition, the multiple output voltage regulator 310 may be controlled by the main controller 360.

That is, as the multiple output voltage regulator 310 is connected in parallel with the switching regulator 330, the multiple output voltage regulator 310 may generate the output voltage VET_APT by operating in parallel with the switching regulator 330 in the DL-ET mode. In addition, the multiple output voltage regulator 310 may generate and output the plurality of voltages V1 to VN−1 having different levels from each other by boosting or reducing an input voltage (e.g., the power supply VIN provided from a battery or the like) based on the plurality of reference output voltage signals VREF1 to VREFN−1.

Herein, the plurality of reference output voltage signals VREF1 to VREFN−1 may be received from the main controller 360. For reference, the modem 100 may calculate reference output voltage values based on output power of the power amplifier PA and provide the calculated reference output voltage values to the main controller 360. Also, the main controller 360 may generate, based on the received reference output voltage values, the plurality of reference output voltage signals VREF1 to VREFN−1 and provide the same to the multiple output voltage regulator 310.

In addition, the connection between the multiple output voltage regulator 310 and the power amplifier PA may be selectively opened and closed by the switch array 370. That is, through the switching operation of the switch array 370, at least one voltage from among the plurality of voltages V1 to VN−1 (e.g., V1 to VN−1 are generated and output in a time-division method) having different levels from each other generated and output from the multiple output voltage regulator 310 may be selected. Also, the selected voltage may be added to a voltage VAC of the coupling capacitor CAC to be described below to be provided to the power amplifier PA.

In addition, the output end of the multiple output voltage regulator 310 may include a plurality of capacitors C1 to CN−1 (wherein N is a natural number of two or more) respectively corresponding to the plurality of voltages V1 to VN−1 having different levels from each other. In addition, connections of the plurality of capacitors C1 to CN−1 and the power amplifier PA may be individually opened or closed by a plurality of switches S1 to SN−1 (wherein N is a natural number of two or more, and SN is grounded (or connected to a ground voltage GND) in the switch array 370. The plurality of capacitors C1 to CN−1 may be provided outside the multiple output voltage regulator 310 instead of the inside. However, for convenience of explanation, in embodiments of the inventive concepts, a case where the plurality of capacitors C1 to CN−1 are included in the multiple output voltage regulator 310 will be described as an example.

Referring to FIGS. 19 to 21, various implementation examples of the multiple output voltage regulator 310 (that is, the multiple output voltage regulators 310-4 to 310-6) are shown.

First, referring to FIG. 19, the multiple output voltage regulator 310-4 may include, for example, a plurality of single output voltage regulators SOVR1 to SOVRN−1 (wherein N is a natural number of two or more) respectively outputting the plurality of voltages V1 to VN−1 having different levels from each other.

Herein, the plurality of single output voltage regulators SOVR1 to SOVRN−1 may include, for example, a switching regulator such as a buck converter and a boost converter, or may include a switched-capacitor DC-DC converter, an LDO, or the like.

Also, in the plurality of single output voltage regulators SOVR1 to SOVRN−1, there may be a controller for each single output voltage regulator may individually, or there may be one common controller.

Then, referring to FIG. 20, the multiple output voltage regulator 310-5 may include, for example, a SIMO DC-DC converter or a SIMO buck-boost converter.

In detail, the multiple output voltage regulator 310-5 of FIG. 20 may be a structure supplying an output current of an SR in the SIMO DC-DC converter or a SIMO buck-boost converter to each output end through a single inductor L' in the time-division method.

Also, the SIMO controller 312 may monitor a difference between each of the plurality of output voltages V1 to VN−1 and each of the plurality of reference output voltage signals VREF1 to VREFN−1 corresponding thereto, and may determine a switch from among switches SM1, SM2, . . . , SM(N−1) connected to the inductor L' and each of the plurality of output voltages V1 to VN−1 to be turned on based on the monitoring result. In addition, at the same time or contemporaneously, the SIMO controller 312 may determine the switching input SW_SIMO of an SR connected to one side of the inductor L' based on difference information between each of the plurality of output voltages V1 to VN−1 and each of the plurality of reference output voltage signals VREF1 to VREFN−1 corresponding thereto.

For reference, in embodiments of the inventive concepts, because the magnitude of the output current IHF of the multiple output voltage regulator 310 is not large (that is, most of output currents IET_APT are supplied through the switching regulator 330 (e.g., ILF)), the multiple output voltage regulator 310 is suitable for applying the SIMO DC-DC converter or the SIMO buck-boost converter supplying an output in the time-division method. Also, the SIMO DC-DC converter may operate in both of a buck mode and a buck-boost mode.

Last, referring to FIG. 21, the multiple output voltage regulator 310-6 may include, for example, a boost converter (a converter including VIN, L, SN, SP) generating a voltage (e.g., V1) having the highest level from among the plurality of voltages V1 to VN−1 having different voltages from each other, and a plurality of LDOs LDO1 to LDO(N−2) (wherein N is a natural number of two or more) generating the remaining voltages V2 to VN−1 from among the plurality of voltages V1 to VN−1 having different levels from each other by using the voltage having the highest level generated by the boost converter as an input.

Also, a boost converter controller 314 may monitor a difference between the output voltage V1 (e.g., the voltage having the highest level) of the boost converter and the reference output voltage signal VREF1 corresponding thereto, and determine a switch from among switches SN and SP to be turned on based on the monitoring result.

As described above, the multiple output voltage regulator 310 may be implemented in various forms. The multiple output voltage regulator 310 may include a structure different from the above-described structure, a detailed description thereof will be omitted.

Referring back to FIG. 18, the linear regulator LA may, in the CL-ET mode, operate to generate the output voltage VET_APT based on the analog envelope signal A_ENV received from the outside. In addition, the linear regulator LA may be controlled by the main controller 360.

In detail, the linear regulator LA may receive the analog envelope signal A_ENV from the modem 100 and may amplify and output the analog envelope signal A_ENV. Accordingly, the linear regulator LA may operate, in the CL-ET mode, in parallel with the switching regulator 330 to generate the output voltage VET_APT.

Also, although not illustrated in FIG. 18, the linear regulator LA may receive an input voltage (e.g., a power supply provided from a battery or the like) as a power supply voltage or may receive a power supply voltage from a separate voltage regulator. In addition, the linear regulator LA may receive any one voltage from among the plurality of voltages V1 to VN−1 having different levels from each other output from the multiple output voltage regulator 310 as a power supply voltage.

Also, the linear regulator LA may be connected in parallel with the switching regulator 330 and, may be implemented as, for example, a linear amplifier. In addition, as shown in FIG. 18, the linear regulator LA may be implemented as a differential amplifier, and may receive the positive signal ENV_P and the negative signal ENV_N of the analog envelope signal A_ENV respectively through the positive terminal + and the negative terminal −.

Also, although not illustrated in FIG. 18, as an output of the linear regulator LA is fed back to the negative terminal − of the linear regulator LA through a feedback unit (not shown), an output level of the linear regulator LA may be adjusted to a desired level based on the feedback result. That is, the feedback unit may adjust the output level of the linear regulator LA to the desired level by making a voltage output from the linear regulator LA and a power supply voltage input to the linear regulator LA have a linear relationship.

In addition, although not illustrated in FIG. 18, noise may be removed from the analog envelope signal A_ENV input to the linear regulator LA by a noise removal unit (not shown). That is, the noise removal unit may remove the noise of the analog envelope signal A_ENV provided to the linear regulator LA and provide the noise-removed analog envelope signal A_ENV to the linear regulator LA. For reference, the noise removal unit may include, for example, a low-pass filter or an input puffer. Here, the low-pass filter may have a characteristic of capable of taking a specific gain value while removing an image signal of a digital-to-analog converter or high-frequency noise of a band. Also, the input buffer may have a characteristic of capable of implementing a wideband due to a wide coverage bandwidth although the noise removal performance is less sufficiently than the low-pass filter.

The switching regulator 330 may operate together with the multiple output voltage regulator 310 to generate the output voltage VET_APT in the DT-EL mode, and may operate together with the linear regulator LA to generate the output voltage VET_APT in the CL-ET mode. Also, the switching regulator 330 may operate to generate the output voltage VET_APT in the APT mode. In addition, the switching regulator 330 may be controlled by the switching regulator controller 350.

In detail, the switching regulator 330 may operate, in the DL-ET mode, in parallel with the multiple output voltage regulator 310, and may operate, in the CL-ET mode, in parallel with the linear regulator LA. That is, in the DL-ET mode or the CL-ET mode, the switching regulator 330 may boost or reduce the output voltage VET_APT by controlling turning-on or turning-off of a switch therein based on the switching regulator control signal SRC provided from the switching regulator controller 350.

Herein, in the DL-ET mode or the CL-ET mode, the switching regulator control signal SRC provided to the switching regulator 330 may be generated based on an output of a compensation comparator CCP in the switching regulator controller 350.

Also, in the DL-ET mode, the sum current IET_APT of the output current ILF of the switching regulator 330 and the output current IHF of the multiple output voltage regulator 310 may be provided to the power amplifier PA. In this case, the output current ILF of the switching regulator 330 may be controlled based on the switching regulator control signal SRC such that an average of the compensation values CV (e.g., a sum of the sensing value SV of the output current IHF and the difference value DV output from an OTA) output from the summer ADD in the switching regulator controller 350 to be described below is approximately zero.

For reference, the output current ILF of the switching regulator 330 may include a current of a low-frequency component (e.g., a frequency less than 1 MHz), and the output current IHF of the multiple output voltage regulator 310 may include a current of a high-frequency component (e.g., a frequency greater than 1 MHz).

On the other hand, in the CL-ET mode, the sum current IET_APT of the output current ILF of the switching regulator 330 and the output current IHF of the linear regulator LA may be provided to the power amplifier PA. In this case, the output current ILF of the switching regulator 330 may be controlled based on the switching regulator control signal SRC such that an average of the compensation values CV (e.g., a sum of the sensing value SV of the output current IHF and the difference value DV output from an OTA) output from the summer ADD in the switching regulator controller 350 to be described below is approximately zero.

For reference, the output current ILF of the switching regulator 330 may include a current of a low-frequency component (e.g., a frequency less than 1 MHz), and the output current IHF of the linear regulator LA may include a current of a high-frequency component (e.g., a frequency greater than 1 MHz).

The voltage VSR output from the switching regulator 330 may be provided, as the output voltage VET_APT, to the power amplifier PA through the inductor L.

Herein, the inductor L may be a power inductor of the switching regulator 330. Accordingly, the inductor L may be connected to the output end of the switching regulator 330 and support a continuous current waveform.

For reference, the inductor L may not be included in the switching regulator 330. That is, the inductor L may be provided outside the switching regulator 330. However, for convenience of explanation, in embodiments of the inventive concepts, a case where the inductor L is included in the switching regulator 330 is described as an example.

In the APT mode, the switching regulator 330 may independently regulate an input voltage (e.g., the power supply VIN provided from a battery) to a target level based on the switching regulator control signal SRC received from the switching regulator controller 350. Also, the switching regulator 330 may provide, as the output voltage VET_APT, the regulated voltage VSR to the power amplifier PA.

Herein, in the APT mode, the switching regulator control signal SRC provided to the switching regulator 330 may be generated based on an output of the output comparator OCP in the switching regulator controller 350.

For reference, the switching regulator 330 may include, for example, a dual-phase hybrid buck-boost converter, but is not limited thereto. That is, the switching regulator 330 may include a buck converter, a boost converter, a buck-boost converter, a cuk converter, or another DC-DC converter. In addition, the input voltage VIN provided to the multiple output voltage regulator 310 may be an input voltage different from the input voltage VIN provided to the multiple output voltage regulator 310, but in embodiments of the inventive concepts, for convenience of explanation, a case where the two input voltages are the same input voltage or similar input voltages will be described.

Also, unlike the above description, in the DL-ET mode, the switching regulator 330 and the linear regulator LA may operate together to generate the output voltage VET_APT, and in the CL-ET mode, the switching regulator 330 and the multiple output voltage regulator 310 may operate together to generate the output voltage VET_APT. In addition, all of the switching regulator 330, the linear regulator LA, and the multiple output voltage regulator 310 may operate together to generate the output voltage VET_APT. In addition, in each of the DL-ET mode, the CL-ET mode, and the APT mode, driving agents other than the driving agents described herein may operate.

However, for convenience of explanation, in embodiments of the inventive concepts, a case where the switching regulator 330 and the multiple output voltage regulator 310 operate together in the DL-ET mode, the switching regulator 330 and the linear regulator LA operate together in the CL-ET mode, and the switching regulator 330 operates in the APT mode is described as an example.

The switching regulator controller 350 may selectively sense one of an output current of the multiple output voltage regulator 310 and/or the output current IHF of the linear regulator LA according to a tracking mode, and may control the switching regulator 330 based on a sensing value SV. Also, the switching regulator controller 350 may be controlled by the main controller 360.

In detail, the switching regulator controller 350 may include the feedback loop FL, an OTA, a multiplexer MUX, the summer ADD, the compensation comparator CCP, the digital-to-analog converter DAC, and the output comparator OCP.

The feedback loop FL may sense an output current of the multiple output voltage regulator 310 or an output current of the linear regulator LA.

That is, in the DL-ET mode, the feedback loop FL may sense the output current IHF of the multiple output voltage regulator 310 and provide the sensing value SV to the summer ADD. On the contrary, in the CL-ET mode, the feedback loop FL may sense the output current IHF of the linear regulator LA and provide the sensing value SV to the summer ADD.

For reference, IHF may refer to the output current of the multiple output voltage regulator 310 in the DL-ET mode, and may refer to the output current of the linear regulator LA in the CL-ET mode. SV may refer to a sensing value of the output current of the multiple output voltage regulator 310 in the DL-ET mode, and may refer to a sensing value of the output current of the linear regulator LA in the CL-ET mode. Herein, the sensing value SV may be, for example, a current value or a voltage value, but is not limited thereto.

The OTA may output the difference value DV by comparing the voltage VAC of the coupling capacitor CAC with a target voltage signal VCCMIN of the coupling capacitor CAC.

That is, the OTA may receive the target voltage signal VCCMIN of the coupling capacitor CAC from the main controller 360. Accordingly, the OTA may receive the target voltage signal VCCMIN from the main controller 360 through a positive terminal + and may receive the voltage VAC of the coupling capacitor CAC through a negative terminal −. Accordingly, the OTA may compare the target voltage signal VCCMIN with the voltage VAC of the coupling capacitor CAC and output the difference value DV between the target voltage signal VCCMIN and the voltage VAC of the coupling capacitor CAC based on the comparison result.

For reference, an amplifier (not shown) changing the voltage VAC of the coupling capacitor CAC into a single-ended voltage may be provided in the supply modulator 300-5. Also, the amplifier may provide the voltage VAC of the coupling capacitor CAC to the negative terminal − of the OTA.

In addition, the difference value DV output from the OTA may be a current value or a voltage value corresponding to a difference between the voltage VAC of both ends of the coupling capacitor CAC and a target voltage (a voltage value indicated by VCCMIN).

For reference, the target voltage signal VCCMIN of the coupling capacitor CAC may be adjusted by the modem 100. That is, the modem 100 may calculate a target voltage value of the coupling capacitor CAC and provide the calculated target voltage value to the main controller 360. Also, the main controller 360 may generate the target voltage signal VCCMIN based on the received target voltage value and provide the generated target voltage signal VCCMIN to the OTA of the switching regulator controller 350.

According to a tracking mode, the summer ADD may sum up the difference value DV output from the OTA and the sensing value SV of the output current IHF of the multiple output voltage regulator 310 sensed by the feedback loop FL or sum up the difference value DV output from the OTA and the sensing value SV of the output current IHF of the linear regulator LA sensed by the feedback loop FL and output the summed-up value as the compensation value CV.

That is, in the DL-ET mode, the summer ADD may sum up the difference value DV output from the OTA and the sensing value SV of the output current IHF of the multiple output voltage regulator 310 sensed by the feedback loop FL and output the summed-up value as the compensation value CV. On the contrary, in the CL-ET mode, the summer ADD may sum up the difference value output from the OTA and the sensing value SV of the output current IHF of the linear regulator LA sensed by the feedback loop FL and output the summed-up value as the compensation value CV. Also, the compensation value CV output from the summer ADD may be provided to the compensation comparator CCP.

For reference, the form of the compensation value CV output from the summer ADD may be a current value or a voltage value, but is not limited thereto.

The compensation comparator CCP may compare the compensation value CV output from the summer ADD with a reference value.

That is, the compensation comparator CCP may receive the compensation value CV output from the summer ADD through the positive terminal + and receive the reference value through the negative terminal −. Also, the compensation comparator CCP may output a comparison result between the received compensation value CV and the reference value to the multiplexer MUX.

In more detail, when the compensation value CV is greater than the reference value, the compensation comparator CCP may output a high level signal (e.g., '1'), and when the compensation value CV is less than the reference value, the compensation comparator CCP may output a low level signal (e.g., '0').

For reference, the negative terminal − may be grounded, and in this case, the reference value may be zero.

The digital-to-analog converter DAC may convert the average power signal D_REF received from the outside into the reference voltage signal A_REF.

That is, the digital-to-analog converter DAC may receive the average power signal D_REF from the modem 100 through the MIPI 130, and may convert the received average power signal D_REF into the reference voltage signal A_REF and output the reference voltage signal A_REF to the output comparator OCP.

The output comparator OCP may compare the reference voltage signal A_REF converted by the digital-to-analog converter DAC with the output voltage VET_APT.

That is, the output comparator OCP may receive the reference voltage signal A_REF converted by the digital-to-analog converter DAC through the positive terminal +, and may receive the output voltage VET_APT through the negative terminal −. Also, the output comparator OCP may output a comparison result between the received reference voltage signal A_REF and output voltage VET_APT to the multiplexer MUX.

For reference, an output end of the supply modulator 300-5 may be connected to the negative terminal − of the output comparator OCP as well as the power amplifier PA. In this case, the output voltage VET_APT generated by the supply modulator 300-5 may be directly provided to the negative terminal − of the output comparator OCP. In addition, a connection circuit (not shown; e.g., a circuit including a resistor and a capacitor) connecting the output end of the supply modulator 300-5 and the negative terminal − of the output comparator OCP may be included in the supply modulator 300-5. In this case, the connection circuit may reduce the level of the output voltage VET_APT generated and output from the supply modulator 300-5 and then provide the output voltage VET_APT of which the level thereof is reduced to the negative terminal − of the output comparator OCP.

The multiplexer MUX may output one of outputs of the compensation comparator CCP and the output comparator OCP to the switching regulator 330 as the switching regulator control signal SRC.

That is, in the APT mode, the multiplexer MUX may output the output of the output comparator OCP to the switching regulator 330 as the switching regulator control signal SRC, and in the ET mode (e.g., the DL-ET mode or the CL-ET mode), the multiplexer MUX may output the output of the compensation comparator CCP to the switching regulator 330 as the switching regulator control signal SRC.

For reference, when the output of the compensation comparator CCP is a high level signal, the switching regulator control signal SRC may also be a high level signal. Also, when the switching regulator 330 receives a high level signal as the switching regulator control signal SRC, the output current ILF output from the switching regulator 330 may be boosted. On the contrary, when the output of the compensation comparator CCP is a low level signal, the switching regulator control signal SRC may also be a low level signal. Also, when the switching regulator 330 receives a low level signal as the switching regulator control signal SRC, the output current ILF output from the switching regulator 330 may be reduced.

That is, through the above ILF boosting and reducing mechanism, a current value of the output current ILF may be adjusted such that an average of the compensation values CV is approximately zero, and the voltage VAC of the coupling capacitor CAC may be maintained at the voltage level of the target voltage signal VCCMIN. In addition, through such a maintenance process, a difference in level between the output voltage VET_APT of the supply modulator 300-5 and a voltage VHF (e.g., an output voltage of the multiple output voltage regulator 310) according to the output voltage IHF may be maintained at the level of the voltage VAC of the coupling capacitor CAC.

As described above, in embodiments of the inventive concepts, as the VHF is lower than the VET_APT by the VAC, the output voltage VHF of the multiple output voltage regulator 310 may be lowered by the VAC than that of the related art when the supply modulator 300-5 outputs the VET_APT having a specific level, and accordingly, the level of the input voltage VIN of the multiple output voltage regulator 310 may also be lowered than that of the related art. In addition, in embodiments of the inventive concepts, as the maximum value (e.g., upper limit value) of the output voltage of the switch array 370 and the output voltage of the linear regulator LA may be lowered through the above-stated mechanism, the switch array 370 and the linear regulator LA may include elements having a lower pressure-resistance than that of the related art.

That is, in the case of the supply modulator 300-5 according to embodiments of the inventive concepts, as a high output voltage VET_APT may also be supplied to a power amplifier (e.g., PA of FIG. 1) even when the level of the input voltage VIN of the multiple output voltage regulator 310 is lowered, and the switch array 370 and the linear regulator LA include an element having a lower pressure-resistance than that of the related art, power efficiency may be improved compared to the related art.

For reference, in the DL-ET mode, the switching regulator 330 may output the output current ILF based on the switching regulator control signal SRC received from the multiplexer MUX. Also, as the level of the output current ILF is boosted and reduced based on the switching regulator control signal SRC, an average of the output currents IHF output from the multiple output voltage regulator 310 may be approximated to zero. Also, as the average of the output currents IHF is approximately zero, the level of a voltage to be output from the multiple output voltage regulator 310 is also reduced, and in this case, the size of a switch element used in the multiple output voltage regulator 310 may not be large. Accordingly, in embodiments of the inventive concepts, the size of the switch element to be used in the multiple output voltage regulator 310 may be reduced compared to the related art, and accordingly, the power conversion efficiency of the multiple output voltage regulator 310 may be improved.

As described above, the switching regulator controller 350 may selectively sense one of the output current of the multiple output voltage regulator 310 and the output current of the linear regulator LA based on the above-described structures and characteristics, and may control the switching regulator 330 based on the sensing value SV.

For reference, although not illustrated in FIG. 18, the switching regulator controller 350 may sense a factor other than an output current of the multiple output voltage regulator 310 or the linear regulator LA, and may control the switching regulator 330 based on a corresponding sensing value. That is, the feedback loop FL may sense a factor other than an output current of the multiple output voltage regulator 310 or the linear regulator LA, and may provide a sensing value to the summer ADD. When the feedback loop FL senses a different factor, a feedback loop having a path different from that shown in FIG. 18 may be configured.

For example, the switching regulator controller 350 may sense the following factors.

1) an internal current of the multiple output voltage regulator 310 (for example, a current flowing through an internal inductor (e.g., L' of FIG. 20), a current flowing through internal LDOs (e.g., LDO1 to LDO(N−2) of FIG. 21), and a current flowing through capacitors, or a current flowing through capacitors (e.g., C1 to CN−1);

2) a current applied from an input voltage (that is, the power supply provided from a battery or the like; VIN) to the multiple output voltage regulator 310; and/or 3) an internal voltage of the multiple output voltage regulator 310 (for example, internal switching voltages (e.g., switching voltages of switches SM1 to SM(N−1) of FIG. 20), gate voltages of internal LDOs (e.g., LDO1 to LDO (N−2) of FIG. 21), or the like).

However, for convenience of explanation, in embodiments of the inventive concepts, a case where the switching regulator controller 350 selectively senses one of the output current of the multiple output voltage regulator 310 and the output current of the linear regulator LA and control the switching regulator 330 based on the sensing value SV is described as an example.

The switch array 370 may include a plurality of switches S1 to SN (wherein N is a natural number of two or more). Also, any one switch SN of the plurality of switches S1 to SN may be connected to a ground voltage GND, and the remaining switches S1 to SN−1 of the plurality of switches S1 to SN may be connected to the multiple output voltage regulator 310 to respectively correspond to the plurality of voltages V1 to VN−1 having different levels from each other output from the multiple output voltage regulator 310. In addition, the switching operations of the plurality of switches S1 to SN in the switch array 370 may be controlled by the switch control signal SW provided from the switch controller 380. Accordingly, the switch array 370 may select one of the plurality of voltages V1 to VN−1 having different levels from each other and the ground voltage GND (e.g., 0V) based on the switch control signal SW and provide the selected voltage to the power amplifier PA.

The discrete-level controller 390 may generate the level control signal ENV_LV including multiple pieces of envelope level information based on the digital envelope signal D_ENV received from the outside. Also, the discrete-level controller 390 may be controlled by the main controller 360.

In detail, the discrete-level controller 390 may receive the digital envelope signal D_ENV from the modem 100 and generate and output the level control signal ENV_LV including multiple pieces of envelope level information based on the digital envelope signal D_ENV received from the modem 100. Also, the level control signal ENV_LV output from the discrete-level controller 390 may be provided to the switch controller 380.

The switch controller 380 may receive the level control signal ENV_LV from the discrete-level controller 390 and control the switching operation of the plurality of switches S1 to SN based on the level control signal ENV_LV received from the discrete-level controller 390. That is, the switch controller 380 may generate the switch control signal SW for controlling the switching operation of the switch array 370 and provide the generated switch control signal SW to the switch array 370. Also, the switch controller 380 may be controlled by the main controller 360.

In detail, in the DL-ET mode, the switch controller 380 may control the switching operation of the switch array 370 to select, from among the plurality of voltages V1 to VN−1 having different levels from each other and the ground voltage GNDD, a voltage to be provided to the power amplifier PA.

Also, in the APT mode, the switch controller 380 may connect the ground voltage GND to the coupling capacitor CAC by controlling the switch SN connected to the ground voltage GND from among the plurality of switches S1 to SN.

Accordingly, in the APT mode, the coupling capacitor CAC may serve as a decoupling capacitor connected to the output voltage VET_APT. A separate capacitor (not shown) may be additionally connected to the output end of the supply modulator 300-5, and in this case, in the APT mode, the separate capacitor which is additionally connected to the output end of the supply modulator 300-5 may be used as a decoupling capacitor.

However, in embodiments of the inventive concepts, for convenience of explanation, a case where the coupling capacitor CAC is used as a decoupling capacitor in the APT mode will be described as an example.

The coupling capacitor CAC may be connected between the multiple output voltage regulator 310 and the output end of the supply modulator 300-5. In addition, the coupling capacitor CAC may be, for example, an alternating current coupling capacitor, but is not limited thereto.

In detail, in the case of the coupling capacitor CAC, an end thereof may be connected to the linear regulator LA and the switch array 370, and the other end thereof may be connected to the power amplifier PA. That is, as shown in FIG. 18, the other end of the coupling capacitor CAC may be connected to the inductor L of the switching regulator 330 and the output end (an output end of the output voltage VET_APT) of the supply modulator 300-5, and accordingly, the coupling capacitor CAC may be included in the supply modulator 300-5.

The coupling capacitor CAC may be included outside the supply modulator 300-5, but in embodiments of the inventive concepts, for convenience of explanation, a case where the coupling capacitor CAC is included in the supply modulator 300-5 will be described as an example.

The magnitude of a maximum output voltage (e.g., a maximum or highest level voltage) and the number of output voltages of the multiple output voltage regulator 310 may be reduced through the presence of the coupling capacitor CAC. In addition, as the coupling capacitor CAC may be used as a decoupling capacitor in the APT mode, detailed descriptions thereof will be made below.

The main controller 360 may generate and provide the plurality of reference output voltage signals VREF1 to VREFN−1 to the multiple output voltage regulator 310. In addition, the main controller 360 may generate and provide the target voltage signal VCCMIN of the coupling capacitor CAC to the switching regulator controller 350. Also, the main controller 360 may determine a tracking mode and control at least one of the multiple output voltage regulator 310, the linear regulator LA, the switch controller 380, the switching regulator controller 350, and/or the discrete-level controller 390 based on the determined tracking mode.

In detail, the main controller 360 may receive a tracking mode determination signal from the modem 100 through the MIPI (130 of FIG. 1), and may determine a tracking mode of the supply modulator 300-5 based on the tracking mode determination signal received from the modem 100.

Accordingly, when the tracking mode is determined as the DL-ET mode, the main controller 360 may control a parallel operation of the multiple output voltage regulator 310 and the switching regulator 330. In this case, the multiple output voltage regulator 310 and the switching regulator 330 may together generate a modulation voltage according to the DL-ET mode and provide the generated modulation voltage to the power amplifier PA.

Subsequently, when the tracking mode is determined as the CL-ET mode, the main controller 360 may control a parallel operation of the linear regulator LA and the switching regulator 330. In this case, the linear regulator LA and the switching regulator 330 may together generate a modulation voltage according to the CL-ET mode and provide the generated modulation voltage to the power amplifier PA.

Last, when the tracking mode is determined as the APT mode, the main controller 360 may control an output voltage generation operation of the switching regulator 330. In this case, the switching regulator 330 may generate a modulation voltage according to the APT mode and provide the generated modulation voltage to the power amplifier PA as the output voltage VET_APT.

In the APT mode, the switch controller 380 may control the switching operation of the switch array 370 to activate the coupling capacitor CAC as a decoupling capacitor.

The main controller 360 may receive various signals (e.g., various control signals such as an output voltage level signal or the like) other than the tracking mode determination signal from the modem 100 through the MIPI 130 and control components such as the multiple output voltage regulator 310, the linear regulator LA, the switch controller 380, the switching regulator controller 350, and the discrete-level controller 390 based on the received various signals.

For reference, in FIG. 18, the main controller 360 is shown as controlling at least one of the multiple output voltage regulator 310, the linear regulator LA, the switch controller 380, the switching regulator controller 350, and/or the discrete-level controller 390, but is not limited thereto. That is, the main controller 360 may control operations of components other than the above-stated components.

However, for convenience of explanation, in embodiments of the inventive concepts, a case where the main controller 360 controls at least one of the multiple output voltage regulator 310, the linear regulator LA, the switch controller 380, the switching regulator controller 350, and/or the discrete-level controller 390 is described as an example.

In addition to the above-stated components, the supply modulator 300-5 may further include an additional capacitor (not shown), an oscillator (not shown), a bandgap reference circuit (not shown), or the like.

In detail, the additional capacitor may be connected near the output end of the supply modulator 300-5 and may remove a parasitic capacitance and high-frequency noise that may be in a circuit of the supply modulator 300-5. In addition, the oscillator is a circuit that may be desirable when using the NMOS structure (e.g., a gate-boosted NMOS structure) to improve the characteristics of the plurality of switches S1 to SN. Also, the bandgap reference circuit is a circuit that supplies a reference voltage or a reference current desired when each component operates, and may be hardly affected by operations, voltages, temperature changes, or the like.

As described above, the supply modulator 300-5 may have the above-described structure and characteristics. In addition, based on the structures and characteristics, the supply modulator 300-5 may be driven in any one tracking mode of the DL-ET mode, the CL-ET mode, and the APT mode and provide the output voltage VET_APT to the power amplifier PA.

Herein, waveform characteristics of an output voltage according to a tracking mode will be described with reference to FIG. 8 described above.

In detail, the APT mode is a tracking mode in which a modulation voltage that varies based on a peak level of the envelope RF_OUT_ENV of the RF output signal RF_OUT at a certain time interval (e.g., TTI) is applied to the power amplifier (PA of FIG. 1). Also, the CL-ET mode is a tracking mode in which a modulation voltage that follows a level of the envelope RF_OUT_ENV of the RF output signal RF_OUT is instantaneously or promptly applied to the power amplifier (PA of FIG. 1). In addition, the DL-ET mode is a tracking mode in which a modulation voltage that follows the level of the envelope RF_OUT_ENV of the RF output signal RF_OUT is applied to the power amplifier (PA of FIG. 1, wherein the modulation voltage is limited to a sum voltage of one of a plurality of voltages having different levels from each other generated by the multiple output voltage regulator 310 and the voltage VAC of the coupling capacitor CAC, or the voltage VAC of the coupling capacitor CAC.

For reference, the envelope RF_OUT_ENV of the RF output signal RF_OUT may be generated based on an amplitude (magnitude) of the RF output signal RF_OUT.

The mechanism by which the supply modulator 300-5 generates the output voltage VET_APT in the ET mode (the DL-ET mode or the CL-ET mode) is the same as or similar to the above descriptions in FIG. 9, and thus detailed descriptions thereof will be omitted.

As described above, the supply modulator 300-5 may generate a modulation voltage that varies according to one tracking mode of the APT mode, the DL-ET mode, and the CL-ET mode to provide the generated modulation voltage to the power amplifier (PA of FIG. 1) as a power supply voltage.

In addition, based on the above characteristics, as a voltage difference between the RF output signal RF_OUT of the power amplifier (PA of FIG. 1) and a modulation voltage (e.g., the output voltage VET_APT provided to the power amplifier (PA of FIG. 1)) of the supply modulator 300-5 is reduced, energy waste may be minimized or reduced, and the lifespan of a battery may be improved.

In the case of the power efficiency of the power amplifier (PA of FIG. 1), the power efficiency in the ET mode (the D-ET mode or the CL-ET mode) is greater than the power efficiency in the APT mode. On the contrary, in the case of the power efficiency of the supply modulator 300-5, the power efficiency in the APT mode is greater than the power efficiency in the ET mode (the DL-ET mode or the CL-ET mode).

For reference, the power efficiency of an entire system, for example, the efficiency of the wireless communication apparatus 1 of FIG. 1 may be proportional to the power efficiency of the supply modulator 300-5 and the power efficiency of the power amplifier (e.g., PA of FIG. 1).

For this reason, in a high power region, in which a power level (more particularly, transmission power of the antenna (ANT of FIG. 1)) of the RF output signal RF_OUT is high, and the power efficiency of the entire system may be greater in the ET mode (the DL-ET mode or the CL-ET mode) than in the APT mode. On the contrary, in a low power region, in which the power level of the RF output signal RF_OUT (more particularly, the transmission power of the antenna (ANT of FIG. 1)) is low, and the power efficiency of the entire system may be greater in the APT mode than in the ET mode (the DL-ET mode or the CL-ET mode).

Accordingly, the supply modulator 300-5 may be driven in any one of the ET mode (the DL-ET mode or the CL-ET mode) and the APT mode selectively accordingly to transmission power TX power of the antenna (ANT of FIG. 1).

For reference, the CL-ET mode is a method of tracking the envelope RF_OUT_ENV of the RF output signal (RF_OUT of FIG. 1) by using the linear regulator LA. Accordingly, the CL-ET mode has excellent power conversion efficiency in generating the output voltage VET_APT by accurately tracking the envelope RF_OUT_ENV of the RF output signal (RF_OUT of FIG. 1), but a bandwidth of the linear regulator LA may limit a bandwidth of the output voltage VET_APT.

On the contrary, the DL-ET mode is a method of tracking the envelope RF_OUT_ENV of the RF output signal (RF_OUT of FIG. 1) and limiting the output voltage VET_APT supplied to the power amplifier (PA of FIG. 1) to the plurality of voltages V1 to VN−1 having different levels from each other that may be generated by the multiple output voltage regulator 310. Accordingly, in the DL-ET mode, a voltage difference between the output voltage VET_APT and the envelope RF_OUT_ENV of the RF output signal (RF_OUT of FIG. 1) may occur, and accordingly, the power conversion efficiency may be lower than in the CT-ET mode. However, in the DL-ET mode, the power efficiency of the supply modulator may be greater than in the CL-ET mode. In addition, in the DL-ET mode, as the linear regulator LA is not used, the bandwidth of the output voltage VET_ATP may be greater than that in the CL-ET mode.

For reference, a channel bandwidth in use or to be used in the NR (5G) may exceed a bandwidth limit of the linear regulator LA, and thus, in the NR (5G), the CL-ET mode in which the linear regulator LA is used may be difficult to be implemented. However, in the DL-ET mode, as the output of the multiple output voltage regulator 310 is provided (e.g., the output of the multiple output voltage regulator 310 does not pass through the linear regulator LA) to the power amplifier (e.g., PA of FIG. 1) through a switch (e.g., one of the SL to SN−1), and the above-stated bandwidth related challenge may be solved.

Accordingly, the main controller 360 may determine any one tracking mode of the DL-ET mode and the CL-ET mode in a direction in which the power efficiency of the entire system may be increased by considering the above situation.

In FIG. 22, a mechanism in which an output voltage of the multiple output voltage regulator 310 is boosted by the coupling capacitor CAC in the supply modulator 300-5 is shown.

Referring to FIGS. 18 and 22, an operation of generating the output voltage VET_APT by summing up the output voltage VHF (V1 to VN−1) of the multiple output voltage regulator 310 with the voltage VAC of the coupling capacitor CAC is shown. That is, a difference between the two voltages VHF and VET_APT due to the voltage VAC of the coupling capacitor CAC is shown in FIG. 22.

For reference, as described above, in the DL-ET mode, the output current ILF of the switching regulator 330 may be controlled based on the switching regulator control signal SRC such that an average of the output currents IHF of the multiple output voltage regulator 310 is approximately zero.

In more detail, the switching regulator control signal SRC may be adjusted such that the average of the compensation values CV (e.g., a sum of the sensing value SV of the output voltage IHF and the difference value DV output from the OTA) output from the summer ADD in the switching regulator controller 350 is approximately zero. Also, as described above, the magnitude of the output current ILF of the switching regulator 330 may be adjusted by the adjusted switching regulator control signal SRC. In addition, through the magnitude adjustment operation of the output current ILF of the switching regulator 330, the average of the output currents IHF of the multiple output voltage regulator 310 is approximated to zero, and the voltage VAC of the coupling capacitor CAC may be maintained at a voltage level of the target voltage signal VCCMIN.

That is, the voltage VAC of the coupling capacitor CAC may be adjusted to become a target voltage value indicated by the target voltage signal VCCMIN through the above-described approximation operation performed by the switching regulator controller 350.

In addition, in the DL-ET mode, when the switch SN connected to the ground voltage GND from among switches of the switch array 370 is turned on (e.g., closed), the voltage VAC of the coupling capacitor CAC may become a minimum voltage level (as used herein, the minimum voltage level may also be referred to as a lower limit voltage level) of the output voltage VET_APT in the DL-ET mode. Accordingly, when the main controller 360 adjusts the target voltage signal VCCMIN in the DL-ET mode, the minimum voltage level of the output voltage VET_APT may also be adjusted.

Based on this principle, referring to FIG. 22, the minimum voltage level of the output voltage VET_APT may be VAC, and the maximum voltage level of the output voltage VET_APT may be V1+VAC obtained by summing up the maximum voltage value V1 of the multiple output voltage regulator 310 and the VAC. In addition, the voltage level of V1 may be boosted through the coupling capacitor CAC although the maximum voltage level of the multiple output voltage regulator 310 is V1, the maximum voltage level of the output voltage VET_APT may be V1+VAC, which is greater than V1 by VAC.

In addition, even when the coupling capacitor CAC is connected to the ground voltage GND rather than the multiple output voltage regulator 310 through the switch SN of the switch array 370, the output voltage VET_APT having a VAC level, which is a minimum voltage level, may be supplied to the power amplifier PA. That is, even when the connection between the multiple output voltage regulator 310 and the output end of the supply modulator 300-5 is disconnected by the switch array 370, the output voltage VET_APT may also be supplied to the power amplifier PA. Accordingly, in embodiments of the inventive concepts, the number of output voltages of the multiple output voltage regulator 310 may be less than the total number of the output voltages VHF that may be used to generate the output voltage VET_APT by one (e.g., one output voltage of the multiple output voltage regulator 310 used to generate the output voltage VET_APT having the minimum voltage level).

As described above, as the supply modulator 300-5 is driven to the APT mode or the ET mode (the DL-ET mode or the CL-ET mode) to generate the output voltage VET_APT based on the above-described principle, hereinafter, referring to FIGS. 23 to 25, an operation of the supply modulator 300-5 according to a tracking mode will be described.

For reference, portions indicated by bold lines in each of FIGS. 23 to 25 may mean operation activation paths in the corresponding drawing.

First, referring to FIG. 23, an operation of the supply modulator 300-5 in the APT mode is shown.

The main controller 360 may receive the APT mode determination signal from the modem 100 and determine the APT mode of the supply modulator 300-5 based on the APT mode determination signal received from the modem 100.

In this case, the main controller 360 may control the switching regulator controller 350 based on the determined tracking mode, and the switching regulator controller 350 may control the switching regulator 330 based on the control of the main controller 360.

Accordingly, the switching regulator 330 may generate a modulation voltage VSR according to the APT mode and provide the generated modulation voltage VSR to the power amplifier (PA of FIG. 1) as the output voltage VET_APT.

In more detail, to generate the modulation voltage VSR according to the APT mode, the digital-to-analog converter DAC of the switching regulator controller 350 may receive the average power signal D_REF from the modem 100 and convert the average power signal D_REF received from the modem 100 into the reference voltage signal A_REF. The digital-to-analog converter DAC may provide the converted reference voltage signal A_REF to the output comparator OCP, and the output comparator OCP may compare the output voltage VET_APT with the reference voltage signal A_REF. Also, the output comparator OCP may output the comparison result to the multiplexer MUX, and the multiplexer MUX may output the output of the output comparator OCP to the switching regulator 330 as the switching regulator control signal SRC. The switching regulator 330 may generate the modulation voltage VSR according to the APT mode based on the switching regulator control signal SRC received from the multiplexer MUX and supply the generated modulation voltage VSR to the power amplifier (PA of FIG. 1) as the output voltage VET_APT.

For reference, in embodiments of the inventive concepts, a method (e.g., a hysteretic (bang-bang) control method) of controlling the output voltage VET_APT by using the output comparator OCP in the APT mode is shown, but is not limited thereto. That is, in embodiments of the inventive concepts, a method (e.g., a voltage mode control method) of controlling the output voltage VET_APT by using a compensator instead of a comparator in the APT mode may be used. However, for convenience of explanation, in embodiments of the inventive concepts, a case where the method of controlling the output voltage VET_APT based on the output comparator OCP in the APT mode is used is described as an example.

Further, the main controller 360 may control the switch controller 380 based on the determined tracking mode, and the switch controller 380 may control the switch array 370 based on the control of the main controller 360.

In more detail, the switch controller 380 may control the switching operations of some of the plurality of switches S1 to SN based on the control of the main controller 360. Accordingly, the switch array 370 may turn on the switch SN connected to the ground voltage GND based on the control of the switch controller 380, and the coupling capacitor CAC may be used as a decoupling capacitor in the APT mode by the turned-on switch SN.

For reference, although not illustrated in FIG. 23, a separate capacitor (not shown) may be further included in the output end of the supply modulator 300-5. In this case, the capacitor connected to the output end of the supply modulator 300-5 may be also used as a decoupling capacitor in the APT mode.

In addition, although not illustrated in FIG. 23, the multiple output voltage regulator 310 may also generate a modulation voltage according to the APT mode based on the control of the main controller 360.

However, for convenience of explanation, in embodiments of the inventive concepts, a case where, in the APT mode, the coupling capacitor CAC is used as a decoupling capacitor, and the switching regulator 330 generates and outputs the output voltage VET_APT will be described as an example.

Then, referring to FIG. 24, an operation of the supply modulator 300-5 in the DL-ET mode is shown.

The main controller 360 may receive the DL-ET mode determination signal from the modem 100 and determine the DL-ET mode of the supply modulator 300-5 based on the DL-ET mode determination signal received from the modem 100.

In this case, the main controller 360 may control the multiple output voltage regulator 310, the switching regulator controller 350, the switch controller 380, and the discrete-level controller 390 based on the determined tracking mode. Also, the switching regulator controller 350 may control the switching regulator 330, and the switch controller 380 may control the switch array 370. Accordingly, the switching regulator 330 and the multiple output voltage regulator 310 may together generate a modulation voltage according to the DL-ET mode and provide the generated modulation voltage to the power amplifier (PA of FIG. 1).

In more detail, the multiple output voltage regulator 310 may receive the plurality of reference output voltage signals VREF1 to VREFN−1 from the main controller 360, and may provide the plurality of voltages V1 to VN−1 having different levels from each other by boosting or reducing an input voltage (e.g., the power supply VIN provided from the battery or the like) based on the plurality of reference output voltage signals VREF1 to VREFN−1 received from the main controller 360.

The discrete-level controller 390 may receive the digital envelope signal D_ENV from the modem 100 and generate the level control signal ENV_LV including multiple pieces of envelope level information based on the digital envelope signal D_ENV received from the modem 100. In addition, the discrete-level controller 390 may provide the generated level control signal ENV_LV to the switch controller 380.

The switch controller 380 may receive the level control signal ENV_LV from the discrete-level controller 390 and control the switching operations of the plurality of switches S1 to SN based on the level control signal ENV_LV received from the discrete-level controller 390. That is, the switch controller 380 may control the switching operation of the switch array 370 to select, from among the plurality of voltages V1 to VN−1 having different levels from each other and the ground voltage GND, a voltage to be provided to the power amplifier PA.

Accordingly, a switch (e.g., S1) selected from among the plurality of switches S1 to SN by the switch control signal SW may be turned on, and a voltage (e.g., V1) having a specific level corresponding to the switch may be provided to the power amplifier (PA of FIG. 1) through the turned-on switch (e.g., S1). The voltage (e.g., V1) having a specific level output through the turned-on switch (e.g., S1) may be summed up with the voltage VAC of the coupling capacitor CAC to be a final output voltage VET_APT, and the final output voltage VET_APT may be provided to the power amplifier (PA of FIG. 1).

For reference, the output current IHF of the multiple output voltage regulator 310 provided to the power amplifier (PA of FIG. 1) through the turned-on switch may be sensed by the feedback loop FL of the switching regulator controller 350, and the sensing value SV may be provided to the summer ADD.

The OTA in the switching regulator controller 350 may receive the target voltage signal VCCMIN from the main controller 360 through the positive terminal + and receive the voltage VAC of the coupling capacitor CAC through the negative terminal −. Also, the OTA may compare the target voltage signal VCCMIN with the voltage VAC of the coupling capacitor CAC and output the difference value DV between the target voltage signal VCCMIN and the voltage VAC of the coupling capacitor CAC based on the comparison result.

The summer ADD may sum up the difference value output from the OTA and the sensing value SV of the output current IHF of the multiple output voltage regulator 310 sensed by the feedback loop FL and output the summed-up value as the compensation value CV. In addition, the compensation value CV output from the summer ADD may be provided to the compensation comparator CCP.

The compensation comparator CCP may receive the compensation value CV output from the summer ADD through the positive terminal + and receive the reference value through the negative terminal −. In addition, the compensation comparator CCP may output a comparison result between the received compensation value CV and reference value to the multiplexer MUX.

In the DL-ET mode, the multiplexer MUX may output the output of the compensation comparator CCP to the switching regulator 330 as the switching regulator control signal SRC.

The switching regulator 330 may generate the modulation voltage VSR according to the DL-ET mode based on the switching regulator control signal SRC received from the multiplexer MUX and supply the generated modulation voltage VSR to the power amplifier (PA of FIG. 1).

For reference, the output current ILF of the switching regulator 330 output based on the switching regulator control signal SRC may be combined with the output current IHF of the multiple output voltage regulator 310 stated above and may be provided to the power amplifier (PA of FIG. 1) as the output current IET_APT forming the output voltage VET_APT.

Last, referring to FIG. 25, an operation of the supply modulator 300-5 in the CL-ET mode is shown.

The main controller 360 may receive the CL-ET mode determination signal from the modem 100 and determine the CL-ET mode of the supply modulator 300-5 based on the CL-ET mode determination signal received from the modem 100.

In this case, the main controller 360 may control the linear regulator LA and the switching regulator controller 350 based on the determined tracking mode. Also, the switching regulator controller 350 may control the switching regulator 330. Accordingly, the switching regulator 330 and the linear regulator LA may together generate a modulation voltage according to the CL-ET mode and provide the generated modulation voltage to the power amplifier (PA of FIG. 1).

In more detail, the linear regulator LA may receive the analog envelope signal A_ENV from the modem 100 and output the analog envelope signal A_ENV received from the modem 100 to output the output current IHF. Also, the output current IHF output by the linear regulator LA may be provided to the power amplifier (PA of FIG. 1).

For reference, the output current IHF of the linear regulator LA may be sensed by the feedback loop FL of the switching regulator controller 350, and the sensing value SV may be provided to the summer ADD.

The OTA in the switching regulator controller 350 may receive the target voltage signal VCCMIN from the main controller 360 through the positive terminal + and receive the voltage VAC of the coupling capacitor CAC through the negative terminal −. Also, the OTA may compare the target voltage signal VCCMIN with the voltage VAC of the coupling capacitor CAC and output the difference value DV between the target voltage signal VCCMIN and the voltage VAC of the coupling capacitor CAC based on the comparison result.

The summer ADD may sum up the difference value output from the OTA and the sensing value SV of the output current IHF of the linear regulator LA sensed by the feedback loop FL and output the summed-up value as the compensation value CV. In addition, the compensation value CV output from the summer ADD may be provided to the compensation comparator CCP.

The compensation comparator CCP may receive the compensation value CV output from the summer ADD through the positive terminal + and receive the reference value through the negative terminal −. In addition, the compensation comparator CCP may output a comparison result between the received compensation value CV and reference value to the multiplexer MUX.

The multiplexer MUX may output the output of the compensation comparator CCP to the switching regulator 330 as the switching regulator control signal SRC.

The switching regulator 330 may generate the modulation voltage VSR according to the CL-ET mode based on the switching regulator control signal SRC received from the multiplexer MUX and supply the generated modulation voltage VSR to the power amplifier (PA of FIG. 1).

For reference, the output current ILF of the switching regulator 330 output based on the switching regulator control signal SRC may be combined with the output current IHF of the linear regulator LA described above and may be provided to the power amplifier (PA of FIG. 1) as the output current IET_APT forming the output voltage VET_APT.

As described above, as the supply modulator 300-5 is driven according to the APT mode, the DL-ET mode, or the CL-ET mode based on the above-described principle, hereinafter, referring to FIGS. 26 to 28, a sixth example of a supply modulator according to embodiments of the inventive concepts will be described.

Figure 26:
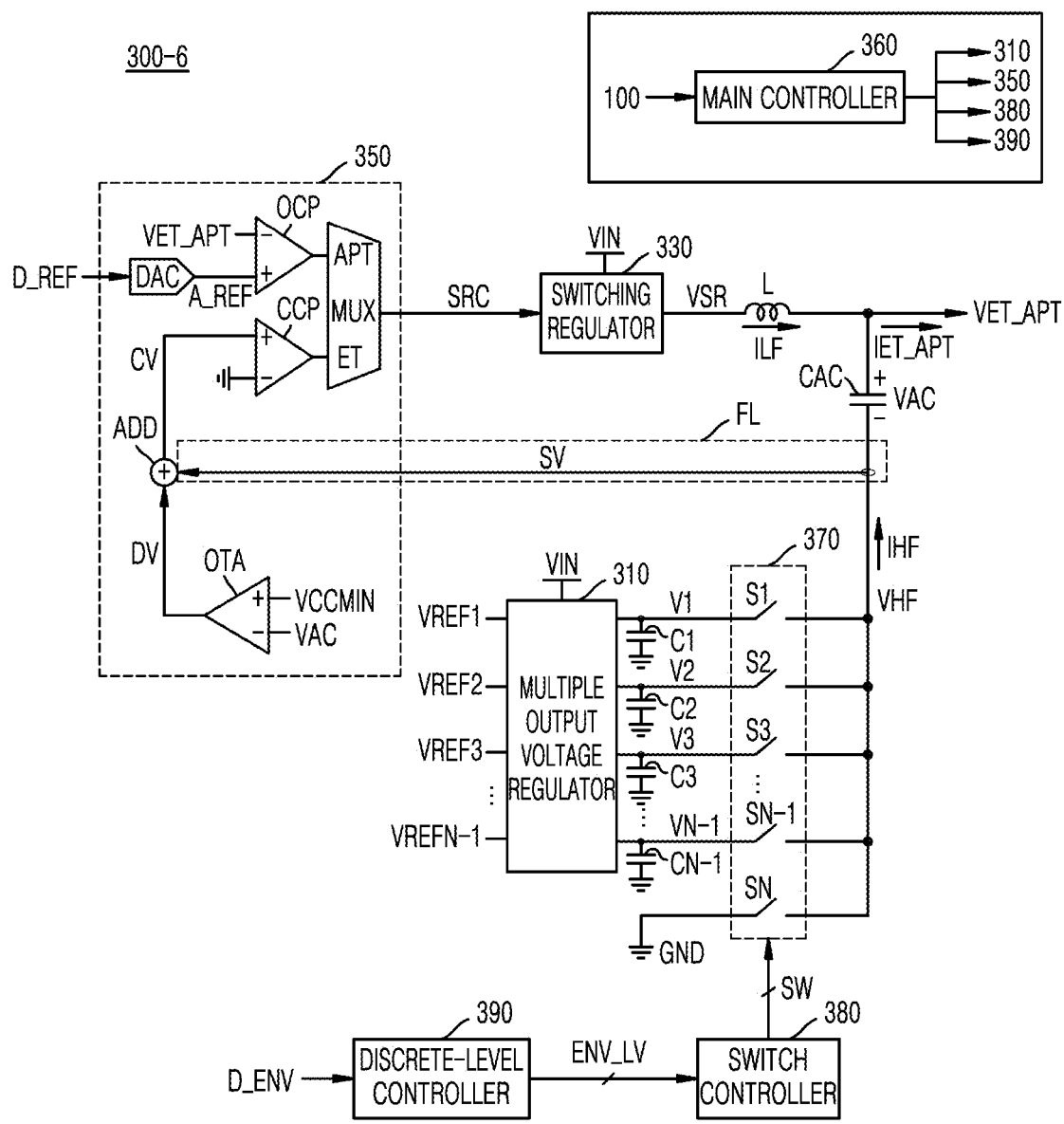
FIG. 26 is a circuit diagram illustrating a sixth example of a supply modulator included in a wireless communication apparatus according to embodiments of the inventive concepts.

FIG. 26 is a circuit diagram illustrating a sixth example of a supply modulator 300-6 included in a wireless communication apparatus according to embodiments of the inventive concepts. FIG. 27 is a diagram illustrating an APT mode operation of the supply modulator 300-6 of FIG. 26. FIG. 28 is a diagram illustrating a DL-ET mode operation of the supply modulator 300-6 of FIG. 26.

Hereinafter, for convenience of explanation, it is assumed that the supply modulator 300-6 is implemented as the supply modulator 300 of the wireless communication apparatus 1 shown in FIG. 1. Also, FIG. 26 will be described with reference to FIG. 1. In addition, as the supply modulator 300-6 of FIG. 26 and the supply modulator 300-5 of FIG. 18 are the same or similar except for some structures and mechanisms, differences thereof will be mainly described below.

Referring to FIG. 26, the sixth example of the supply modulator 300 (that is, the supply modulator 300-6) according to embodiments of the inventive concepts may include the multiple output voltage regulator 310, the switching regulator 330, the switching regulator controller 350, the main controller 360, the switch array 370, the switch controller 380, and/or the discrete-level controller 390.

In detail, unlike the supply modulator 300-5 of FIG. 18, the supply modulator 300-6 of FIG. 26 may not include the linear regulator LA.

Accordingly, the supply modulator 300-6 may operate in the DL-ET mode or the APT mode.

First, the switching regulator 330 may operate together with the multiple output voltage regulator 310 to generate the output voltage VET_APT in the DL-ET mode, and may operate to generate the output voltage VET_APT in the APT mode.

Also, in the DL-ET mode, the switching regulator controller 350 may sense the output current IHF of the multiple output voltage regulator 310 and control the switching regulator 330 based on the sensing value SV.

In detail, in the DL-ET mode, the feedback loop FL of the switching regulator controller 350 may sense the output current IHF of the multiple output voltage regulator 310 and provide the sensing value SV to the summer ADD.

Also, in the APT mode, the multiplexer MUX of the switching regulator controller 350 may output the output of the output comparator OCP to the switching regulator 330 as the switching regulator control signal SRC, and in the DL-ET mode, the multiplexer MUX of the switching regulator 330 may output the output of the compensation comparator CCP to the switching regulator 330 as the switching regulator control signal SRC.

The main controller 360 may generate and provide the plurality of reference output voltage signals VREF1 to VREFN−1 to the multiple output voltage regulator 310. In addition, the main controller 360 may generate and provide the target voltage signal VCCMIN of the coupling capacitor CAC to the switching regulator controller 350. Also, the main controller 360 may determine a tracking mode and control at least one of the multiple output voltage regulator 310, the switch controller 380, the switching regulator controller 350, and/or the discrete-level controller 390 according to the determined tracking mode.

The main controller 360 may receive various signals (e.g., various control signals such as an output voltage level signal or the like) other than the tracking mode determination signal from the modem 100 through the MIPI (130 of FIG. 1) and control components such as the multiple output voltage regulator 310, the switch controller 380, the switching regulator controller 350, and the discrete-level controller 390 based on the received various signals.

For reference, in FIG. 26, the main controller 360 is illustrated as controlling at least one of the multiple output voltage regulator 310, the switch controller 380, the switching regulator controller 350, and/or the discrete-level controller 390, but is not limited thereto. That is, the main controller 360 may control operations of components other than the above-stated components.

However, for convenience of explanation, in embodiments of the inventive concepts, a case where the main controller 360 controls at least one of the multiple output voltage regulator 310, the switch controller 380, the switching regulator controller 350, and/or the discrete-level controller 390 is described as an example.

As described above, as the supply modulator 300-6 has the above-described structures and characteristics, the circuit area and the manufacturing cost thereof may be reduced compared to the supply modulator 300-5 of FIG. 18. In addition, based on the structures and the characteristics, the supply modulator 300-6 may be driven in any one tracking mode of the DL-ET mode or the APT mode, and provide the output voltage VET_APT to the power amplifier PA.

Figure 27:
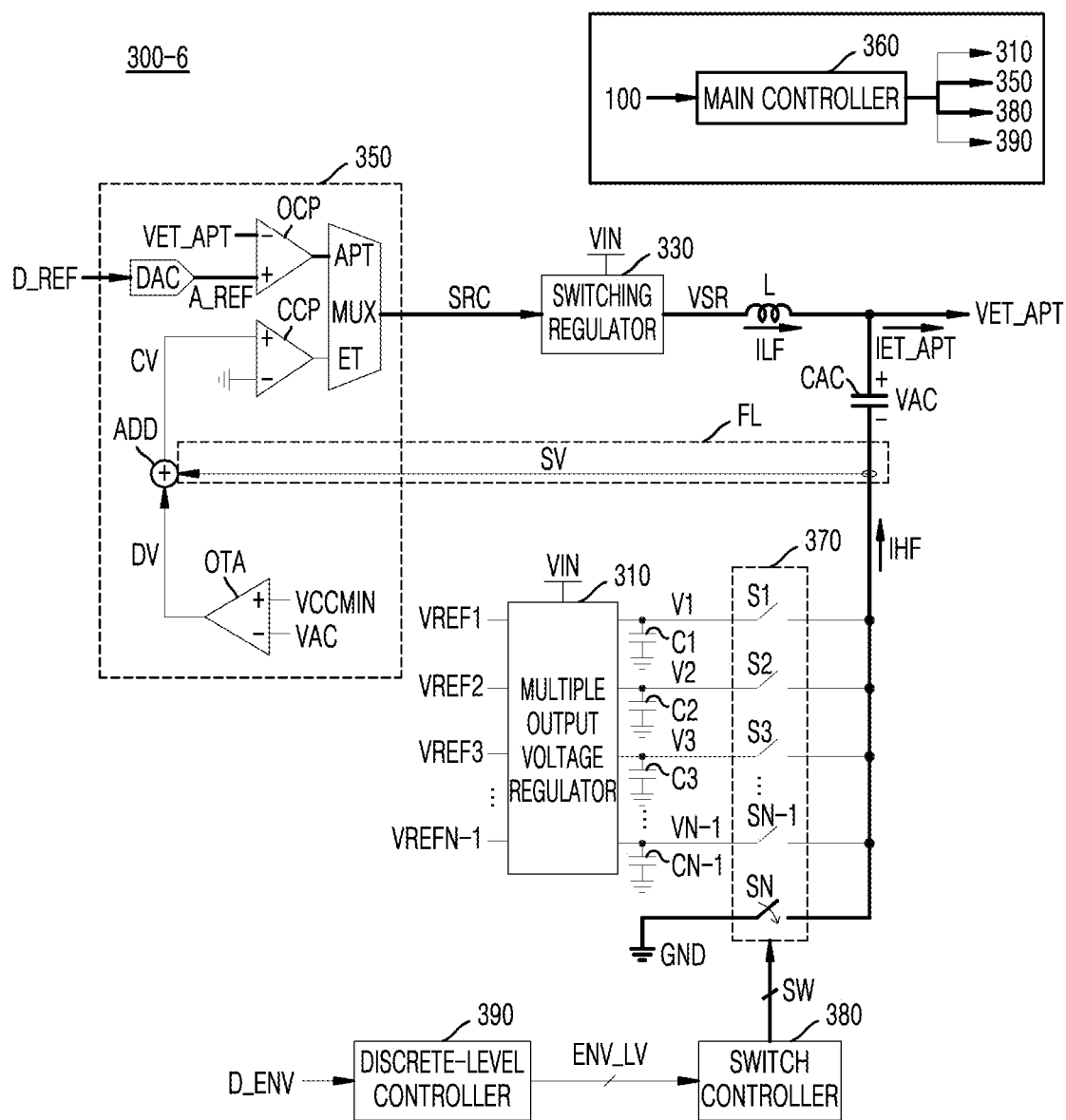
FIG. 27 is a diagram illustrating an APT mode operation of the supply modulator of FIG. 26.
Figure 28:
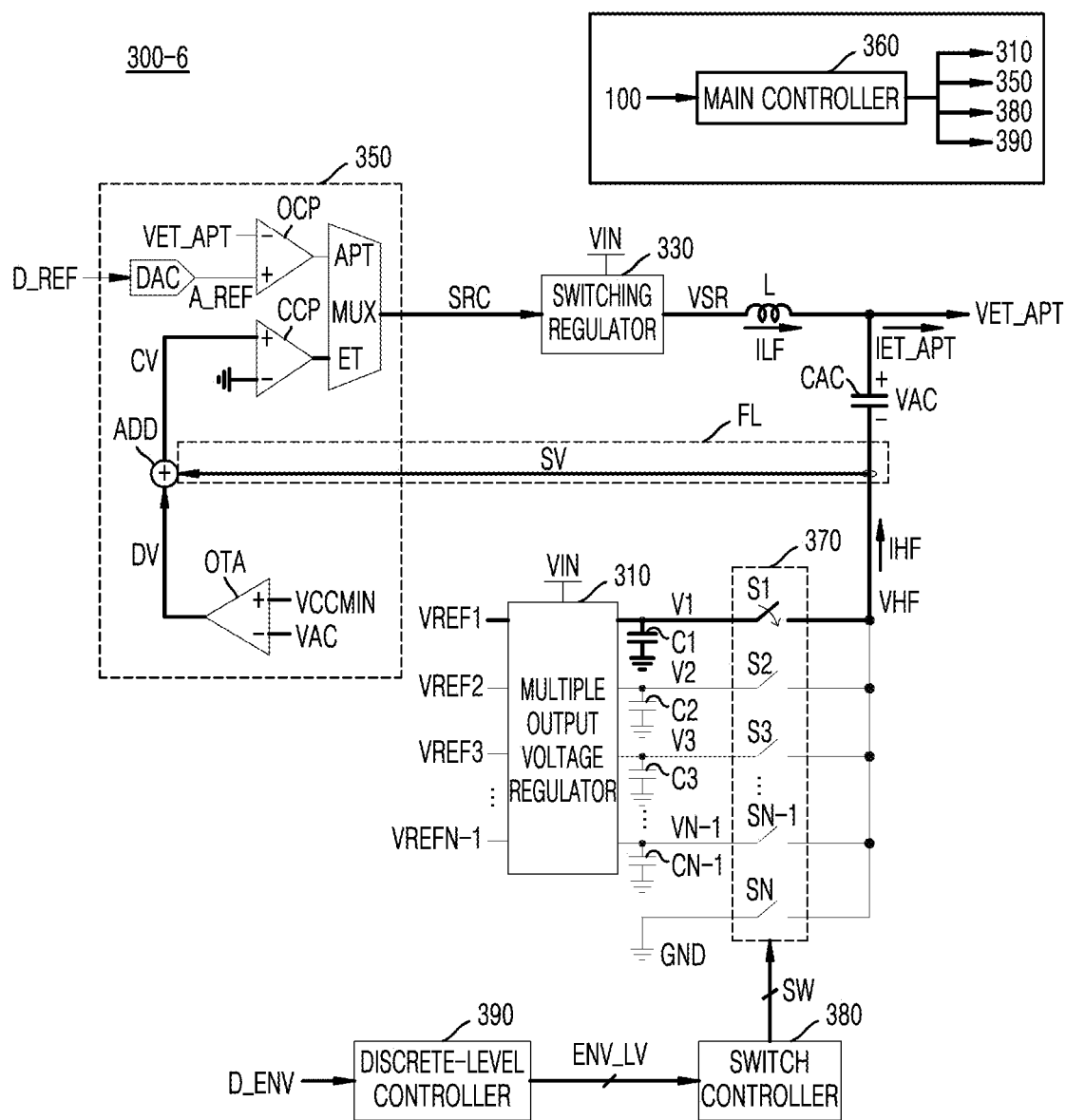
FIG. 28 is a diagram illustrating a DL-ET mode operation of the supply modulator of FIG. 26.

For reference, operation activation paths according to the APT mode and the DL-ET mode of the supply modulator 300-6 of FIG. 26 are respectively shown in FIGS. 27 and 28.

However, as the operation of the supply modulator 300-6 in the APT mode of FIG. 27 is the same as or similar to the operation described in FIG. 23, and the operation of the supply modulator 300-6 in the DL-ET mode of FIG. 28 is the same as or similar to the operation described in FIG. 24, detailed descriptions thereof will be omitted.

As described above, as the supply modulator 300-6 operates according to the APT mode or the DL-ET mode based on the above-described principles, hereinafter, referring to FIG. 29, a seventh example of a supply modulator according to embodiments of the inventive concepts will be described.

Figure 29:
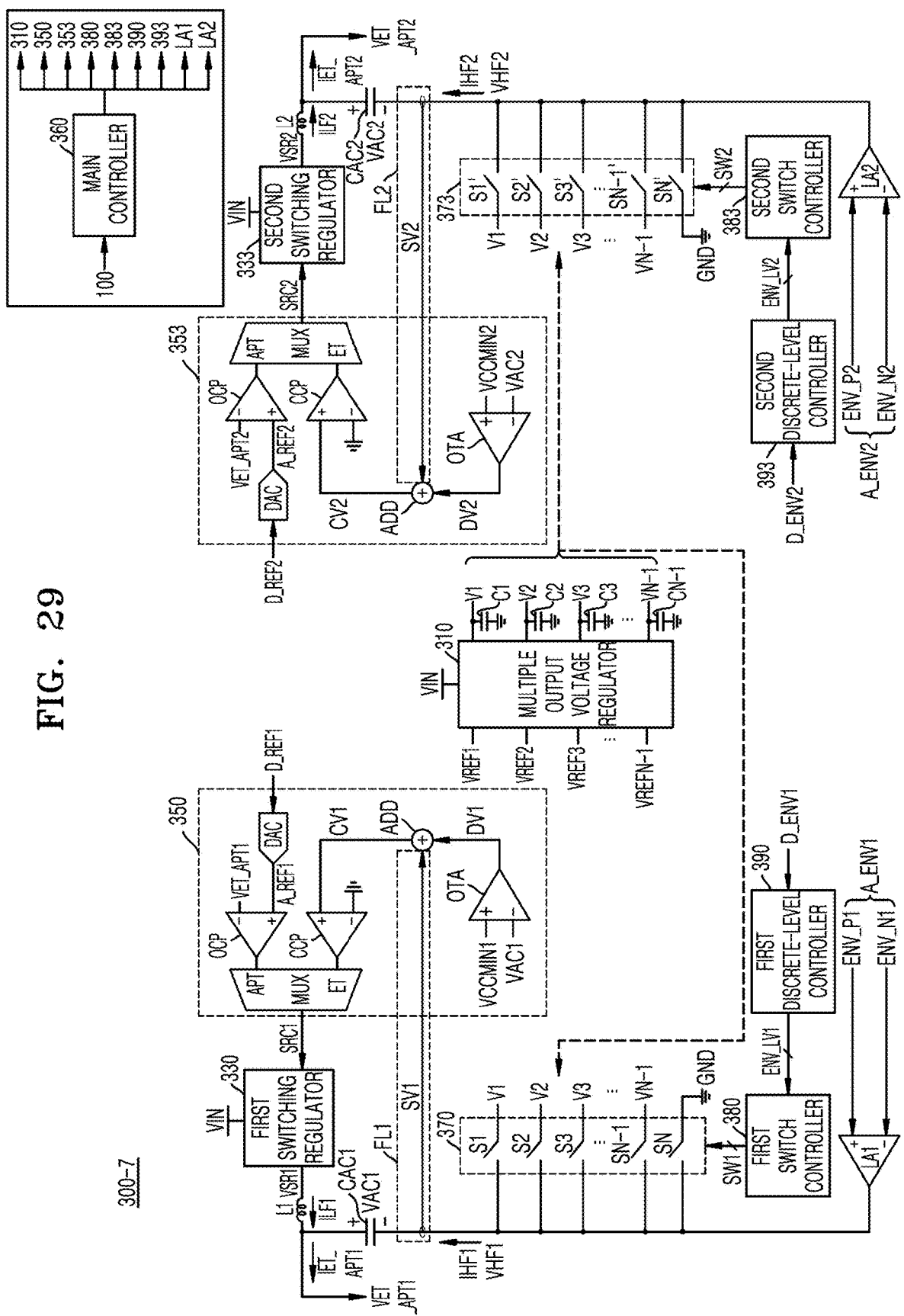
FIG. 29 is a circuit diagram illustrating a seventh example of a supply modulator included in a wireless communication apparatus according to embodiments of the inventive concepts.

FIG. 29 is a circuit diagram illustrating a seventh example of a supply modulator 300-7 included in a wireless communication apparatus according to embodiments of the inventive concepts.

For reference, hereinafter, for convenience of explanation, it is assumed that the supply modulator 300-7 is implemented as the supply modulator 300 of the wireless communication apparatus 1 shown in FIG. 1. In addition, as the supply modulator 300-7 of FIG. 29 and the supply modulator 300-5 of FIG. 18 are the same or similar except for some structures and mechanisms, differences thereof will be mainly described below.

Referring to FIG. 29, the seventh example of the supply modulator 300 (that is, the supply modulator 300-7) according to embodiments of the inventive concepts may include the multiple output voltage regulator 310, the first and second switching regulators 330 and 333, the first and second linear regulators LA1 and LA2, the first and second switching regulator controllers 350 and 353, the main controller 360, the first and second switch arrays 370 and 373, the first and second switch controllers 380 and 383, the first and second discrete-level controllers 390 and 393, and/or first and second coupling capacitors CAC1 and CAC2.

In detail, the supply modulator 300-7 of FIG. 29 may supply the first and second output voltages VET_APT1 and VET_APT2 to a plurality of power amplifiers (when there are power amplifiers PA of FIG. 1; e.g., first and second power amplifiers).

Accordingly, in the case of the supply modulator 300-7 of FIG. 29, compared to the supply modulator 300-5 of FIG. 18, the number of each of the switching regulators, linear regulators, switching regulator controllers, switch arrays, switch controllers, discrete-level controllers, and coupling capacitors may be greater than one.

In addition, as the supply modulator 300-7 of FIG. 29 receives more signals than the supply modulator 300-5 of FIG. 18, the supply modulator 300-7 may receive the first and second average power signal D_REF1 and D_REF2, the first and second analog envelope signals A_ENV1 and A_ENV2, and the first and second digital envelope signals D_ENV1 and D_ENV2 from the modem (100 of FIG. 1).

Also, in the supply modulator 300-7 of FIG. 29, as the plurality of capacitors C1 to CN−1 of the multiple output voltage regulator 310 are connected to both sides of the first and second power amplifiers, the plurality of capacitors C1 to CN−1 of the multiple output voltage regulator 310 may be shared for generation operations of each of the first and second output voltages VET_APT1 and VET_APT2. Accordingly, the main controller 360 may commonly generate the plurality of reference output voltage signals VREF1 to VREFN−1 for each of the first and second output voltages VET_APT1 and VET_APT2 and provide the same to the multiple output voltage regulator 310.

However, in the supply modulator 300-7 of FIG. 29, the first coupling capacitor CAC1 may be connected to the first power amplifier, and the second coupling capacitor CAC2 may be connected to the second power amplifier. Accordingly, the main controller 360 may separately generate target voltage signals VCCMIN1 and VCCMIN2 for each of the first and second coupling capacitors CAC1 and CAC2 and respectively provide the same to first and second OTAs OTA1 and OTA2.

For reference, when each of the target voltage signals VCCMIN1 and VCCMIN2 is set differently from each other, voltages VAC1 and VAC2 of each of the first and second coupling capacitors CAC1 and CAC2 may also be different from each other. Accordingly, although the multiple output voltage regulator 310 commonly generates and outputs the plurality of voltages V1 to VN−1 for each of the first and second output voltages VET_APT1 and VET_APT2, the range of the first and second output voltages VET_APT1 and VET_APT2 respectively provided to the first and second power amplifier may be different from each other. That is, in the case of a power amplifier, as an optimized or improved power supply voltage range thereof is different depending on the RF carrier frequency, manufacturer, or the like, in the supply modulator 300-7 according to embodiments of the inventive concepts, a difference may be given to a range of the first and second output voltages VET_APT1 and VET_APT2 respectively for the first and second power amplifiers by providing a difference to the voltages VAC1 and VAC2 of each of the first and second coupling capacitors CAC1 and CAC2. In addition, through this difference, the power efficiency of each of the first and second power amplifiers may be individually optimized or improved.

As described above, in embodiments of the inventive concepts, even in a case of generating a plurality of power supply voltages for power amplifiers, as the number of output capacitors occupying a large proportion of the circuit area is the same as or similar to a case of generating a power supply voltage for a single power amplifier, an increase in circuit area may be minimized or reduced.

For convenience of explanation, it is assumed that the first linear regulator LA1, the first switching regulator 330, the first switching regulator controller 350, the first switch array 370, the first discrete-level controller 390, the first switch controller 380, and the first coupling capacitor CAC1 form a first modulation circuit, and the second linear regulator LA2, the second switching regulator 333, the second switching regulator controller 353, the second switch array 373, the second discrete-level controller 393, the second switch controller 383, and the second coupling capacitor CAC2 form a second modulation circuit, a brief description of each component of the supply modulator 300-7 is as follows.

The first modulation circuit may include the first linear regulator LA1 and the first switching regulator 330, wherein the first linear regulator LA1 operates to generate the first output voltage VET_APT1 based on the first analog envelope signal A_ENV1 received from the modem (100 of FIG. 1) in the CL-ET mode, and the first switching regulator 330 operates together with the multiple output voltage regulator 310 to generate the first output voltage VET_APT1 in the DL-ET mode, operates together with the first linear regulator LA1 to generate the first output voltage VET_APT1 in the CL-ET mode, and operates to generate the first output voltage VET_APT1 in the APT mode. In addition, the first modulation circuit may include the first switching regulator controller 350 selectively sensing any one output current IHF1 of an output current of the multiple output voltage regulator 310 and an output current of the first linear regulator LA1 and controlling the first switching regulator 330 based on a sensing value SV1. Also, the first modulation circuit may include the first switch array 370 including the plurality of switches S1 to SN. The first switch array 370 may select and provide one of the plurality of voltages V1 to VN−1 having different levels from each other and the ground voltage GND to the first power amplifier through the plurality of switches S1 to SN. For reference, any one switch SN among the plurality of switches S1 to SN may be connected to the ground voltage GND, and the remaining switches S1 to SN−1 among the plurality of switches S1 to SN may be connected to the multiple output voltage regulator 310 to respectively correspond to the plurality of voltages V1 to VN−1 having different levels from each other output from the multiple output voltage regulator 310. In addition, the first modulation circuit may include the first discrete-level controller 390 generating a first level control signal ENV_LV1 including multiple pieces of envelope level information based on the first digital envelope signal D_ENV1 provided from the modem (100 of FIG. 1), and the first switch controller 380 receiving the first level control signal ENV_LV1 from the first discrete-level controller 390 and controlling a switching operation of the plurality of switches S1 to SN based on the first level control signal ENV_LV1 received from the first discrete-level controller 390. Also, an end of the first modulation circuit may be connected to the first linear regulator LA1 and the first switch array 370, and the other end thereof may include the first coupling capacitor CAC1 connected to the first power amplifier (e.g., between the inductor L1 of the first switching regulator 330 and a first output end of the supply modulator 300-7 (an output end of the first output voltage VET_APT1).

The second modulation circuit may include the second linear regulator LA2 and the second switching regulator 333, wherein the second linear regulator LA2 operates to generate the second output voltage VET_APT2 based on the second analog envelope signal A_ENV2 received from the modem (100 of FIG. 1) in the CL-ET mode, and the second switching regulator 333 operates together with the multiple output voltage regulator 310 to generate the second output voltage VET_APT2 in the DL-ET mode, operates together with the second linear regulator LA2 to generate the second output voltage VET_APT2 in the CL-ET mode, and operates to generate the second output voltage VET_APT2 in the APT mode. In addition, the second modulation circuit may include the second switching regulator controller 353 selectively sensing any one output current IHF2 of an output current of the multiple output voltage regulator 310 and an output current of the second linear regulator LA2 and controlling the second switching regulator 333 based on a sensing value SV2. Also, the second modulation circuit may include the second switch array 373 including the plurality of switches S1' to SN'. The second switch array 373 may select and provide one of the plurality of voltages V1 to VN−1 having different levels from each other and the ground voltage GND to the second power amplifier through the plurality of switches S1' to SN'. For reference, any one switch SN' of the plurality of switches S1' to SN' may be connected to the ground voltage GND, and the remaining switches S1' to SN−1' of the plurality of switches S1' to SN' may be connected to the multiple output voltage regulator 310 to respectively correspond to the plurality of voltages V1 to VN−1 having different levels from each other output from the multiple output voltage regulator 310. In addition, the second modulation circuit may include the second discrete-level controller 393 generating a second level control signal ENV_LV2 including multiple pieces of envelope level information based on the second digital envelope signal D_ENV2 provided from the modem 100, and the second switch controller 383 receiving the second level control signal ENV_LV2 from the second discrete-level controller 393 and controlling a switching operation of the plurality of switches S1' to SN' based on the second level control signal ENV_LV2 received from the second discrete-level controller 393. Also, an end of the second modulation circuit may be connected to the second linear regulator LA2 and the second switch array 373, and the other end thereof may include the second coupling capacitor CAC2 connected to the second power amplifier (e.g., between the inductor L2 of the second switching regulator 333 and a second output end of the supply modulator 300-7 (an output end of the second output voltage VET_APT2).

In the DL-ET mode, the multiple output voltage regulator 310 may output the plurality of voltages V1 to VN−1 having different levels from each other to respectively correspond to the plurality of reference output voltage signals VREF1 to VREFN−1 to generate the first or second output voltage VET_APT1 or VET_APT2. That is, the multiple output voltage regulator 310 may operate in parallel with a switching regulator operating in the DL-ET mode from among the first and second switching regulators 330 and 333.

The main controller 360 may generate and provide the plurality of reference output voltage signals VREF1 to VREFN−1 to the multiple output voltage regulator 310. Also, the main controller 360 may generate and provide the target voltage signal VCCMIN1 of the first coupling capacitor CAC1 to the first switching regulator controller 350. In addition, the main controller 360 may generate and provide the target voltage signal VCCMIN2 of the second coupling capacitor CAC2 to the second switching regulator controller 353. In addition, the main controller 360 may determine a tracking mode for each of the first and second power amplifiers. That is, the main controller 360 may determine different tracking modes for each of the first and second power amplifiers, or may determine the same tracking mode or similar tracking modes for each of the first and second power amplifiers. Also, the main controller 360 may control at least one of the first and second linear regulators LA1 and LA2, the first and second switch controllers 380 and 383, the first and second switching regulator controllers 350 and 353, the first and second discrete-level controllers 390 and 393, and/or the multiple output voltage regulator 310 based on the determined tracking mode.

Each component may include a component-dedicated controller (e.g., the first and second switching regulator controller 350 and 353) therein or outside, and each dedicated controller may be controlled by the main controller 360. In addition, there may be a controller that integrates and controls at least two components, and the corresponding controller may be controlled by the main controller 360.

As described above, based on the above-described structures and characteristics, the supply modulator 300-7 may be driven in at least one tracking mode of the DL-ET mode, the CL-ET mode, and/or the APT mode and respectively provide the first and second output voltages VET_APT1 and VET_APT2 to the first and second power amplifiers on the same principles as that, or similar principles to those, of the supply modulator 300-5 of FIG. 18.

For reference, the supply modulator 300-7 is shown as including components that are bilaterally symmetrical with respect to the multiple output voltage regulator 310. However, the supply modulator 300-7 of FIG. 29 may include components that are bilaterally asymmetrical with respect to the multiple output voltage regulator 310. For example, each of a linear regulator, a switching regulator, a switching regulator controller, a switch array, a switch controller, a discrete-level controller, and a coupling capacitor, or the like may be provided by two on the left side of the drawing, but as shown on the right side of the drawing, each of a linear regulator, a switching regulator, a switching regulator controller, a switch array, a switch controller, and a discrete-level controller, a coupling capacitor, or the like may be provided by one. However, for convenience of explanation, a case where the supply modulator 300-7 includes components that are bilaterally symmetrical with respect to the multiple output voltage regulator 310 will be described as an example.

Figure 30:
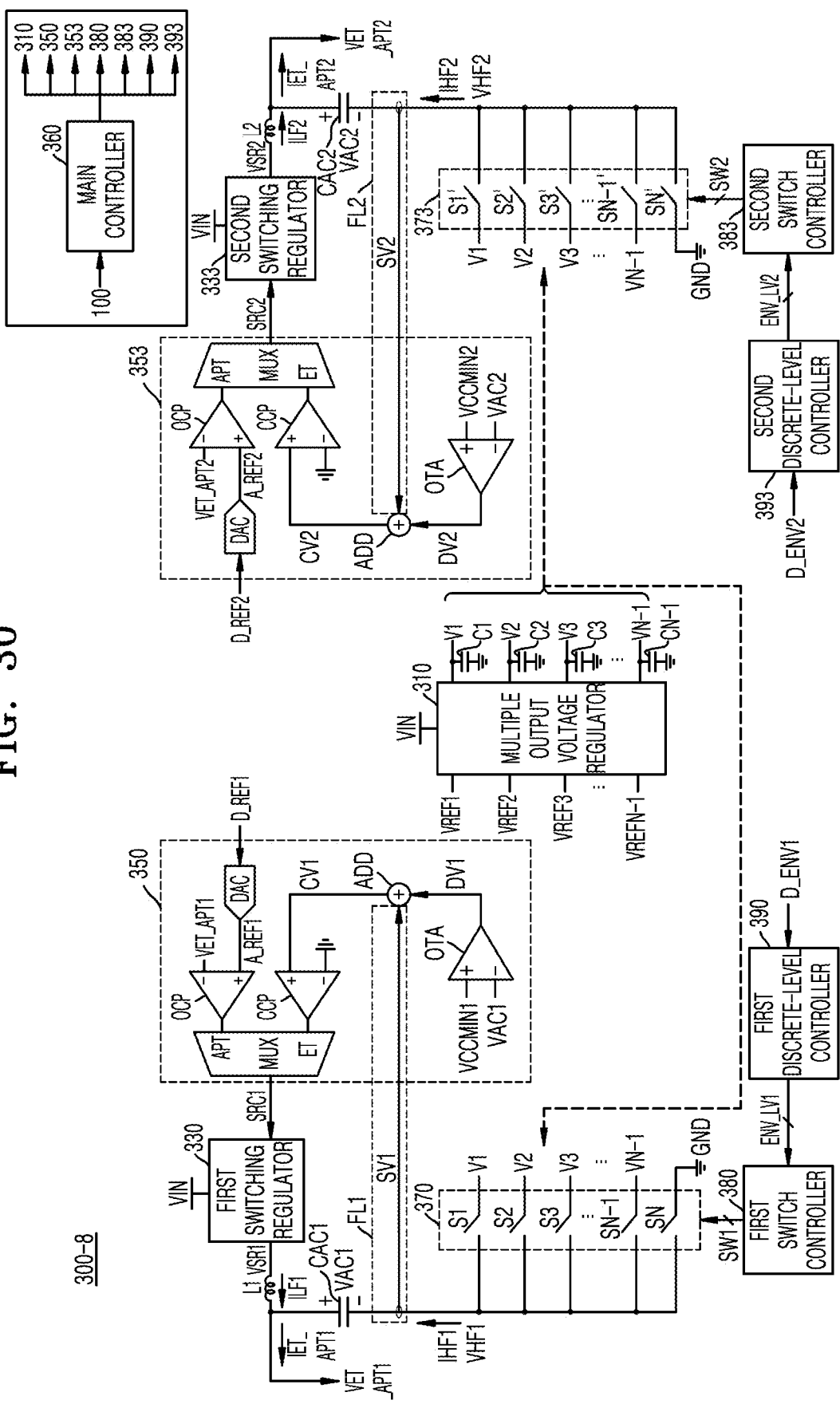
FIG. 30 is a circuit diagram illustrating an eighth example of a supply modulator included in a wireless communication apparatus according to embodiments of the inventive concepts.

FIG. 30 is a circuit diagram illustrating an eighth example of a supply modulator 300-8 included in a wireless communication apparatus according to embodiments of the inventive concepts.

For reference, hereinafter, for convenience of explanation, it is assumed that the supply modulator 300-8 is implemented as the supply modulator 300 of the wireless communication apparatus 1 shown in FIG. 1. In addition, the supply modulator 300-8 of FIG. 30 and the supply modulator 300-6 of FIG. 26 are the same or similar except for some structures and mechanisms, differences thereof will be mainly described below.

Referring to FIG. 30, the eighth example of the supply modulator 300 (that is, the supply modulator 300-8) according to embodiments of the inventive concepts may include the multiple output voltage regulator 310, the first and second switching regulators 330 and 333, the first and second switching regulator controllers 350 and 353, the main controller 360, the first and second switch arrays 370 and 373, the first and second switch controllers 380 and 383, the first and second discrete-level controllers 390 and 393, and/or the first and second coupling capacitors CAC1 and CAC2.

In detail, the supply modulator 300-8 of FIG. 30 may supply the first and second output voltages VET_APT1 and VET_APT2 to a plurality of power amplifiers (when there are power amplifiers PA of FIG. 1; e.g., first and second power amplifiers).

Accordingly, in the case of the supply modulator 300-8 of FIG. 30, compared to the supply modulator 300-6 of FIG. 26, the number of each of the switching regulators, the switching regulator controllers, the switch arrays, the switch controllers, the discrete-level controllers, and the coupling capacitors may be greater than one.

In addition, as the supply modulator 300-8 of FIG. 30 receives more signals than the supply modulator 300-6 of FIG. 26, the supply modulator 300-8 may receive the first and second average power signal D_REF1 and D_REF2, the first and second analog envelope signals A_ENV1 and A_ENV2, and the first and second digital envelope signals D_ENV1 and D_ENV2 from the modem (100 of FIG. 1).

Also, in the supply modulator 300-8 of FIG. 30, as the plurality of capacitors C1 to CN−1 of the multiple output voltage regulator 310 are connected to both sides of the first and second power amplifiers, the plurality of capacitors C1 to CN−1 of the multiple output voltage regulator 310 may be shared for generation operations of each of the first and second output voltages VET_APT1 and VET_APT2. Accordingly, the main controller 360 may commonly generate the plurality of reference output voltage signals VREF1 to VREFN−1 for each of the first and second output voltages VET_APT1 and VET_APT2 and provide the same to the multiple output voltage regulator 310.

However, in the supply modulator 300-8 of FIG. 30, the first coupling capacitor CAC1 may be connected to the first power amplifier, and the second coupling capacitor CAC2 may be connected to the second power amplifier. Accordingly, the main controller 360 may separately generate target voltage signals VCCMIN1 and VCCMIN2 for each of the first and second coupling capacitors CAC1 and CAC2 and respectively provide the same to first and second OTAs OTA1 and OTA2.

For reference, when each of the target voltage signals VCCMIN1 and VCCMIN2 is set differently from each other, voltages VAC1 and VAC2 of each of the first and second coupling capacitors CAC1 and CAC2 may also be different from each other. In this case, although the multiple output voltage regulator 310 commonly generates and outputs the plurality of voltages V1 to VN−1 for each of the first and second output voltages VET_APT1 and VET_APT2, the range of the first and second output voltages VET_APT1 and VET_APT2 respectively provided to the first and second power amplifier may be different from each other. That is, in the case of a power amplifier, as an optimized or improved power supply voltage range thereof is different depending on the RF carrier frequency, manufacturer, or the like, in the supply modulator 300-8 according to embodiments of the inventive concepts, a difference may be given to a range of the first and second output voltages VET_APT1 and VET_APT2 respectively for the first and second power amplifiers by providing a difference to the voltages VAC1 and VAC2 of each of the first and second coupling capacitors CAC1 and CAC2. In addition, through this difference, the power efficiency of each of the first and second power amplifiers may be individually optimized or improved.

As described above, in embodiments of the inventive concepts, even in a case of generating a plurality of power supply voltages for power amplifiers, as the number of output capacitors occupying a large proportion of the circuit area is the same as or similar to a case of generating a power supply voltage for a single power amplifier, an increase in circuit area may be minimized or reduced.

For convenience of explanation, it is assumed that the first switching regulator 330, the first switching regulator controller 350, the first switch array 370, the first discrete-level controller 390, the first switch controller 380, and the first coupling capacitor CAC1 form a first modulation circuit, and the second switching regulator 333, the second switching regulator controller 353, the second switch array 373, the second discrete-level controller 393, the second switch controller 383, and the second coupling capacitor CAC2 form a second modulation circuit, a brief description of each component of the supply modulator 300-8 is as follows.

The first modulation circuit may include the first switching regulator 330 operating together with the multiple output voltage regulator 310 to generate the first output voltage VET_APT1 in the DL-ET mode and operating to generate the first output voltage VET_APT1 in the APT mode. In addition, the first modulation circuit may include the first switching regulator controller 350 sensing an output current of the multiple output voltage regulator 310 and controlling the first switching regulator 330 based on the sensing value SV1. Also, the first modulation circuit may include the first switch array 370 including the plurality of switches S1 to SN. The first switch array 370 may select and provide one of the plurality of voltages V1 to VN−1 having different levels from each other and the ground voltage GND to the first power amplifier through the plurality of switches S1 to SN. For reference, any one switch SN among the plurality of switches S1 to SN may be connected to the ground voltage GND, and the remaining switches S1 to SN−1 among the plurality of switches S1 to SN may be connected to the multiple output voltage regulator 310 to respectively correspond to the plurality of voltages V1 to VN−1 having different levels from each other output from the multiple output voltage regulator 310. In addition, the first modulation circuit may include the first discrete-level controller 390 generating a first level control signal ENV_LV1 including multiple pieces of envelope level information based on the first digital envelope signal D_ENV1 provided from the modem (100 of FIG. 1), and the first switch controller 380 receiving the first level control signal ENV_LV1 from the first discrete-level controller 390 and controlling a switching operation of the plurality of switches S1 to SN based on the first level control signal ENV_LV1 received from the first discrete-level controller 390. Also, an end of the first modulation circuit may be connected to the first switch array 370, and the other end thereof may include the first coupling capacitor CAC1 connected to the first power amplifier (e.g., between the inductor L1 of the first switching regulator 330 and a first output end of the supply modulator 300-8 (an output end of the first output voltage VET_APT1).

The second modulation circuit may include the second switching regulator 333 operating together with the multiple output voltage regulator 310 to generate the second output voltage VET_APT2 in the DL-ET mode and operating to generate the second output voltage VET_APT2 in the APT mode. In addition, the second modulation circuit may include the second switching regulator controller 353 sensing the output current of the multiple output voltage regulator 310 and controlling the second switching regulator 333 based on the sensing value SV2. Also, the second modulation circuit may include the second switch array 373 including the plurality of switches S1' to SN'. The second switch array 373 may select and provide one of the plurality of voltages V1 to VN−1 having different levels from each other and the ground voltage GND to the second power amplifier through the plurality of switches S1' to SN'. For reference, any one switch SN' of the plurality of switches S1' to SN' may be connected to the ground voltage GND, and the remaining switches S1' to SN−1' of the plurality of switches S1' to SN' may be connected to the multiple output voltage regulator 310 to respectively correspond to the plurality of voltages V1 to VN−1 having different levels from each other output from the multiple output voltage regulator 310. In addition, the second modulation circuit may include the second discrete-level controller 393 generating the second level control signal ENV_LV2 including multiple pieces of envelope level information based on the second digital envelope signal D_ENV2 provided from the modem 100, and the second switch controller 383 receiving the second level control signal ENV_LV2 from the second discrete-level controller 393 and controlling the switching operation of the plurality of switches S1' to SN' based on the second level control signal ENV_LV2 received from the second discrete-level controller 393. Also, an end of the second modulation circuit may be connected to the second switch array 373, and the other end thereof may include the second coupling capacitor CAC2 connected to the second power amplifier (e.g., between the inductor L2 of the second switching regulator 333 and a second output end of the supply modulator 300-8 (an output end of the second output voltage VET_APT2).

In the DL-ET mode, the multiple output voltage regulator 310 may output the plurality of voltages V1 to VN−1 having different levels from each other to respectively correspond to the plurality of reference output voltage signals VREF1 to VREFN−1 to generate the first or second output voltage VET_APT1 or VET_APT2. That is, the multiple output voltage regulator 310 may operate in parallel with a switching regulator operating in the DL-ET mode from among the first and second switching regulators 330 and 333.

The main controller 360 may generate and provide the plurality of reference output voltage signals VREF1 to VREFN−1 to the multiple output voltage regulator 310. Also, the main controller 360 may generate and provide the target voltage signal VCCMIN1 of the first coupling capacitor CAC1 to the first switching regulator controller 350. In addition, the main controller 360 may generate and provide the target voltage signal VCCMIN2 of the second coupling capacitor CAC2 to the second switching regulator controller 353. In addition, the main controller 360 may determine a tracking mode for each of the first and second power amplifiers. That is, the main controller 360 may determine different tracking modes for each of the first and second power amplifiers, or may determine the same tracking mode or similar tracking modes for each of the first and second power amplifiers. Also, the main controller 360 may control at least one of the first and second switch controllers 380 and 383, the first and second switching regulator controllers 350 and 353, the first and second discrete-level controllers 390 and 393, and/or the multiple output voltage regulator 310 based on the determined tracking mode.

Each component may include a component-dedicated controller (e.g., the first and second switching regulator controller 350 and 353) therein or outside, and each dedicated controller may be controlled by the main controller 360. In addition, there may be a controller that integrates and controls at least two components, and the corresponding controller may be controlled by the main controller 360.

As described above, based on the above-described structures and characteristics, the supply modulator 300-8 may be driven in at least one tracking mode of the DL-ET and/or the APT mode, and respectively provide the first and second output voltages VET_APT1 and VET_APT2 to the first and second power amplifiers on the same principles as that, or similar principles to those, of the supply modulator 300-6 of FIG. 26.

For reference, the supply modulator 300-8 is shown as including components that are bilaterally symmetrical with respect to the multiple output voltage regulator 310. However, the supply modulator 300-8 of FIG. 30 may include components that are bilaterally asymmetrical with respect to the multiple output voltage regulator 310. For example, a linear regulator may not be provided on the left side of the drawing as shown, but a linear regulator may be additionally provided on the right side of the drawing. However, for convenience of explanation, a case where the supply modulator 300-8 includes components that are bilaterally asymmetrical with respect to the multiple output voltage regulator 310 is described as an example.

Figure 31:
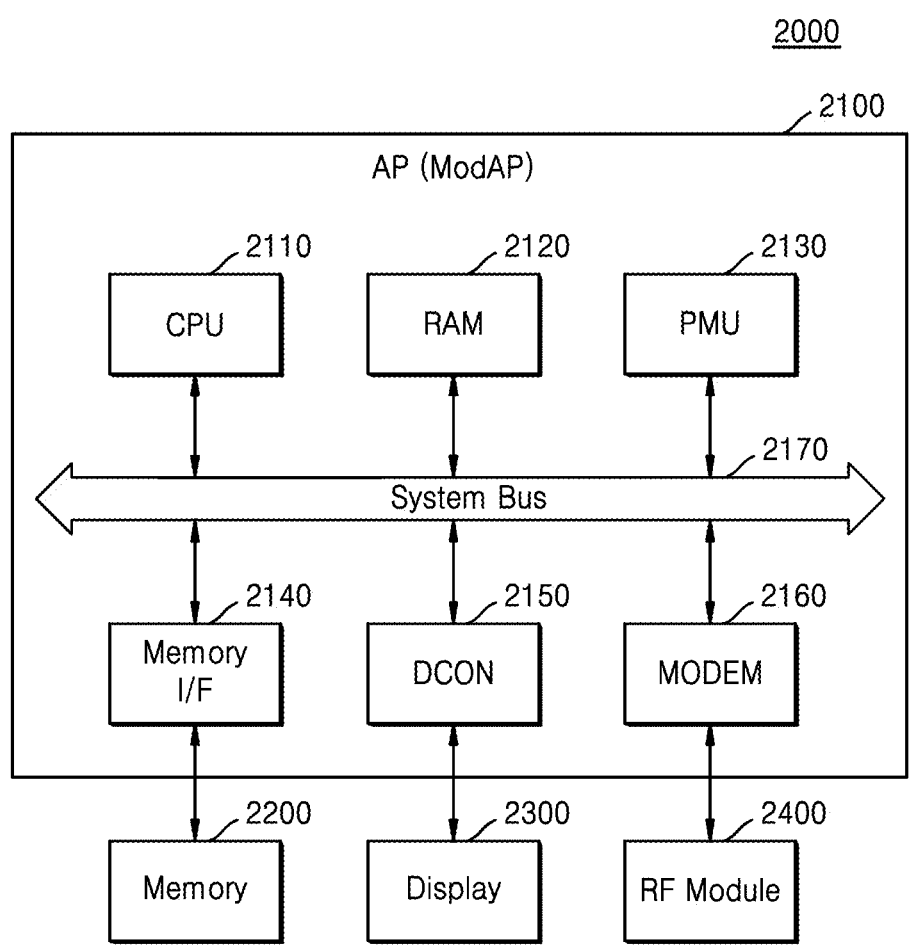
FIG. 31 is a block diagram of a mobile terminal to which a wireless communication apparatus is applied according to embodiments of the inventive concepts.

FIG. 31 is a block diagram of a mobile terminal 2000 to which a wireless communication apparatus according to embodiments of the inventive concepts is applied.

Referring to FIG. 30, the mobile terminal 2000 may include an application processor (AP) 2100, a memory 2200, a display 2300, and/or a RF module 2400. In addition, the mobile terminal 2000 may further include various components such as lenses, sensors, audio modules, or the like.

The AP 2100 may be implemented as a system-on-a-chip (SoC), and may include a central processing unit (CPU) 2110, a random access memory (RAM) 2120, a power management unit (PMU) 2130, a memory interface (I/F) 2140, a display controller (DCON) 2150, a modem 2160, and/or a system bus 2170. The AP 2100 may further include various internet protocols (IP). The AP 2100 may be referred to as a ModAP as a function of a modem chip is integrated therein.

The CPU 2110 may control all operations of the AP 2100 and the mobile terminal 2000. The CPU 2110 may control an operation of each component of the AP 2100. In addition, the CPU 2110 may be implemented as a multi-core. The multi-core is a computing component with two or more independent cores.

The RAM 2120 may temporarily store programs, data, or instructions. For example, the programs and/or data stored in the memory 2200 may be temporarily stored in the RAM 2120 according to a control of the CPU 2110 or a booting code. The RAM may be implemented as a dynamic RAM (DRAM) or a static RAM (SRAM).

The PMU 2130 may manage power of each component of the AP 2100. The PMU 2130 may also determine an operation state of each component of the AP 2100 and control the operation.

The memory I/F 2140 may control all operations of the memory 2200, and may control data exchange between each component of the AP 2100 and the memory 2200. The memory I/F 2140 may write data to the memory 2200 or read data from the memory 2200 according to a request of the CPU 2110.

The DCON 2150 may transmit image data to be displayed on the display 2300 to the display 2300. The display 2300 may be implemented as a flat panel display or a flexible display such as a liquid crystal display (LCD), an organic light-emitting diode (OLED), or the like.

For wireless communication, the modem 2160 may modulate data to be transmitted suitable for a wireless environment, and recover received data. The modem 2160 may perform digital communication with the RF module 2410.

For reference, the modem 100 described with reference to FIGS. 1 to 3 may be implemented in the modem 2160.

The RF module 2410 may convert a high-frequency signal into a low-frequency signal and transmit the converted low-frequency signal to the modem 2160 through an antenna. In addition, the RF module 2410 may convert the low-frequency signal received from the modem 2160 into the high-frequency signal and transmit the converted high-frequency signal to the outside of the mobile terminal 2000 through an antenna. In addition, the RF module 2410 may amplify or filter a signal.

For reference, the RFIC 200, the supply modulator 300, the power amplifier PA, the duplexer 400, and the antenna ANT described with reference to FIGS. 1 to 3 may be implemented in the RF module 2410. Accordingly, the supply modulators 300-1 to 300-8 described with reference to FIGS. 4 to 30 may also be implemented in the RF module 2410.

For this reason, in the mobile terminal 2000, while broadband communication is possible, power consumption for communication may be reduced.

According to embodiments, operations described herein as being performed by the wireless communication apparatus 1, the modem 100, the RFIC 200, the supply modulator 300, the duplexer 400, the power amplifier PA, the digital transmission processor 110, the digital reception processor 120, the MIPI interface 130, the transmission circuit TXC, the reception circuit RXC, and/or a local oscillator LO, the first analog baseband filter ABF1, the first mixer MX1, the amplifier 210, the second analog baseband filter ABF2, the second mixer MX2, the low-noise amplifier 220, the wireless communication apparatus 2, the second digital transmission processor 205, the supply modulator 300-1, the multiple output voltage regulator 310, the switching regulator 330, the linear regulator LA, the switching regulator controller 350, the main controller 360, the switch controller 380, the discrete-level controller 390, the multiple output voltage regulator 310-1, the plurality of single output voltage regulators SOVR1 to SOVRN, the switching regulator SR, the SIMO controller 312, the multiple output voltage regulator 310-2, the single-inductor multiple-output (SIMO) DC-DC converter, the SIMO buck-boost converter, the multiple output voltage regulator 310-3, the boost converter, the plurality of LDOs LDO1 to LDO (N−1), the boost converter controller 314, the plurality of OTAs OTA1 to OTAN, the first multiplexer MUX1, the second multiplexer MUX2, the summer ADD, the compensation comparator CCP, the output comparator OCP, the supply modulator 300-2, the supply modulator 300-3, the first and second switching regulators 330 and 333, the first and second linear regulators LA1 and LA2, the first and second switching regulator controllers 350 and 353, the first and second switch controllers 380 and 383, the first and second discrete-level controllers 390 and 393, the supply modulator 300-4, the supply modulator 300-5, the multiple output voltage regulator 310-4, the plurality of single output voltage regulators SOVR1 to SOVRN−1, the multiple output voltage regulator 310-5, the multiple output voltage regulator 310-6, the plurality of LDOs LDO1 to LDO (N−2), the OTA, the multiplexer MUX, the supply modulator 300-6, the supply modulator 300-7, the supply modulator 300-8, the mobile terminal 2000, the AP 2100, the RF module 2400, the CPU 2110, the PMU 2130, the DCON 2150 and/or the modem 2160 may be performed by processing circuitry. Also, operations described herein as being performed by a DAC and/or ADC may be performed using processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to embodiments thereof, it will be understood that various changes in form and details may be made therein without departing from the spirit and scope of the following claims.

What is claimed is:

1. A supply modulator configured to provide an output voltage to a power amplifier, and operate in a discrete level-envelope tracking mode, the supply modulator comprising:
   a multiple output voltage generating circuit configured to output a selected voltage among a plurality of voltages and provide a first output current with a high-frequency to an output node, the plurality of voltages having different levels from each other, and the different levels respectively corresponding to a plurality of reference output voltage signals;
   a switching regulator configured to output a switching regulator voltage and provide a second output current with a low-frequency to the output node, the output voltage being based on the switching regulator voltage and the selected voltage among the plurality of voltages;

a switching regulator controller configured to sense the first output current of the multiple output voltage generating circuit to obtain a sensing value and control the switching regulator based on the sensing value; and a main controller configured to
generate the plurality of reference output voltage signals,
determine a tracking mode of the supply modulator, and
control the multiple output voltage generating circuit and the switching regulator controller based on the tracking mode,
wherein a selection with respect to the plurality of voltages is performed based on a digital envelope signal provided from outside, and
an output current of the supply modulator comprises a sum of the first output current and the second output current.

2. The supply modulator of claim 1, wherein a level of the second output current is varied based on control of the switching regulator controller, and an average of the first output current is approximated to zero.

3. The supply modulator of claim 2, wherein a level of the selected voltage becomes smaller as the average of the first output current is approximated to zero.

4. The supply modulator of claim 2, wherein the sum of the first output current and the second output current is provided to the power amplifier.

5. The supply modulator of claim 1, wherein the multiple output voltage generating circuit comprises:
a multiple output voltage regulator configured to receive the plurality of reference output voltage signals and output the plurality of voltages corresponding to the plurality of reference output voltage signals; and
a switch array comprising a plurality of switches respectively corresponding to the plurality of voltages, the switch array configured to selectively connect the selected voltage to the output node by performing a switching operation.

6. The supply modulator of claim 5, wherein the supply modulator further comprises:
a discrete-level controller configured to generate a level control signal based on the digital envelope signal; and
a switch controller configured to control the switching operation of the switch array based on the level control signal.

7. The supply modulator of claim 6, wherein the switching regulator controller comprises:
a plurality of operational transconductance amplifiers (OTAs) configured to output a plurality of difference values by comparing the plurality of voltages and the plurality of reference output voltage signals;
a first multiplexer configured to output a selected difference value among the plurality of difference values based the level control signal;
a summer configured to sum the selected difference value and the sensing value to obtain a compensation value;
a compensation comparator configured to compare the compensation value with a reference value to obtain a first comparison value;
a digital-to-analog converter configured to convert an average power signal into a reference voltage signal;

an output comparator configured to compare the reference voltage signal with the output voltage to obtain a second comparison value; and
a second multiplexer configured to output one among the first comparison value and the second comparison value to the switching regulator as a switching regulator control signal.

8. The supply modulator of claim 7, wherein the second multiplexer is configured to output the first comparison value.

9. The supply modulator of claim 7, wherein the supply modulator operates in the discrete level-envelope tracking mode or an average power tracking mode, and
the second multiplexer is configured to output the second comparison value based on the tracking mode being the average power tracking mode.

10. The supply modulator of claim 6, wherein the multiple output voltage regulator comprises a plurality of capacitors respectively corresponding to the plurality of voltages, and
the switch array is configured to selectively connect each of the plurality of capacitors to the power amplifier by performing the switching operation.

11. The supply modulator of claim 5, wherein the multiple output voltage regulator comprises a plurality of single output voltage regulators configured to output the plurality of voltages.

12. The supply modulator of claim 5, wherein the multiple output voltage regulator comprises a single-inductor multiple-output (SIMO) direct current (DC)-DC converter or a SIMO buck-boost converter.

13. The supply modulator of claim 5, wherein the multiple output voltage regulator comprises:
a boost converter configured to generate a first voltage having a highest level among the plurality of voltages; and
a plurality of low dropout regulators (LDOs) configured to generate a subset of voltages among the plurality of voltages by using the first voltage, the subset of voltages not including the first voltage.

14. A supply modulator configured to provide an output voltage to a power amplifier and operate in a discrete level-envelope tracking mode, the supply modulator comprising:
a multiple output voltage generating circuit configured to output a selected voltage among a plurality of voltages and provide a first output current with a high-frequency to an output node, the plurality of voltages having different levels from each other, and the different levels respectively corresponding to a plurality of reference output voltage signals;
a switching regulator configured to output a switching regulator voltage and provide a second output current with a low-frequency to the output node, the output voltage being based on the switching regulator voltage and the selected voltage among the plurality of voltages;
a switching regulator controller configured to sense the first output current of the multiple output voltage generating circuit to obtain a sensing value and control the switching regulator based on the sensing value;
a coupling capacitor having an end connected to the multiple output voltage generating circuit and another end connected to the output node; and
a main controller configured to
generate the plurality of reference output voltage signals, generate a target voltage signal of the coupling capacitor, determine a tracking mode of the supply modulator, and control the multiple output voltage generating circuit and the switching regulator controller based on the tracking mode.

15. The supply modulator of claim 14, wherein a selection with respect to the plurality of voltages is performed based on a digital envelope signal provided from an outside, and an output current of the supply modulator comprises a sum of the first output current and the second output current.

16. The supply modulator of claim 14, wherein a level of the second output current is varied based on control of the switching regulator controller, and an average of the first output current is approximated to zero.

17. The supply modulator of claim 14, wherein a level of the selected voltage from the multiple output voltage generating circuit is smaller than the output voltage by a level applied to the coupling capacitor.

18. The supply modulator of claim 14, wherein the multiple output voltage generating circuit comprises:

a multiple output voltage regulator configured to receive the plurality of reference output voltage signals and output the plurality of voltages corresponding to the plurality of reference output voltage signals; and a switch array comprising a plurality of switches respectively corresponding to the plurality of voltages, the switch array configured to selectively connect the selected voltage to the output node by performing a switching operation.

19. The supply modulator of claim 18, wherein the supply modulator further comprises:

a discrete-level controller configured to generate a level control signal based on a digital envelope signal provided from an outside; and a switch controller configured to control the switching operation of the switch array based on the level control signal.

20. The supply modulator of claim 19, wherein the switching regulator controller comprises:

an operational transconductance amplifier (OTA) configured to output a difference value by comparing a difference between a voltage of the coupling capacitor and the target voltage signal;

a summer configured to sum the difference value and the sensing value to obtain a compensation value;

a compensation comparator configured to compare the compensation value with a reference value to obtain a first comparison value;

a digital-to-analog converter configured to convert an average power signal into a reference voltage signal;

an output comparator configured to compare the reference voltage signal with the output voltage to obtain a second comparison value; and a multiplexer configured to output one among the first comparison value and the second comparison value to the switching regulator as a switching regulator control signal.

* * * * *